(12) United States Patent
Houlahan, Jr. et al.

(10) Patent No.: US 11,008,650 B2
(45) Date of Patent: May 18, 2021

(54) COMPACT SYSTEM FOR COUPLING RF POWER DIRECTLY INTO RF LINACS

(71) Applicant: Starfire Industries, LLC, Champaign, IL (US)

(72) Inventors: Thomas J. Houlahan, Jr., Urbana, IL (US); Daniel P. Menet, Urbana, IL (US); Ian F. Haehnlein, Champaign, IL (US); Ivan A. Shchelkanov, Pleasanton, CA (US); Robert A. Stubbers, Savoy, IL (US); Brian E. Jurczyk, Champaign, IL (US)

(73) Assignee: Starfire Industries LLC, Champaign, IL (US)

( * ) Notice: Subject to any disclaimer, the term of this patent is extended or adjusted under 35 U.S.C. 154(b) by 0 days.

(21) Appl. No.: 16/848,353

(22) Filed: Apr. 14, 2020

(65) Prior Publication Data

US 2020/0377995 A1 Dec. 3, 2020

Related U.S. Application Data

(63) Continuation-in-part of application No. 15/803,320, filed on Nov. 3, 2017, now Pat. No. 10,624,199, and (Continued)

(51) Int. Cl.
*C23C 14/35* (2006.01)
*H01J 37/34* (2006.01)
(Continued)

(52) U.S. Cl.
CPC .............. *C23C 14/35* (2013.01); *G01R 33/07* (2013.01); *H01J 37/3405* (2013.01);
(Continued)

(58) Field of Classification Search
CPC .............. H01J 37/3405; H01J 37/3452; H01J 37/3455; H01J 37/3467;
(Continued)

(56) References Cited

U.S. PATENT DOCUMENTS 4,545,882 A 10/1985 McKelvey
5,084,682 A 1/1992 Swenson et al.
(Continued)

FOREIGN PATENT DOCUMENTS

CN 204259269 4/2015
JP 2016-110698 A 6/2016

OTHER PUBLICATIONS

Hoffert et al., "Close-Coupled RF Power Systems for Linacs," Proceedings of the Linear Accelerator Conference 1990, Albuquerque, New Mexico, USA, XP055695969, pp. 210-212 (Sep. 12, 1990).
(Continued)

*Primary Examiner* — Renan Luque
(74) *Attorney, Agent, or Firm* — Leydig, Voit & Mayer, Ltd.

(57) ABSTRACT

A system and associated method are described for depositing high-quality films for providing a nanolayered coating on a three-dimensional surface. The system includes a magnetic array comprising multiple sets of magnets arranged to have Hall-Effect regions that run lengthwise along a sputter target. The system further includes an elongated sputtering electrode material tube surrounding the magnetic array comprising multiple sets of magnets arranged to have Hall-Effect regions that run lengthwise along the sputter target. During operation, the system generates and controls ion flux for direct current high-power impulse magnetron sputtering. During operation logic circuitry issues a control signal to control a kick pulse property of a sustained positive voltage
(Continued)

kick pulse taken from the group consisting of: onset delay, amplitude and duration.

20 Claims, 40 Drawing Sheets

Related U.S. Application Data a continuation-in-part of application No. 16/006,357, filed on Jun. 12, 2018, and a continuation-in-part of application No. 16/801,002, filed on Feb. 25, 2020.

(60) Provisional application No. 62/416,900, filed on Nov. 3, 2016, provisional application No. 62/518,362, filed on Jun. 12, 2017, provisional application No. 62/810,230, filed on Feb. 25, 2019.

(51) Int. Cl.
*H05H 7/02* (2006.01)
*G01R 33/07* (2006.01)

(52) U.S. Cl.
CPC ........... *H01J 37/3452* (2013.01); *H05H 7/02* (2013.01); *H01J 2237/002* (2013.01); *H01J 2237/20214* (2013.01); *H05H 2007/025* (2013.01)

(58) Field of Classification Search
CPC ...... H01J 2237/20214; H01J 2237/002; C23C 14/35; G21C 21/02; H05H 7/20
See application file for complete search history.

(56) References Cited

U.S. PATENT DOCUMENTS

| | | | |
|---|---|---|---|
| 6,972,421 | B2 | 12/2005 | Melnychuk et al. |
| 7,834,620 | B2 | 11/2010 | Kejik et al. |
| 8,568,572 | B2 | 10/2013 | Anders et al. |
| 9,039,871 | B2 | 5/2015 | Nauman et al. |
| 2008/0260478 | A1* | 10/2008 | Hovsepian ............ C23C 28/044 407/119 |
| 2009/0111216 | A1* | 4/2009 | Weichart ............. H01J 37/3467 438/109 |
| 2011/0248633 | A1* | 10/2011 | Nauman ................. C23C 14/54 315/111.21 |
| 2012/0012458 | A1 | 1/2012 | Lopp et al. |
| 2013/0206725 | A1 | 8/2013 | Leeser et al. |
| 2015/0122633 | A1* | 5/2015 | Krassnitzer ........... C23C 14/345 204/192.13 |
| 2016/0266361 | A1* | 9/2016 | Schuhmacher ...... G02B 5/0808 |
| 2017/0287578 | A1 | 10/2017 | Brachet et al. |
| 2018/0247797 | A1* | 8/2018 | Gorokhovsky ....... C23C 16/442 |
| 2018/0294062 | A1* | 10/2018 | Wolfe ..................... C23C 28/00 |
| 2018/0358213 | A1* | 12/2018 | Ruzic ...................... C23C 14/35 |
| 2019/0249291 | A1* | 8/2019 | Ehiasarian ............ C23C 28/044 |

OTHER PUBLICATIONS

European Patent Office, Extended European Search Report in corresponding European Application No. 17867132.7, dated May 27, 2020 (8 pages).

International Searching Authority/US, International Search Report and Written Opinion in corresponding PCT International Application No. PCT/US20/19743 dated May 22, 2020 (17 pages).

\* cited by examiner

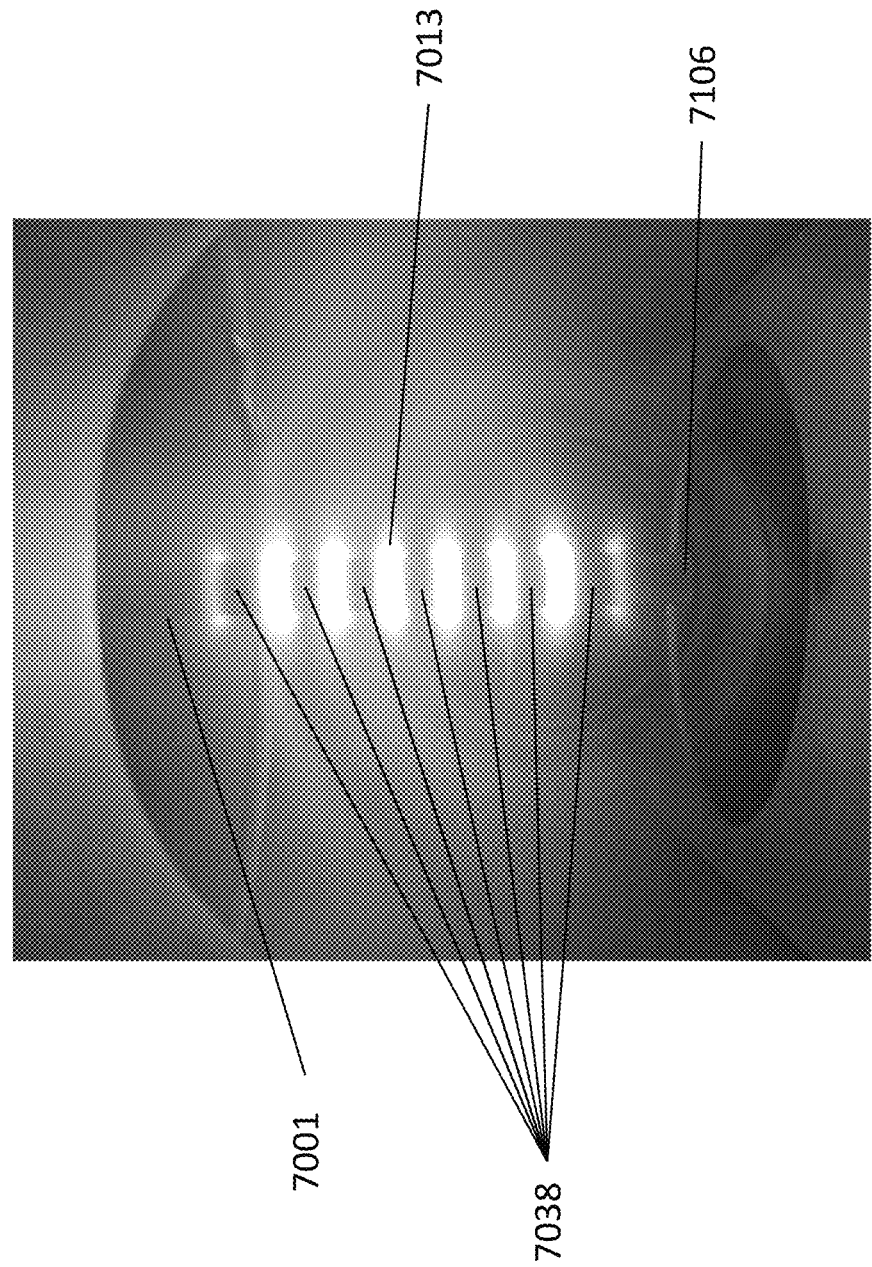

IMPULSE® Ultra-Fast HiPIMS
High Ionization Fraction
Dense Metal Plasma
Positive Kick™ Accelerates Ions
Short Kick™ Ions From Near Target
Long Kick™ Elevates Plasma Potential
Magnetic Plasma Concentration
Conformal Sheath At Substrate
Deposition Inside 3D Surfaces
Energetic Ion Bombardment
Dense Coating At 90° Incidence

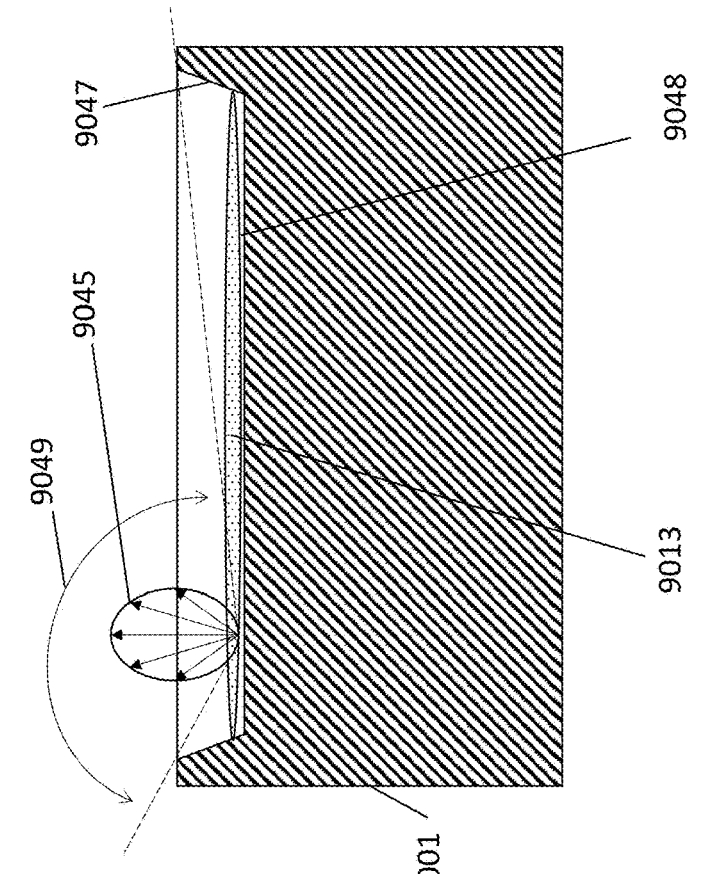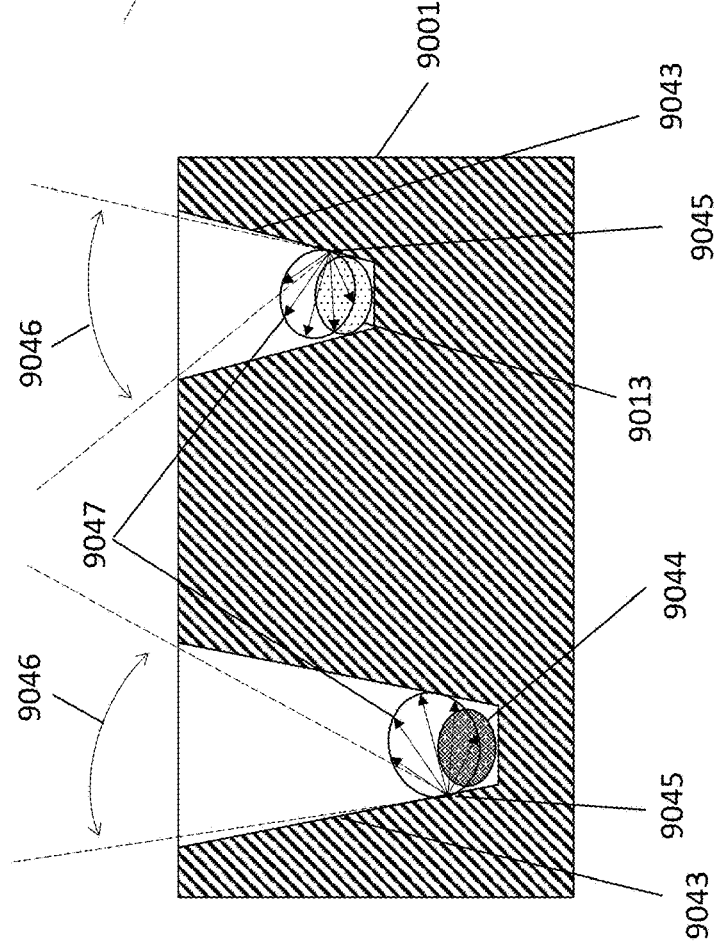
FIG. 9A
FIG. 9B

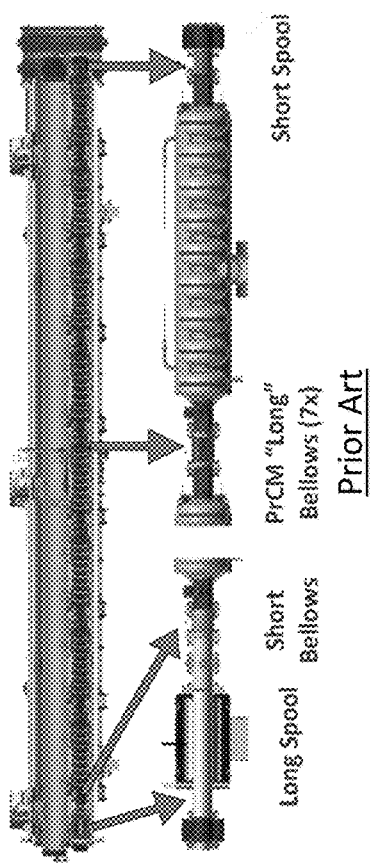
FIG. 21B
Prior Art
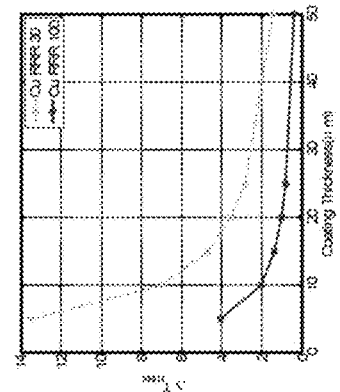
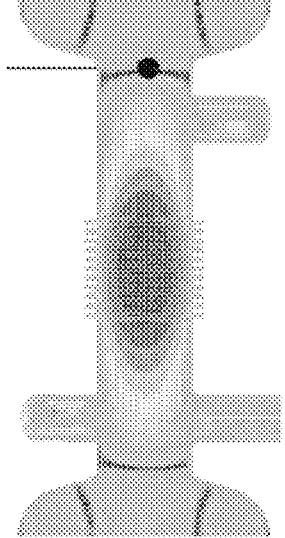
FIG. 21C
Prior Art
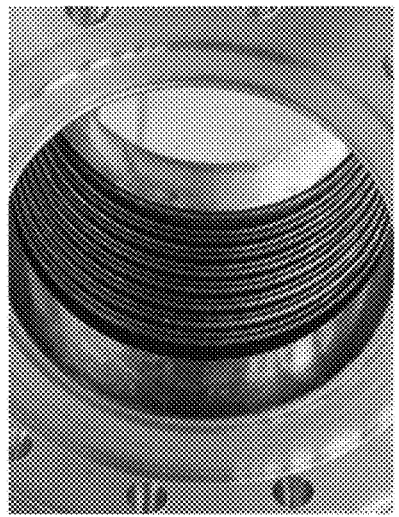
FIG. 21A
Prior Art

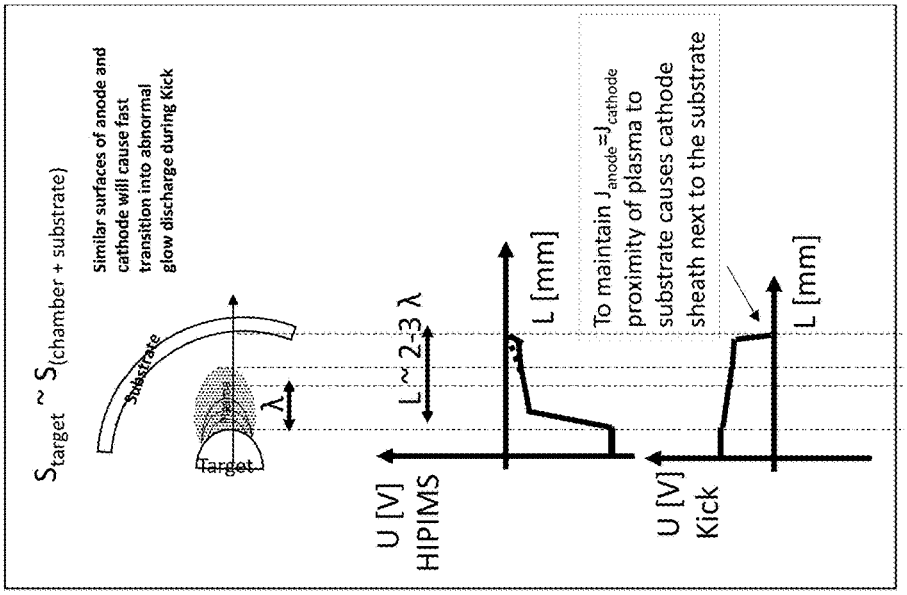
FIG. 24A  FIG. 24B  FIG. 24C
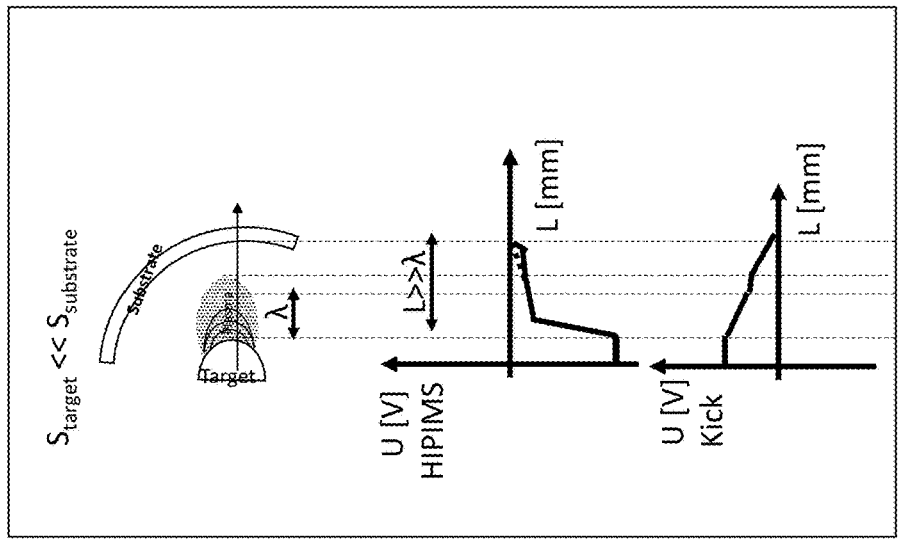
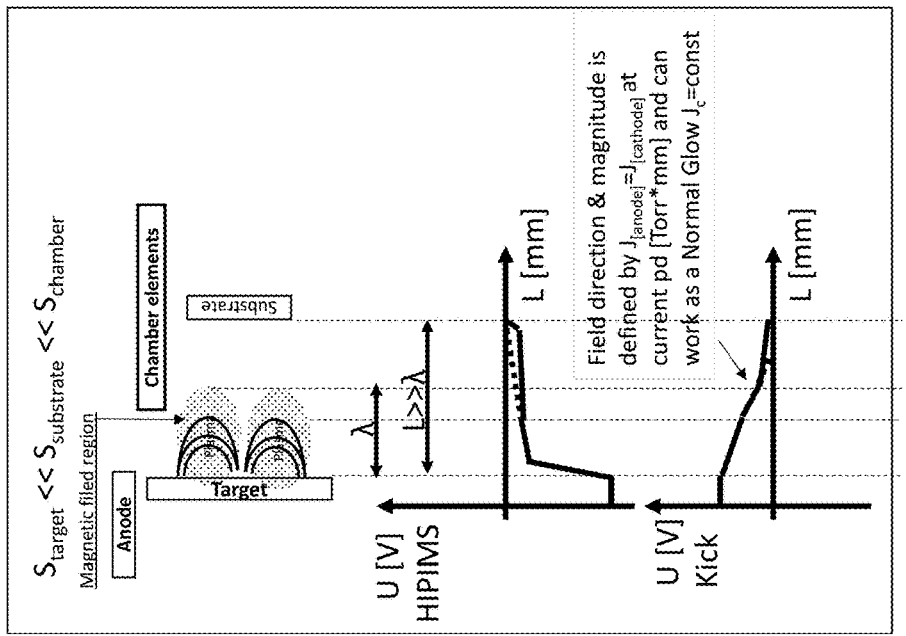

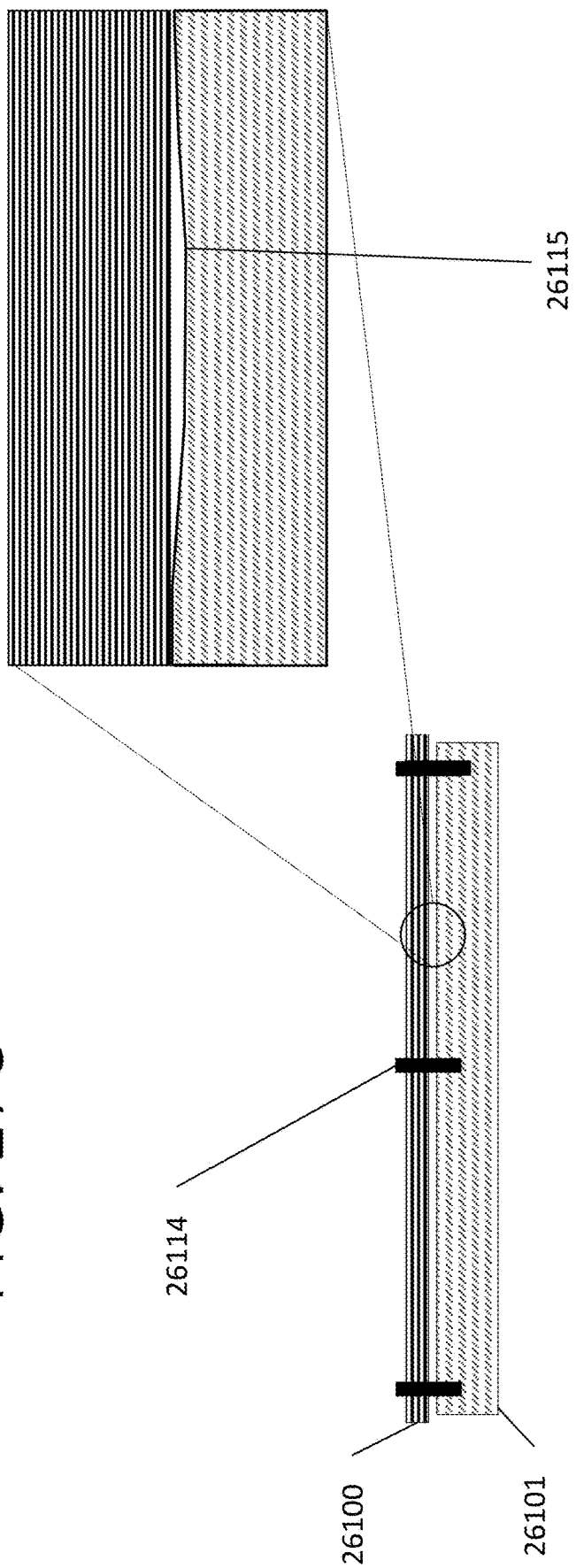

COMPACT SYSTEM FOR COUPLING RF POWER DIRECTLY INTO RF LINACS

CROSS-REFERENCE TO RELATED APPLICATION

This application is a continuation-in-part of, and claims the priority of, U.S. application Ser. No. 15/803,320, filed Nov. 3, 2017 (U.S. Pat. No. 10,624,199), entitled "A COMPACT SYSTEM FOR COUPLING RF POWER DIRECTLY INTO RF LINACS," which is a non-provisional of U.S. Provisional Application Ser. No. 62/416,900, filed Nov. 3, 2016, entitled "A COMPACT SYSTEM FOR COUPLING RF POWER DIRECTLY INTO RF LINACS," the contents of each of which are expressly incorporated herein by reference in their entirety, including any references therein.

This application is a continuation-in-part of, and claims the priority of, U.S. application Ser. No. 16/006,357, filed on Jun. 12, 2018, entitled "PULSED POWER MODULE WITH PULSE AND ION FLUX CONTROL FOR MAGNETRON SPUTTERING," which is a non-provisional of U.S. Provisional Application Ser. No. 62/518,362, filed Jun. 12, 2017, entitled "PULSED POWER MODULE WITH PULSE AND ION FLUX CONTROL FOR MAGNETRON SPUTTERING," the contents of each of which are expressly incorporated herein by reference in their entirety, including any references therein.

This application is a continuation-in-part of, and claims the priority of, U.S. application Ser. No. 16/801,002, filed Feb. 25, 2020, and entitled "METHOD AND APPARATUS FOR METAL AND CERAMIC NANOLAYERING FOR ACCIDENT TOLERANT NUCLEAR FUEL, PARTICLE ACCELERATORS & AEROSPACE LEADING EDGES," which is a non-provisional of U.S. Provisional Patent Application No. 62/810,230, filed on Feb. 25, 2019, entitled "METHOD AND APPARATUS FOR METAL AND CERAMIC NANOLAYERING FOR ACCIDENT TOLERANT NUCLEAR FUEL," the contents of each of which are expressly incorporated herein by reference in their entirety, including any references therein.

STATEMENT REGARDING FEDERALLY SPONSORED RESEARCH AND DEVELOPMENT

This work has been supported by the U.S. Defense Advanced Research Projects Agency (DARPA), under contract HR0011-15-C-0072. The views, opinions, and/or findings expressed are those of the authors and should not be interpreted as representing the official views or policies of the Department of Defense or the U.S. Government.

TECHNICAL FIELD

The disclosure generally relates to injecting power into accelerator devices, and more particularly to relatively compact high-power radio frequency linear accelerator (RF LINAC) systems.

BACKGROUND OF THE INVENTION

High-power RF cavities, such as those found in an RF LINAC, require not only tremendous RF powers (on the order to 10's to 100's of kW and above), but also a vacuum environment to prevent arcing and sparking within the RF cavity due to the intense electric fields associated with such high powers. The RF power needed to reach a specific electric field within the resonant cavity is governed by the quality factor (Q) which is integral energy stored divided by energy lost per cycle. For resonant RF cavities, the formula reduces to $$Q = \frac{\sqrt{\frac{L}{C}}}{R_{surface}} = \left(\frac{\Delta\omega}{\omega_o}\right)^{-1}$$

since the RF energy propagates along the surface and is a function of the surface resistance $$R_{surface} = \frac{1}{\text{Conductivity} \times \text{Skin Depth}}$$

that is proportional to the square root of RF frequency. Higher quality factor leads to higher efficiencies, higher achievable voltages and accelerating gradients. However, there are engineering tradeoffs in cavity design and operation since electrical skin depths are on the order of microns for GHz frequencies. RF cavities are typically electroplated with copper for lower surface resistance or constructed out of solid blocks of base material for room-temperature cavities.

Typically, RF power is coupled into a high-power RF cavity via a waveguide and a hermetic RF window. This approach, while viable at high power LINAC applications, requires additional hardware, which increases the cost, size and complexity of compact high power RF LINAC systems. An alternative approach to the one described above is to couple RF power directly into the RF cavity via an RF amplifier assembly mounted on, and with an output stage coupled directly to, the RF cavity. This approach is described in Swenson, U.S. Pat. No. 5,084,682. However, the inclusion of the entire vacuum tube (and its associated tuning elements) within the vacuum envelope has led to an inability to operate at high powers due to processes such as multipactoring. For this reason, as much as possible of the RF and biasing circuitry needs to be at atmospheric pressure. In addition to this constraint, problems arise in the structure described in Swenson due to high powers dissipated both in the antenna and in the anode of the vacuum tube if these structures are not actively cooled. Swenson's approach to mounting the RF amplifier in a high power RF LINAC is further complicated by a vacuum tube anode commonly being held at high voltage, which necessitates the careful selection of a coolant.

SUMMARY OF THE INVENTION

A system is provided for depositing high-quality films for providing a nanolayered coating on a three-dimensional surface of an RF accelerator and associated superconducting cavities. The system includes a magnetic array comprising multiple sets of magnets arranged to have Hall-Effect regions that run lengthwise along a sputter target. The system further includes an elongated sputtering electrode material tube surrounding the magnetic array comprising multiple sets of magnets arranged to have Hall-Effect regions that run lengthwise along the sputter target.

During operation, the system carries out a method for nanolaying a surface of a three-dimensional surface by generating and controlling ion flux for direct current high-power impulse magnetron sputtering. The method includes providing a vacuum apparatus containing a sputtering magnetron target electrode; generating a high-power pulsed plasma magnetron discharge with a high-current negative direct current (DC) pulse to the sputtering magnetron target electrode; and generating a configurable sustained positive voltage kick pulse to the magnetron target electrode after terminating the negative DC pulse. During the generating, program processor configured logic circuitry issues a control signal to control at least one kick pulse property of the sustained positive voltage kick pulse taken from the group consisting of: onset delay, duration, amplitude and frequency and modulation thereof.

A method is provided for carrying out a nanolaying of a surface of a three-dimensional surface by generating and controlling ion flux for direct current high-power impulse magnetron sputtering. The method is carried out on a system including an RF accelerator and superconducting cavities for depositing high-quality films for providing a nanolayered coating on a three-dimensional surface. The system comprises a magnetic array comprising multiple sets of magnets arranged to have Hall-Effect regions that run lengthwise along a sputter target; and an elongated sputtering electrode a material tube surrounding the magnetic array comprising multiple sets of magnets arranged to have Hall-Effect regions that that run lengthwise along the sputter target.

The method comprises providing a vacuum apparatus containing a sputtering magnetron target electrode; generating a high-power pulsed plasma magnetron discharge with a high-current negative direct current (DC) pulse to the sputtering magnetron target electrode; and generating a configurable sustained positive voltage kick pulse to the magnetron target electrode after terminating the negative DC pulse. During the generating, program processor configured logic circuitry issues a control signal to control a kick pulse property of the sustained positive voltage kick pulse taken from the group consisting of: onset delay, amplitude and duration.

Additional features and advantages of the invention will be made apparent from the following detailed description of illustrative examples that proceeds with reference to the accompanying figures.

BRIEF DESCRIPTION OF THE DRAWINGS

While the appended claims set forth the features of the present invention with particularity, the invention, together with its objects and advantages, may be best understood from the following detailed description taken in conjunction with the accompanying drawings of which:

FIG. 7F is a photograph of a 6.3-mm diameter sputtering electrode example with a magnetic field arranged to create multiple dense plasma zones around the sputtering electrode that can be axially translated;

FIG. 9A depicts an illustration of sputter target erosion and wear for narrow V trenches;

FIG. 9B depicts an illustration of sputter target erosion with relative movement between the dense plasma regions and sputter target material for uniform erosion;

FIG. 21A is the prior art for electroplating stainless steel cryogenic bellows for RF accelerators;

FIG. 21B is the prior art for a superconducting RF accelerator section comprising multiple spools, bellows and RF cavities needing specific material properties;

FIG. 21C is the prior art showing RF power loss and thermal dissipation due to poor electrical conductivity with electroplated copper;

FIG. 24A depicts snapshots of the plasma potential spatial profile for the representative Long Kick case where a vacuum chamber dominates in surface area over both the substrate and the smaller sputtering target, and the distance between the target and substrate is many mean-free paths—very little potential drop reaches the substrate for local conformality;

FIG. 24B depicts snapshots of the plasma potential spatial profile for the representative Long Kick case where the substrate is much larger in surface area than the sputtering target and vacuum chamber components are negligible, and the distance between the target and substrate is many mean free paths—a small potential drop reaches substrate for local conformality;

FIG. 24C depicts snapshots of the plasma potential spatial profile for the representative Long Kick case where the target is on the same order as the substrate area, the vacuum chamber components are negligible, and the distance between the target and substrate is small—nearly all of the potential drop appears on the substrate for excellent conformality of plasma bombardment;

FIG. 27A depicts an illustration of the surface current pathlength, interface losses and multipactoring stress for adjoining RF surfaces and structures for conventionally processed materials;

FIG. 27C depicts an illustration of axial position along a cavity with regions of poor electrical contact due to macroscopic effects;

DETAILED DESCRIPTION OF THE DRAWINGS

The detailed description of the figures that follows is not to be taken in a limiting sense, but is made merely for the purpose of describing the principles of the described embodiments.

A structural assembly and system are described that, in operation, inject RF power directly into an accelerator, such as a radio frequency quadrupole (RFQ) LINAC, while placing both the RF power amplifier itself as well as the RF input circuitry and the biasing circuitry outside of the vacuum environment occupied by the LINAC cavity. A critical aspect of this disclosure is that it allows for the use of the LINAC cavity itself as the output stage of the amplifier, removing any need for transmission lines between the final amplification stage and the LINAC cavity. The described structural assembly arrangement exhibits multiple advantageous features. The arrangement mitigates the deleterious effects of multipactoring associated with placing elements associated with the RF power amplifier in a vacuum environment. Moreover, the arrangement enables inspecting/replacing the RF power amplifier without breaking the vacuum seal of the RF LINAC cavity.

A low capacitance hermetic HV break is of particular importance to the functionality of the RF power amplifier arrangement described herein. The low capacitance characteristic of the hermetic HV break (described in detail herein below) ensures a sufficiently low capacitance between the RF power amplifier's output stage and the LINAC cavity. By way of an illustrative example, the hermetic HV break is a piece of alumina ceramic (or other suitable dielectric material) joined, for example by brazing or other suitable metallic material bonding technique, to copper (or other suitable conductive material) at both ends.

A further aspect of illustrative examples is that both the RF power amplifier's output stage and the antenna are placed at the same DC potential as the LINAC system. Additionally, the illustrative examples provide a mechanism to directly and easily cool the amplifier and antenna elements via a flowing liquid (e.g. water) cooling loop. An illustrative example of this aspect of the disclosure would be to route the cooling loop through the antenna itself, mounted to the anode electrode at one end and ground at the other.

By way of an illustrative example, a system is described herein for injecting RF power directly into an RF LINAC (such as a radio frequency quadrupole (RFQ) accelerator), while placing both the RF power amplifier, the RF input circuitry, and the biasing circuitry outside of the vacuum environment occupied by the LINAC cavity. An illustrative example of such system is schematically depicted in FIG. 1.

Figure 1:
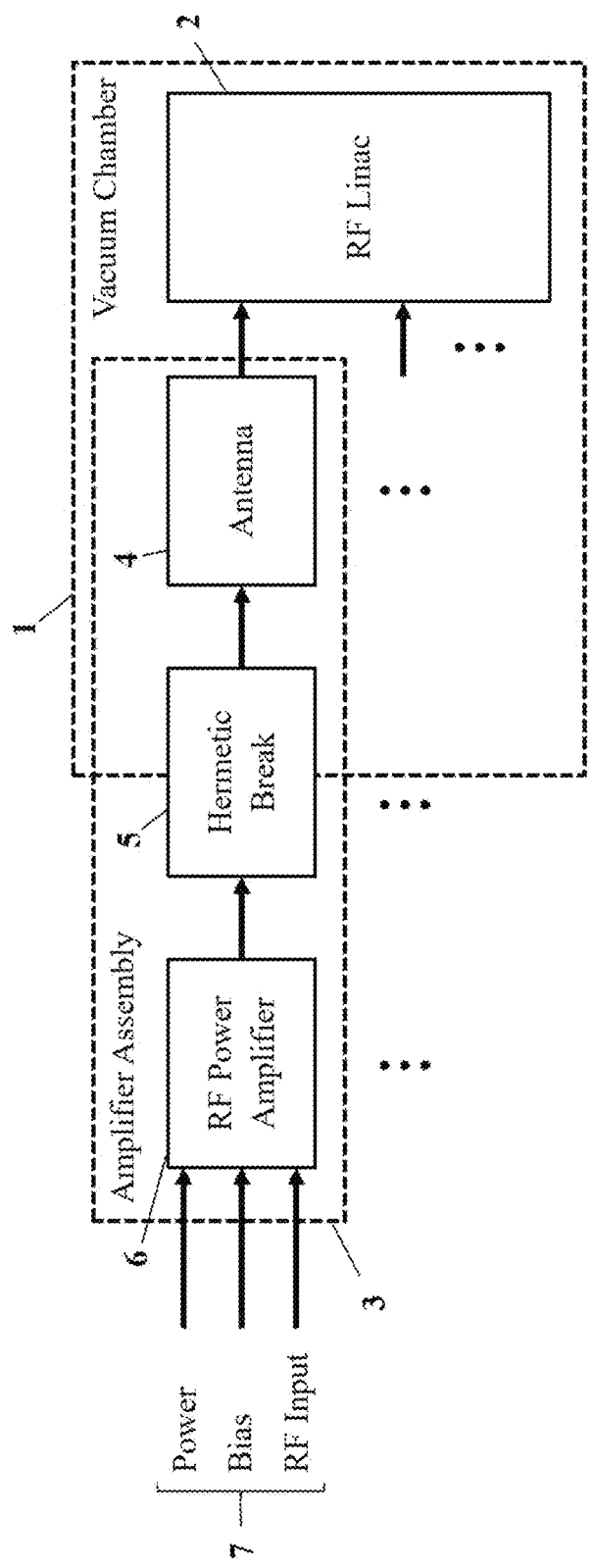
FIG. 1 is a schematic drawing of a system suitable for incorporating the features of the invention.

Turning to FIG. 1, the primary components of the illustratively depicted system include: a vacuum chamber 1 containing a cavity 2 (e.g. one or more LINAC cavities), one or more of a power amplifier assembly 3 (including an RF power amplifier 6, a hermetic break 5, and an antenna 4) directly coupled to the cavity 2 structure, an electronic circuit interface including a set of inputs 7. The set of inputs 7 of the electronic circuit interface are configured to provide power, bias voltages/currents, and sufficiently high-power radio frequency energy to the one or more of the power amplifier assembly 3. The received radio frequency energy is amplified by the one or more of the power amplifier assembly 3 for transmission into the cavity 2 structure.

By way of further explanation/definition, "directly coupled", as used above to describe the structural relationship between the power amplifier assembly 3 and the cavity 2, is defined as an electrical energy coupling relationship such that there is a negligible power transmission line between the power amplifier assembly 3 output interface and the cavity 2 structure. In the illustrative example, such direct coupling is achieved by the power amplifier assembly 3 having the hermetic break 5 barrier between the antenna 4 (which couples to the cavity 2 and is held at vacuum) and the RF power amplifier 6 (operating at atmospheric pressure).

Figure 2A:
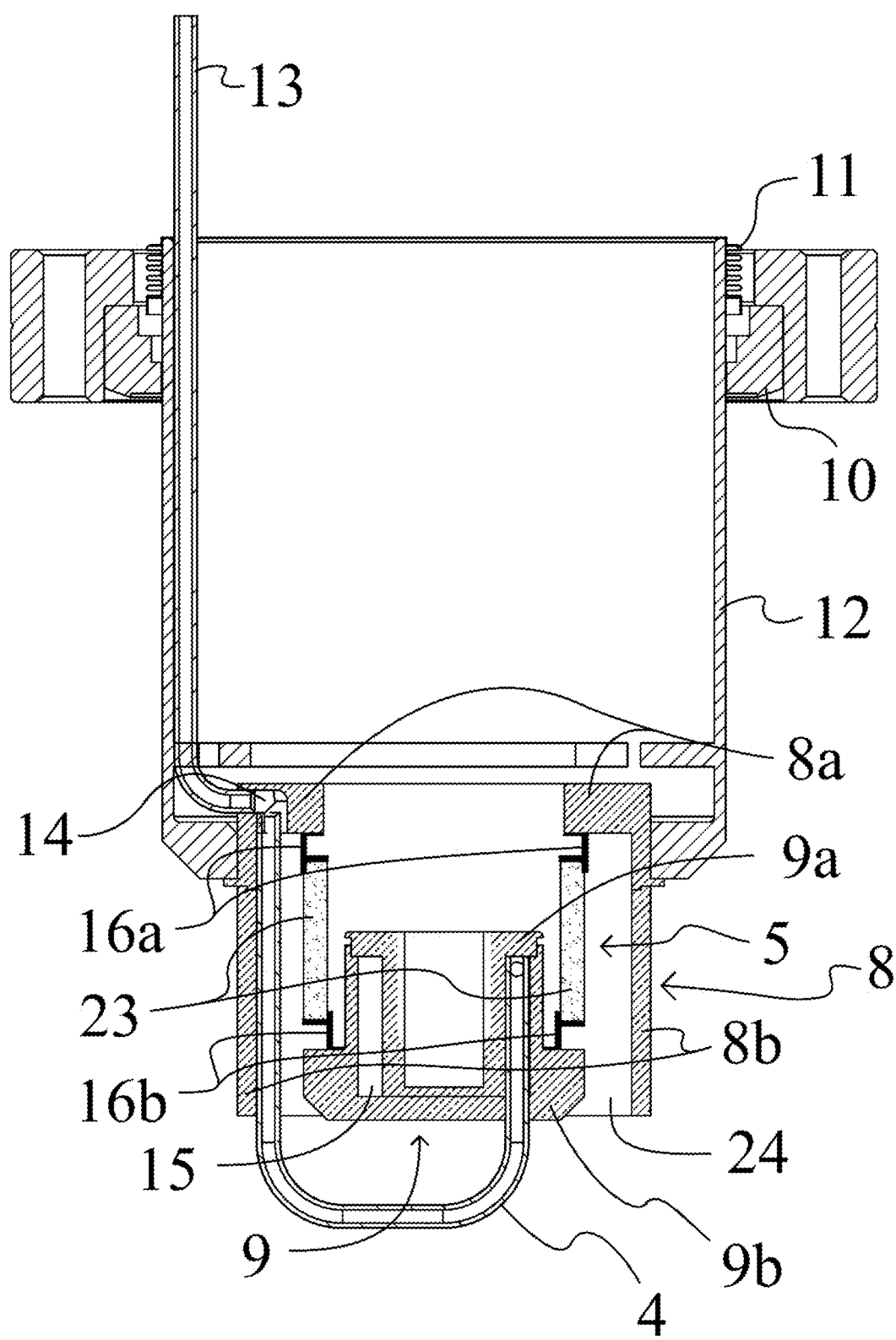
FIG. 2A depicts a cross-sectional view of a hermetic break sub-assembly element of the system schematically depicted in FIG. 1, including an RF antenna, socket interface, and vacuum flange termination.
Figure 2B:
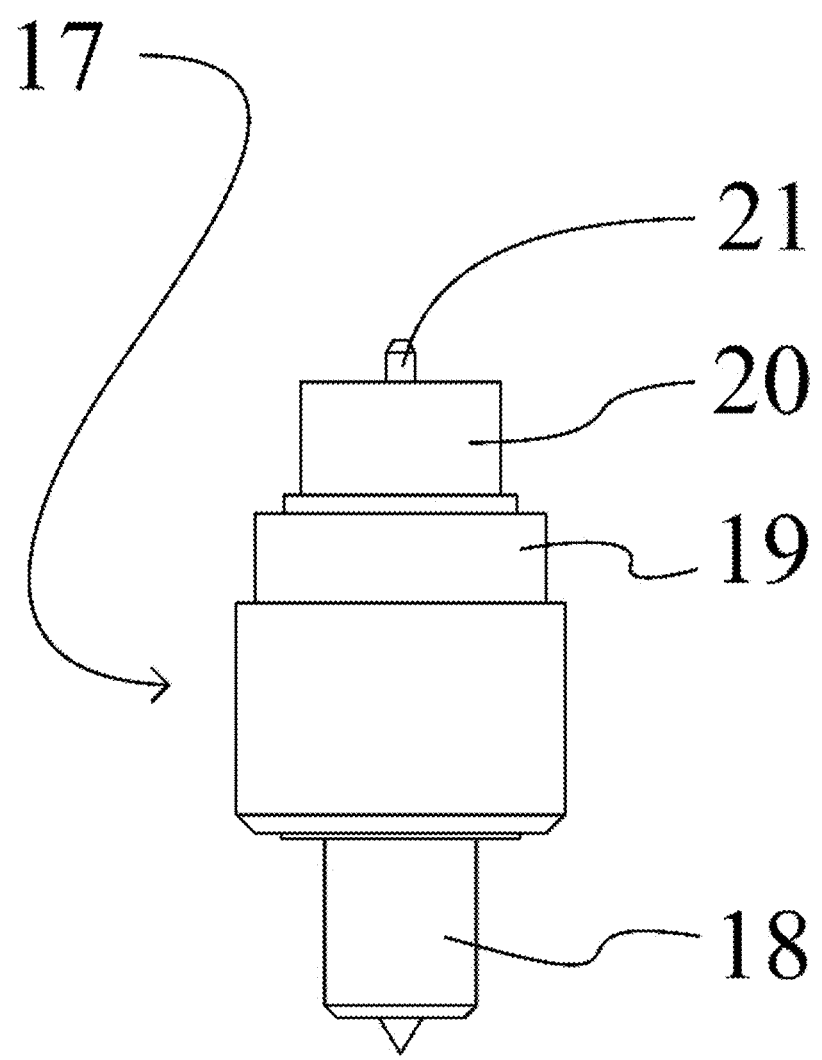
FIG. 2B depicts an illustrative RF power amplifier, which is, for example, a compact planar triode structure.
Figure 2C:
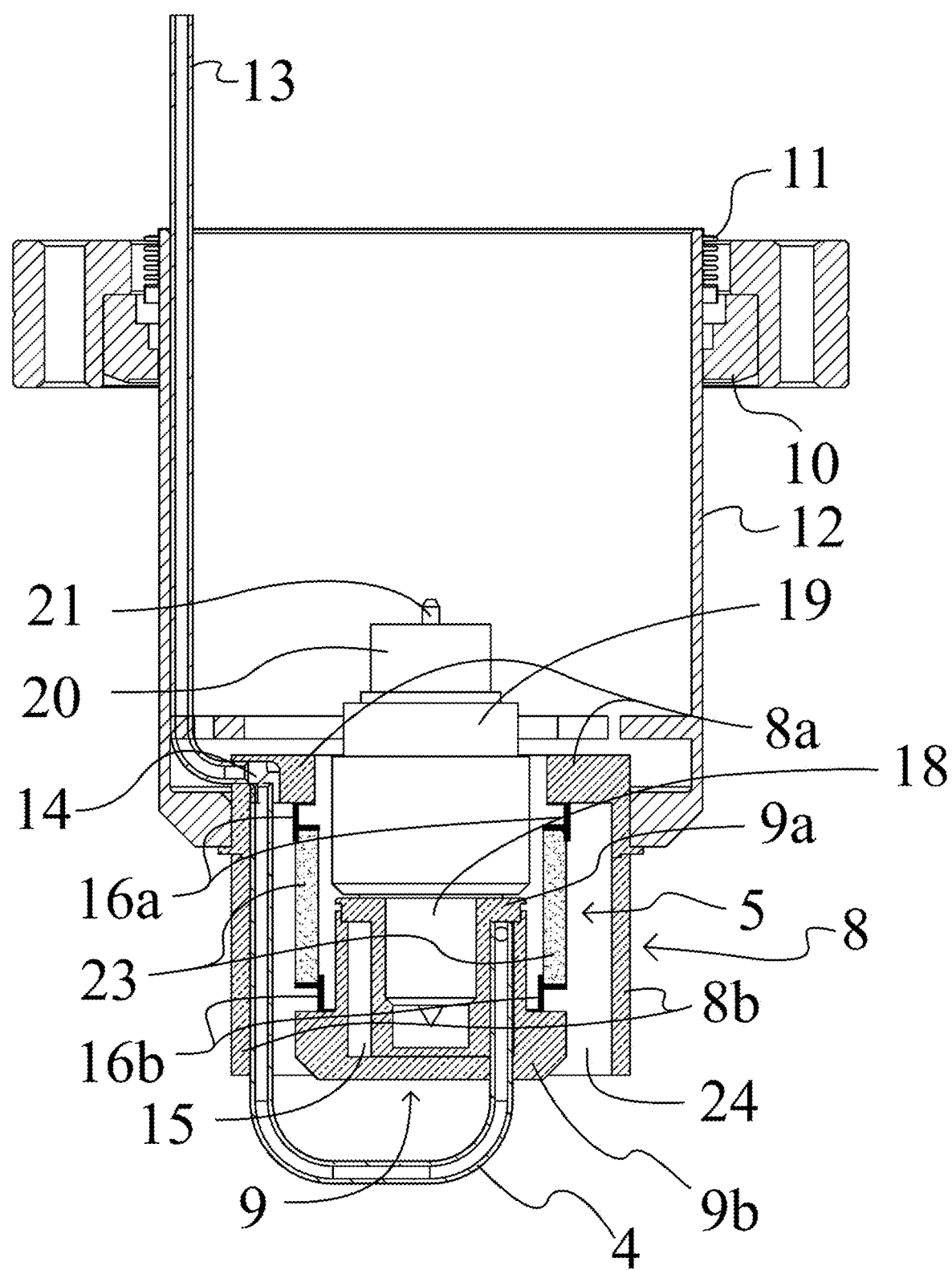
FIG. 2C depicts sub-assemblies from FIGS. 2A and 2B arranged as a power amplifier assembly for the RF LINAC system schematically depicted in FIG. 1.

By way of an illustrative example, FIG. 2C depicts a power amplifier assembly that comprises two sub-assemblies. Each of the two sub-assemblies is depicted, by way of further particular example, in FIGS. 2A and 2B. FIG. 2A depicts a sub-assembly including the hermetic break 5. Thereafter, FIG. 2B illustratively depicts, by way of example, an example of the RF power amplifier 6 sub-assembly, in the form of a compact planar triode sub-assembly 17.

Turning to FIG. 2A, the sub-assembly including the hermetic break 5 will now be described by way of a detailed example. By way of illustrative example, the hermetic break 5 is generally cylindrical. The hermetic break 5 includes a dielectric body 23 that is generally cylindrical in shape and made of, for example, a ceramic material. The hermetic break 5 also includes, at opposing ends, the first conductive material 16a and the second conductive material 16b. In the illustrative example, the first conductive material 16a and the second conductive material 16b are generally ring-shaped and occupy the ends of the generally cylindrically shaped dielectric body 23 of the hermetic break 5. The sub-assembly illustratively depicted in FIG. 2A also includes a socket interface 9 to which the output of the RF power amplifier 6 is connected. Turning briefly to FIG. 2B, a suitable structure, a compact planar triode (CPT) 17, for connecting the output of the RF power amplifier 6 to the hermetic break 5 is depicted. With continued reference to both FIGS. 2A and 2B, the CPT 17 is attached at an anode electrode 18 (also referred to as a plate electrode) to the socket interface 9 of the sub-assembly containing the hermetic break 5 structure.

With continued reference to FIG. 2A, the sub-assembly including the hermetic break 5 also includes a fixed potential electrode 8 to which the antenna 4 is connected. The fixed potential electrode 8, by way of example, is also generally cylindrically shaped. Thus, in the illustrative example, a generally cylindrical space 24 is formed between the fixed potential electrode 8 and the dielectric body 23 of the hermetic break 5. The antenna 4, which occupies an area within an approximate range of 0.1 in$^2$ to 5 in$^2$, is also connected to the socket interface 9 electrode. Due to high currents involved in operation of the illustrative LINAC system, the antenna 4, the socket interface 5, and the fixed potential electrode 8 are all made from, or at least coated with a sufficiently thick layer of, a high-conductivity material, such as copper. The term "sufficiently thick" here is defined as being equal to or greater than one skin depth at the intended operating frequency of the LINAC system. In conjunction with the cavity 2, the above-described conductive structures determine/establish an effective electrical impedance (Z1) observed from the output interface of the RF power amplifier 6.

Figure 4:
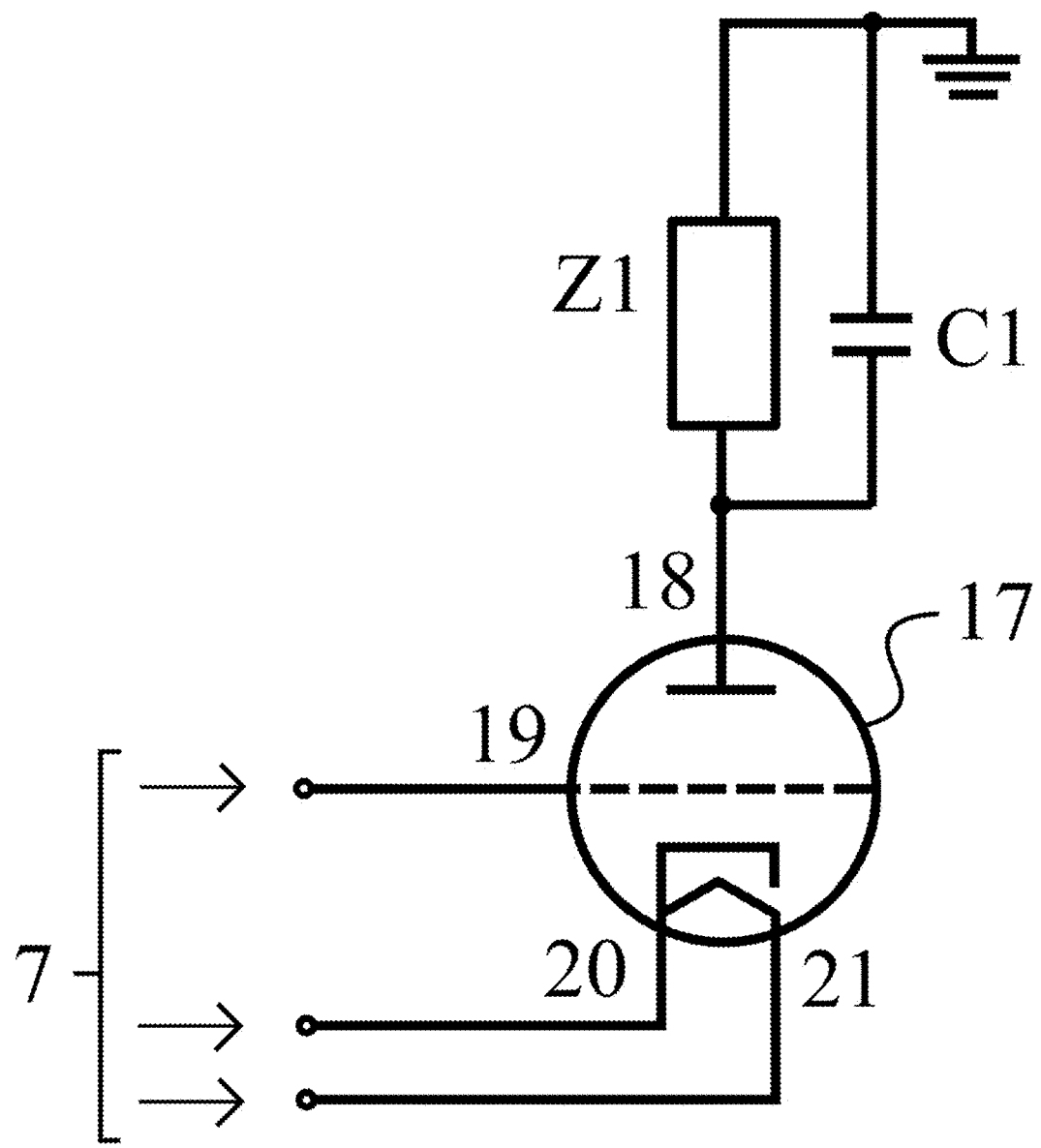
FIG. 4 schematically depicts an equivalent electrical circuit diagram/model for the power amplifier assembly, in operation, depicted, by way of example, in FIG. 2C.

With continued reference to FIG. 2A, the hermetic break 5 is physically connected, at the first conductive material 16a and the second conductive material 16b to the socket interface 9 (provided in the illustrative example as two physically joined pieces 9a and 9b) and the fixed potential electrode 8 (provided in the illustrative example as two physically joined pieces 8a and 8b). The electrically insulating ceramic material of the dielectric body 23 provides a high-voltage break point between the RF output of the RF power amplifier 6, received via the socket interface 9, and the fixed potential electrode 8. The hermetic break 5 also exhibits a characteristic of a sufficiently low interelectrode capacitance, which manifests electronically as a capacitive load C1 in parallel with the load Z1 provided by the combination of the antenna 4 and the cavity 2. The above-described electrical circuit characteristics of the hermetic break 5 are summarized in the effective electrical circuit model of the system schematically depicted in FIG. 4.

By way of further explanation/definition, a "sufficiently low" interelectrode capacitance is defined such that the inverse of the interelectrode capacitance is greater than or equal to the angular frequency of the RF input multiplied by the magnitude of the antenna impedance. In the illustrative example depicted in FIG. 2A, the hermetic break 5 high-voltage break characteristic is carried out by the first conductive material 16a and the second conductive material 16b being joined to the dielectric body 23 by two ceramic-to-metal seals (e.g. alumina-to-copper joints achieved via brazing or diffusion bonding), where each one of the two ceramic-to-metal seals is located at an end of the generally cylindrical dielectric body 23. The metal sides of each joint, which are formed respectively by the first conductive material 16a and the second conductive material 16b, have a mechanical stress-relieving structural characteristic/feature 16 to account for differences in coefficients of thermal expansion between the two dissimilar materials (metal and ceramic) of the hermetic break 5 and thereby facilitate reliable bonding. A variety of insulator break and hermetic sealing configurations are contemplated for signally coupling the RF amplifier output with the cavity structure and vacuum chamber. In a particular illustrative example, directly joining high-conductivity copper (16a and 16b) to the ceramic material (23) yields superior RF power transmission capability—compared to a traditional Kovar to ceramic braze process—avoiding a potentially difficult/challenging further step of subsequently coating exposed metal surfaces in a high-conductivity material, such as copper. While shown as a separate physical feature in FIG. 2A, it is noted that in other illustrative examples the first conductive material 16a may be an integral part of the fixed potential electrode 8 structure. Likewise, the second conductive material 16b may be an integral part of the socket interface 9 structure.

When the antenna 4 configuration is a loop antenna structure, as is the case in the example illustratively depicted in FIG. 2A, the antenna 4 may be constructed from hollow tubing though which coolant may be controllably passed to achieve desired temperature control of system components. A coolant input/output structure 13 is depicted in FIG. 2A. The coolant input/output structure 13 is connected to the antenna 4 (a hollow tube structure) via a set of two channels 14 that pass through the fixed potential electrode 8, into which the coolant input/output structure 13 and the antenna 4 tubes are inserted and then welded, brazed, epoxied or otherwise sealed. Further, a hollow cavity 15 within the socket interface 9 for coolant flow allows for more efficient cooling of the RF power amplifier 6.

In accordance with the illustrative example depicted in FIG. 2A, a ConFlat (CF) flange 10 may be used in conjunction with a bellows 11 to ensure that structural interfaces of the RF power amplifier assembly can be mated to the vacuum chamber while remaining tolerant to manufacturing errors in either the power amplifier assembly 3, the cavity 2, or the vacuum chamber 1 that would require the power amplifier assembly 3 to maintain some variability/adjustability in its positioning.

An alternative to the above approach is to make the vacuum seal permanent instead of demountable. This could, for example, be accomplished by replacing the CF flange 10 by a welded, brazed, or epoxied joint. The fixed potential electrode 8 and the bellows 11 are connected via a cylindrical housing 12, whose function is simply to provide a structurally sound vacuum barrier between where the power amplifier assembly 3 mates to the cavity 2 and mates to the vacuum chamber 1.

Regardless of any specific illustrative example, with the RF power amplifier 6 located on the air-side of the vacuum chamber 1, deleterious effects such as multipactoring and surface flashover can be minimized or even eliminated for the power conditions of a LINAC or other RF cavity structure. This is a significant improvement over the current state of the art. Power dissipation and cooling can further be managed external to the vacuum environment.

Further, with the illustrative examples, the RF power amplifier 6 of the illustrative RF power amplifier assembly, which may comprise several instances of the RF power amplifier 6, can be rapidly changed out for programmed maintenance, or at end of life, without venting the vacuum chamber 1. In the illustrative example depicted in FIG. 2C, this is done by removing the electronic interface through which inputs 7 are applied, and then removing the RF amplifying element 6, which is replaced before re-inserting the physical interface for the inputs 7. In the illustrative example depicted in FIG. 2C, the socket interface 9 includes a threaded socket, into which the threaded anode electrode 18 of the CPT 17 is screwed. Furthermore, in the illustrative example provided in FIG. 2B, a grid electrode 19 a cathode electrode 20 and a filament electrode 21 of the CPT 17 are connected to a connector interface providing the inputs 7.

Figure 3:
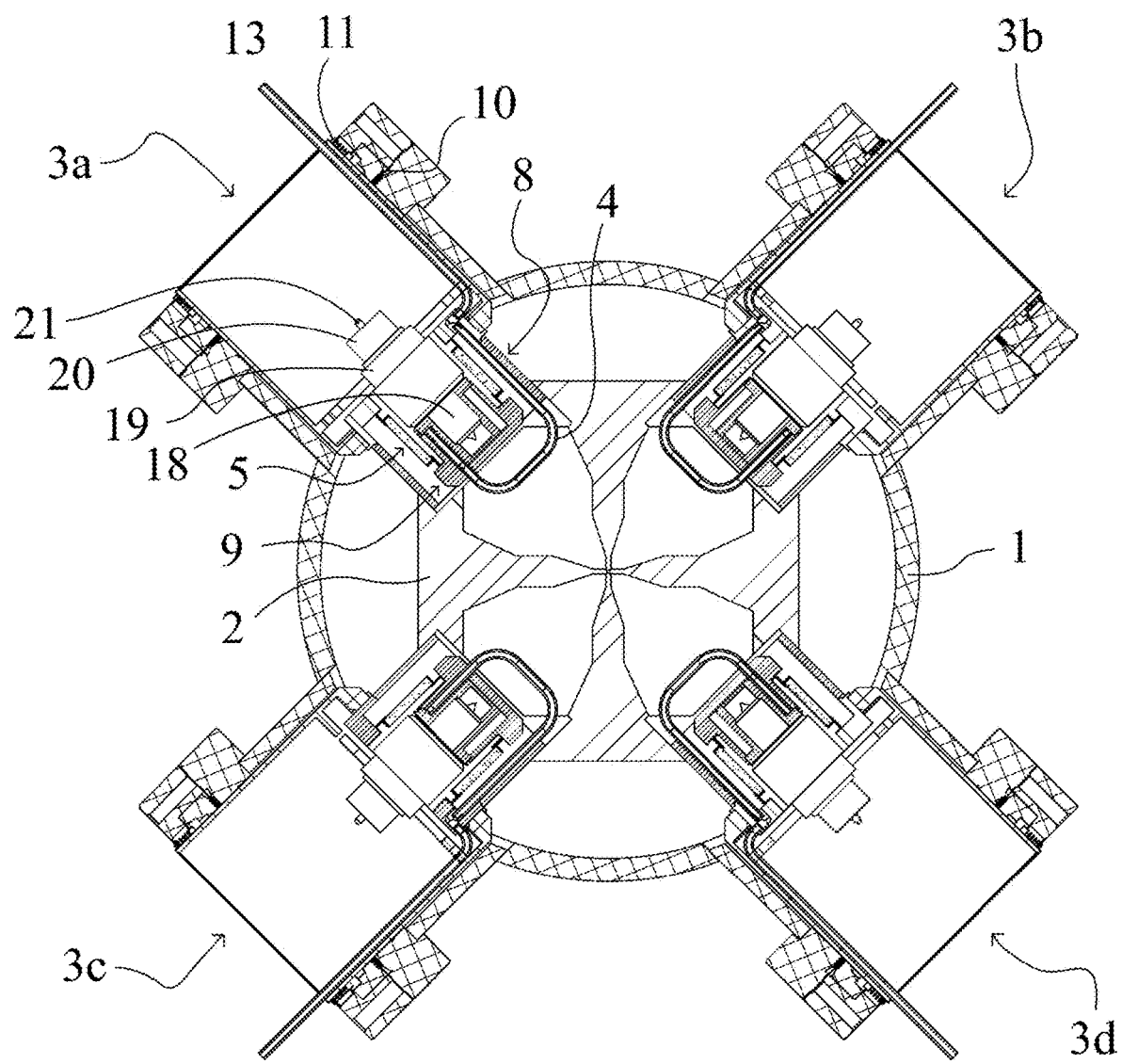
FIG. 3 depicts a cross-sectional view of the RF LINAC system including four power amplifier assemblies (depicted in FIG. 2C) attached to an RF LINAC cavity and a vacuum chamber containing the RF LINAC cavity.

Turning to FIG. 3, an illustrative example of the disclosed system/apparatus includes the integration of 4 to 12 power amplifiers onto a radiofrequency quadrupole accelerator to produce particle beams at energies in an approximate range of 2 to 5 MeV. An illustrative cross section is shown in FIG. 3 showing four power amplifier assemblies 3a, 3b, 3c, and 3d symmetrically arranged around the cavity 2. Such systems could be used for the generation of neutrons, gamma-rays and energetic ions for various scientific, medical or industrial purposes. Integrating the power amplifiers directly onto the radiofrequency quadrupole accelerator eliminates entire racks of equipment, RF power combining equipment, waveguides and power conditioning hardware. Since the RFQ cavity is a power combining cavity in its own nature, the illustratively depicted/described system/apparatus uses the power combining cavity for the dual uses of: (1) combining multiple amplifiers for use on a single LINAC system, and simultaneously (2) setting up electromagnetic fields for accelerating particles to high energies.

It can thus be seen that a new and useful system for coupling/injecting RF power into RF LINACs has been described. In view of the many possible embodiments to which the principles of this disclosure may be applied, it should be recognized that the examples described herein with respect to the drawing figures are meant to be illustrative only and should not be taken as limiting the scope of the disclosure. For example, those of skill in the art will recognize that the elements of the illustrative examples depicted in functional blocks and depicted structures may be implemented in a wide variety of electronic circuitry and physical structures as would be understood by those skilled in the art. Thus, the illustrative examples can be modified in arrangement and detail without departing from the spirit of the invention. Therefore, the invention as described herein contemplates all such embodiments as may come within the scope of the following claims and equivalents thereof.

Traditional structures and systems for fabricating RF LINAC systems involve taking a large billet of special grade material or alloys, such as niobium metal, beryllium metal, ultra-high purity oxygen-free copper, and precision machining to precise dimensional tolerance for narrow frequency band resonant cavities for RF acceleration. For many accelerator components, only a few percent of the bulk material are used with a lot of lost material, time and labor. This is done at great cost to preserve material properties; and to minimize the number of lossy interfaces, tolerance/stack-up errors, hermetic breaks and mismatches. Often a substrate material is used for its superior structural properties at a performance cost of electrical or thermal properties. Tradeoff choices include: using stainless steel instead of copper, or the converse selection of niobium instead of copper. Because electrical properties dominate in the skin-depth for electromagnetic propagation in materials at high-frequencies (e.g. MHz), using a composite structure with a surface layer that exhibits superior electrical and vacuum properties.

With a composite structure, different materials may be selected for different components for thermal characteristics, structural support, expansion and contraction, anti-vibration, etc. With the ability to form composite structures, novel methods for fabrication, alignment, fixturing, and segmentation facilitates reducing cost and improving design flexibility for weight, size and power reduction and ease of integration. In particular, desirable surface material properties (e.g. low electron emission), material purity (e.g. low inclusions, low field concentration), cavity smoothness (e.g. lower field emission, higher gradient), near-surface morphology (e.g. limited whisker growth, spark initiation), and vacuum tolerance (e.g. low vapor pressure, surface mobility) can be engineered to improve the characteristics of the RF LINAC.

The manufacturing operations and techniques described herein also allow replacing bulk, solid niobium materials with thin-layers for superconducting cavities using more robust, thermally-conductive and easier to form/machine/work materials. Because of the diversity of materials that can be deposited onto a range of substrates, the technique allows more options and choices for accelerator cavities and components.

The RFQ LINAC is complex to fabricate due to a precision vane structure requiring vane tip alignment, spacing and assembly into four quadrants of equal size for RF load balancing. Traditional RFQ LINACs are manufactured using major-minor vane configurations comprised multiple axial assemblies integrated together to achieve a desired acceleration length. Typical RFQ LINACs operated about 200-425 MHz are 10s of meters in length for acceleration to several MeV for hydrogen ions. These machines are large, costly and are typically found at national laboratories, medical centers and research universities. Direct sputter coating on the interior can seal the interfaces between components, such as vanes, spacers, tuning rods, bellows, etc. However, the sputter coating methods and structures described herein are broadly applicable to a variety of applications beyond coating the interior surfaces of RFQ LINACs.

Figure 5C:
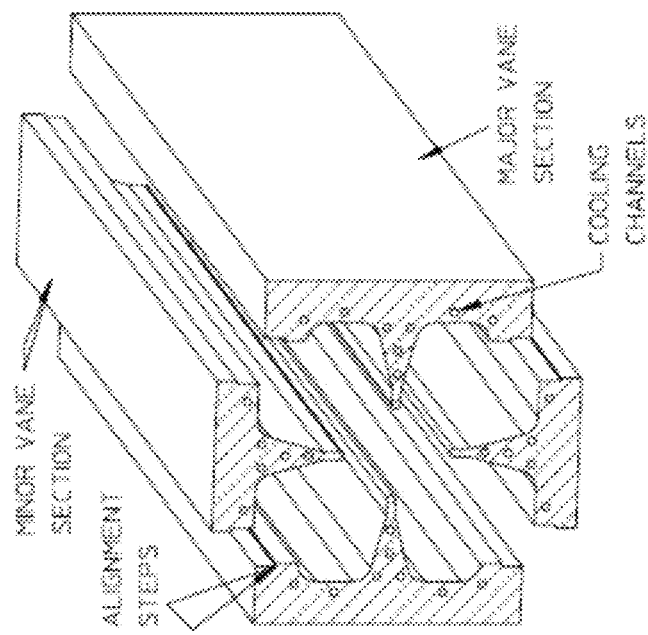
FIG. 5C is prior art showing major-minor vane construction for an RFQ with alignment shims and RF seals at each interface.
Figure 5A:
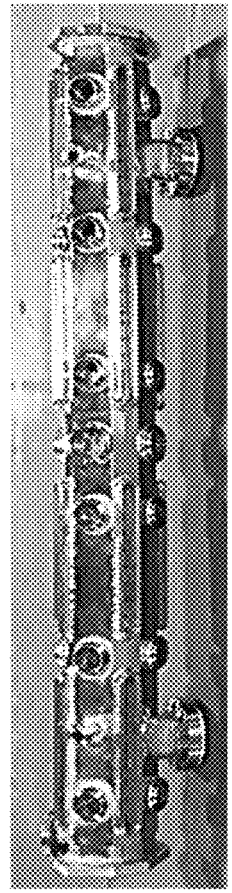
FIG. 5A is a photograph of the exterior of an RF LINAC cavity for a radiofrequency quadrupole accelerator.

The thin-film deposition, etching and surface modification method herein enables composite construction, low-complexity integration and improvement in surface material properties for higher gradient operation. FIG. 5A is a photograph of an exterior of an RF LINAC cavity for a radiofrequency quadrupole accelerator. In the example show, the RF cavity serves as an external vacuum chamber with multiple ports designed for acceptance of the RF power amplifier assembly depicted in FIG. 1.

Figure 5B:
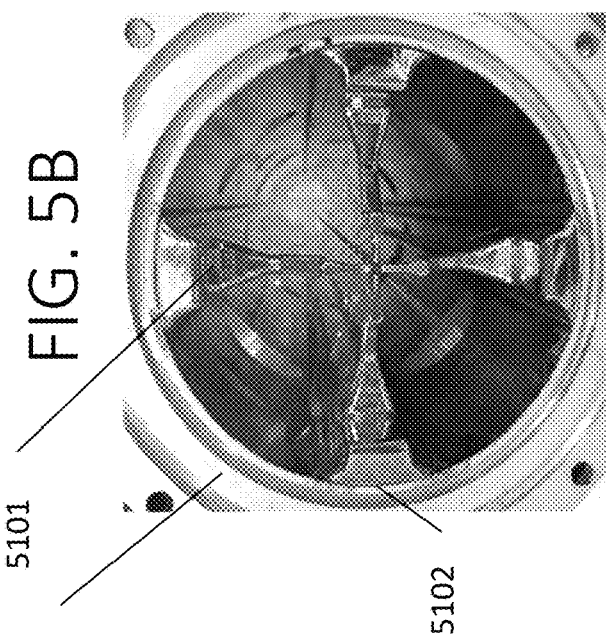
FIG. 5B is a photograph of interior quadrants of an RF cavity formed by rigid attachment of four vane structures prior to surface modification and formation of a continuous RF seal.

FIG. 5B is a photograph of interior quadrants of the example RF cavity formed by the rigid attachment of four vanes structures prior to surface modification and formation of a continuous RF seal. Four vane structures 5101 are inserted into an RF cavity and bonded into place with a material 5102. A precision fixturing jig (not shown) is attached to the four vane structures 5101 and vane tip alignment, positioning, gap spacing and tolerancing is performed ex-situ, prior to insertion into an RF cavity substrate 5100. Once the properly gapped and aligned vane structures 5101 are inserted, the fixtured vanes are rigidly attached to the RF cavity substrate 5100. The attachment structures are varied and include, by way of example, soldering, mechanical screws, turnbuckles, epoxy, low-temperature braze, etc. In the example shown in FIG. 5B, conventional solder is used with a low-temperature bake in an inert oven. As detailed in the following sections, the IMPULSE® thin-film deposition, etch and surface modification technique is used to coat the interface with a high-conductivity copper layer for a continuous cavity surface to achieve high Q. This is in contrast to FIG. 5C that shows a prior art major-minor vane construction for an RFQ with alignment shims and RF seals at each interface. Because the RFQ LINAC is thermally cycled and materials age, the interfaces between the major and minor vanes need additional compression force with restorative contact to maintain low resistance for high surface conductivity to RF currents. As a result, the attainable cavity Q may be 10-80% of the theoretical maximum value under ideal operating conditions, e.g. a cavity Q of 4500 vs. the 10,000 achievable for smooth, solid surface copper. A wide variety of mixed materials, including for example ceramics, semiconductors and metals, can be deposited on the RF cavity walls during a sputtering deposition operation where a majority of RF current and energy will transport using the known IMPULSE®+Positive Kick™. By way of illustrative example, the described sputtering deposition technique provides good coverage and sealing surfaces for room-temperature Cu and superconducting cavities, such as Nb or Nb/NbN, $Nb_3Sn$ or $MgB_2$.

Figure 6B:
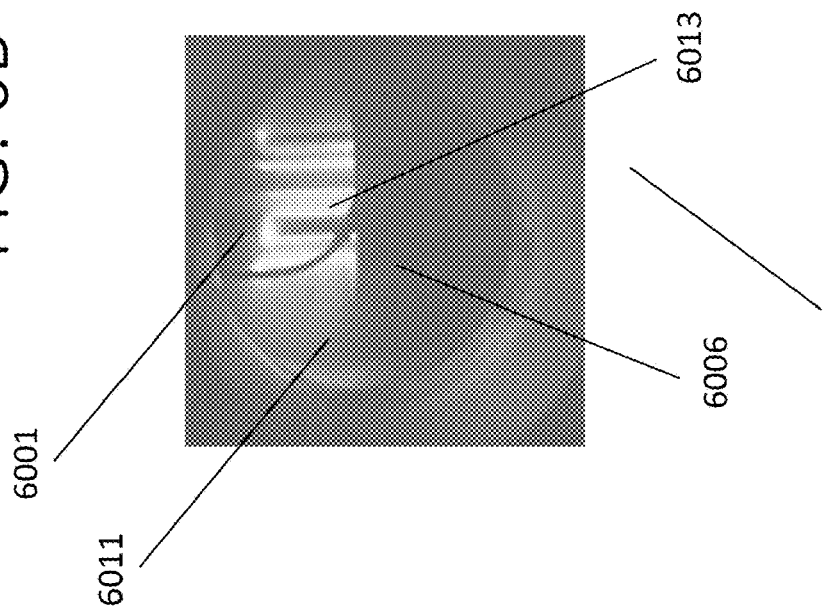
FIG. 6B is a photograph of the example illustrated in FIG. 6A in operation for deposition of high-conductivity copper directly onto a mechanical RF seal.
Figure 6A:
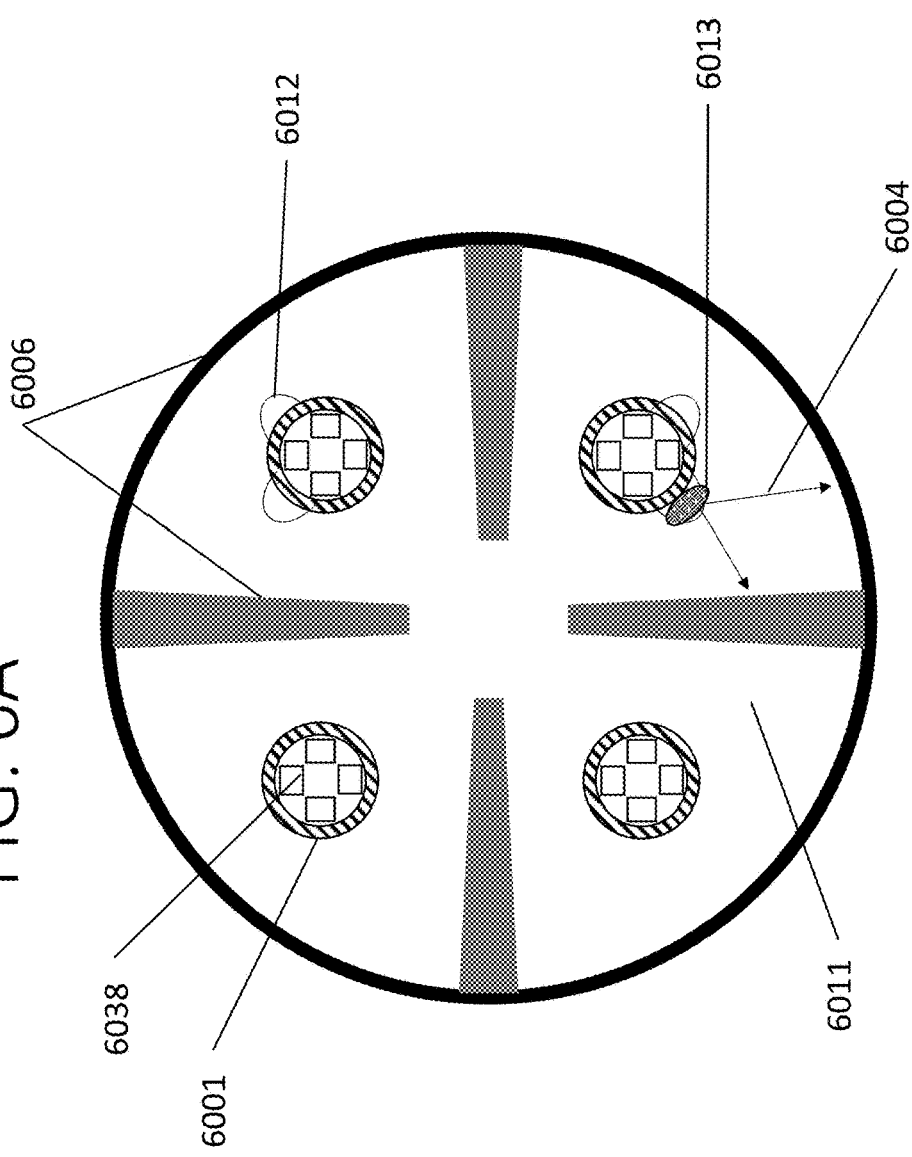
FIG. 6A depicts a cross-sectional view of an illustrative example of surface modification, etching and deposition of thin films on a cavity.

FIGS. 6A & 6B illustratively depict an application of the surface coating system and methods of operation disclosure herein. Namely, thin-film etching and deposition on particle accelerator electrodes and electromagnetic cavity structures are illustratively depicted. FIG. 6A depicts a cross-sectional area of a four-vane radiofrequency quadrupole (RFQ) accelerator cavity. The internal four quadrants of the RFQ accelerator cavity are subjected to intense electromagnetic fields and surface RF currents in operation. To achieve high accelerating gradients during operation, very high electric fields are used. Therefore the quality of the surface coating in the cavity, including the microstructure and electrical conductivity, are critically important to achieve high performance. The surface coating structures and methods disclosed herein facilitate a surface preparation, cleaning, etching, adhesion and deposition of high-quality materials that improve quality and performance of the deposited coatings during operation of the RFQ accelerator. In the illustrative example of FIG. 6A, a sputter target (e.g. sputter target 6001) is inserted inside a vacuum environment 6011 of an accelerator cavity substrate 6006. Magnetic assemblies (e.g. assembly 6038) inside of the sputter target 6001 generate magnetic fields 6012 that generate and sustain dense plasma regions 6013 to generate ions and neutrals 6004 that well deposit on substrate 6006. This is accomplished, for example, by introducing a gas into the vacuum environment 6011 in the range of 0.01-100 mTorr, typically noble gases like Ar or reactive gases like $N_2$, with voltages in the range of 200-2000V with magnetic fields on the order of 100-1000s of Gauss. During operation of the sputtering deposition operation, the energetic ions and neutral particles 6004 are generated and directed towards substrate 6006.

FIG. 6B is a photograph of the illustrative example in FIG. 6A during an actual operation for deposition of high-conductivity copper directly onto an interior surface of an RFQ accelerator cavity with vane structures fixtured and soldered directly to the RFQ accelerator cavity surface. The sputter deposited copper directly coats the interior surface including the solder material to make a continuous Cu layer exhibiting excellent sealing and surface properties. In FIG. 6B, the four (4) sputtering targets 6001 with the dense plasma regions 6013 are contained in the vacuum environment 6011 with the RFQ cavity substrate 6006 visible during insertion. The dense plasma region 6013 is clearly visible inside the vacuum environment 6011. High-conductivity copper with dense nanograin structure can be deposited with an ultra-smooth surface roughness to withstand high electric field gradients. The nanograin texture is resistant to slip-plane whisker growth that promotes surface electric field concentration and sparking under high electric field gradients. The illustrative examples described herein avoid this problem.

Furthermore, the presently disclosed material deposition operation (described in the context of providing a superior sealed copper conducting surface for an RFQ accelerator cavity) can also be used for superconducting films and layers, such as Nb, Nb/NbN, etc. Using the IMPULSE® and Positive Kick™ and aspects of this disclosure, the film morphology and crystallinity are controlled to achieve preferred grain orientation, grain size, lattice plane matching, surface roughness and other parameters leading to superior residual resistivity ration, current density and magnetic performance.

Figure 6C:
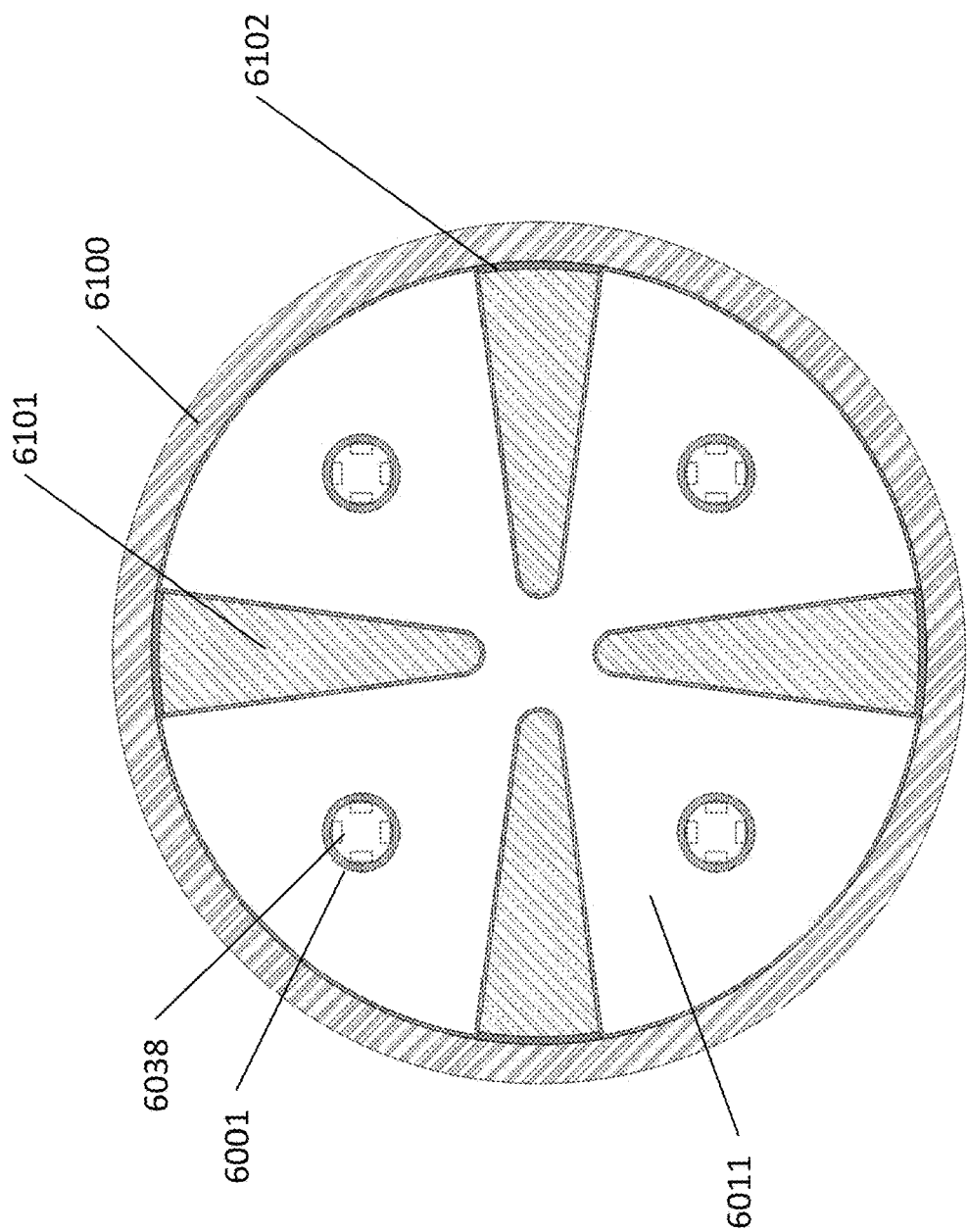
FIG. 6C depicts a composite RF LINAC cavity comprised of one or more bulk substrate materials with one or more material coatings.

FIG. 6C depicts a composite RF LINAC cavity comprised of one or more bulk substrate materials with one or more material coatings. Materials making up vanes, such as a vane 6101 are fixtured to a wall of the RFQ accelerator cavity relative to one another according to a particular design for the RFQ accelerator and affixed to an RFQ accelerator cavity substrate 6100 using a bonding material 6102. The material of the cavity substrate 6100 is selected for its desired material properties, such as: structural, thermal, cost and ease of fabrication. The materials that make up the vanes, such as the vane 6101 are selected for their properties, such as thermal conductivity, coefficient of thermal expansion, machinability, compatibility for copper coating, etc. The actual bonding of the vane 6101 to a surface of the cavity substrate 6100 is carried out, for example using the bonding material 6102 using, for example, a combination of mechanical and chemical attachment structures. The sputtering targets, including the sputtering target 6001 with a corresponding magnetic assembly 6038, are inserted into the vacuum environment 6011 for surface modification, etching and deposition. The sputter target 6001 material can be any of a variety of materials selected to obtain different compositions having different properties for particular RFQ accelerator applications.

Figure 6E:
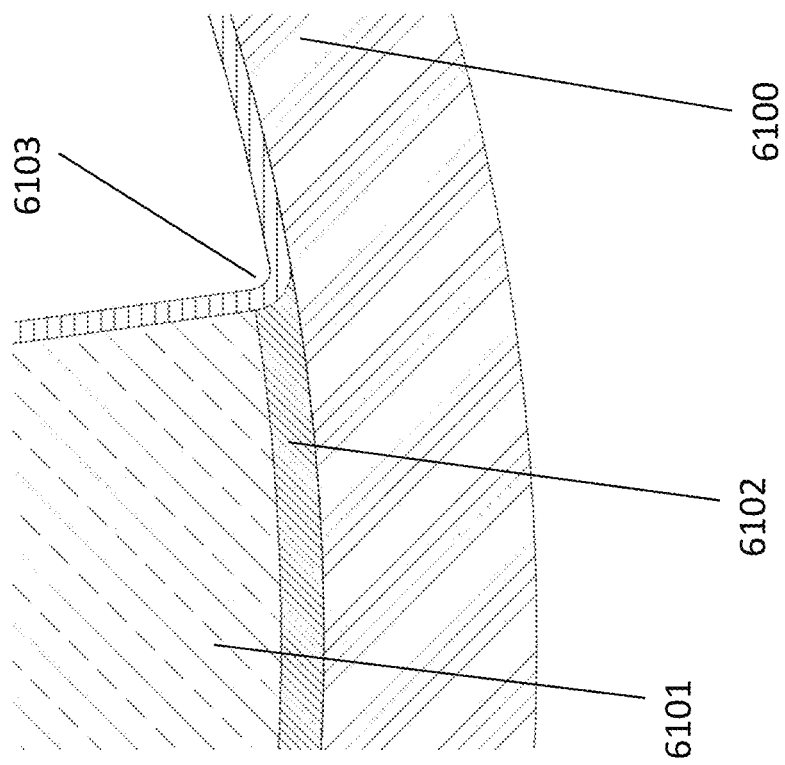
FIG. 6E depicts a close up view of a composite RF LINAC cavity where a vane material is rigidly affixed to a vacuum housing with mechanical/thermal interface and the thin-film continuous coating serves as an electrical interface.
Figure 6D:
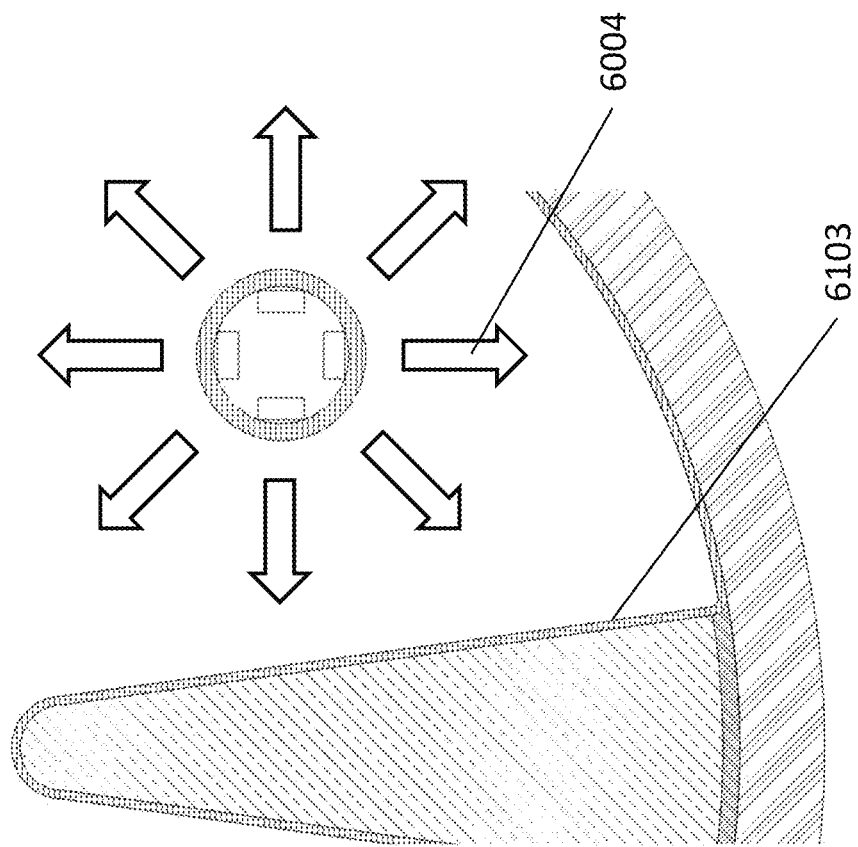
FIG. 6D depicts an in-situ sputtering electrode emitting ions and neutral particles to coat one or more substrates.

FIG. 6D depicts a zoomed-in view of the previous figures to provide a more detailed depiction of an in-situ sputtering electrode emitting ions and neutral particles (neutrals) to coat one or more surfaces of the RFQ accelerator cavity substrate 6100. The energetic ion and neutron particle flow 6004 is directed at the surface within the RF cavity and accelerator component to produce a thin or thick film surface coating 6103 with engineered properties.

FIG. 6E depicts a further zoomed in close up view of a composite RF LINAC cavity where the vane 6101 is rigidly affixed to a vacuum housing by a mechanical/thermal interface, and the thin-film continuous coating serves as an electrical interface. The thin/thick film surface coating 6103 provides a continuous, smooth electrical path across a transition from the RFQ accelerator cavity substrate 6100 to a bonding material 6102 to the material on an outer surface of the vane 6101. At MHz RF frequencies an electrical skin-depth for electromagnetic propagation is only a few micrometers. Therefore, from the vantage point of the RF cavity, RF energy cannot reach ("see") the underlying materials (beyond the skin-depth) and thus performance can be optimized for a multi-layered composite structure where electric field properties are emphasized within the skin-depth range, and mechanical, structuring, cost, manufacturing properties/considerations predominate at distances outside the skin-depth layer.

Conventional wet chemistry and electroplating techniques are limited in substrate material choices, substrate shape, contamination, surface material finish, and adhesion strength. The presently disclosed innovative fabrication features described herein are based on use of conformal physical vapor deposition in combination with surface etching, preparation and modification techniques for a wide range of materials.

Figure 7A:
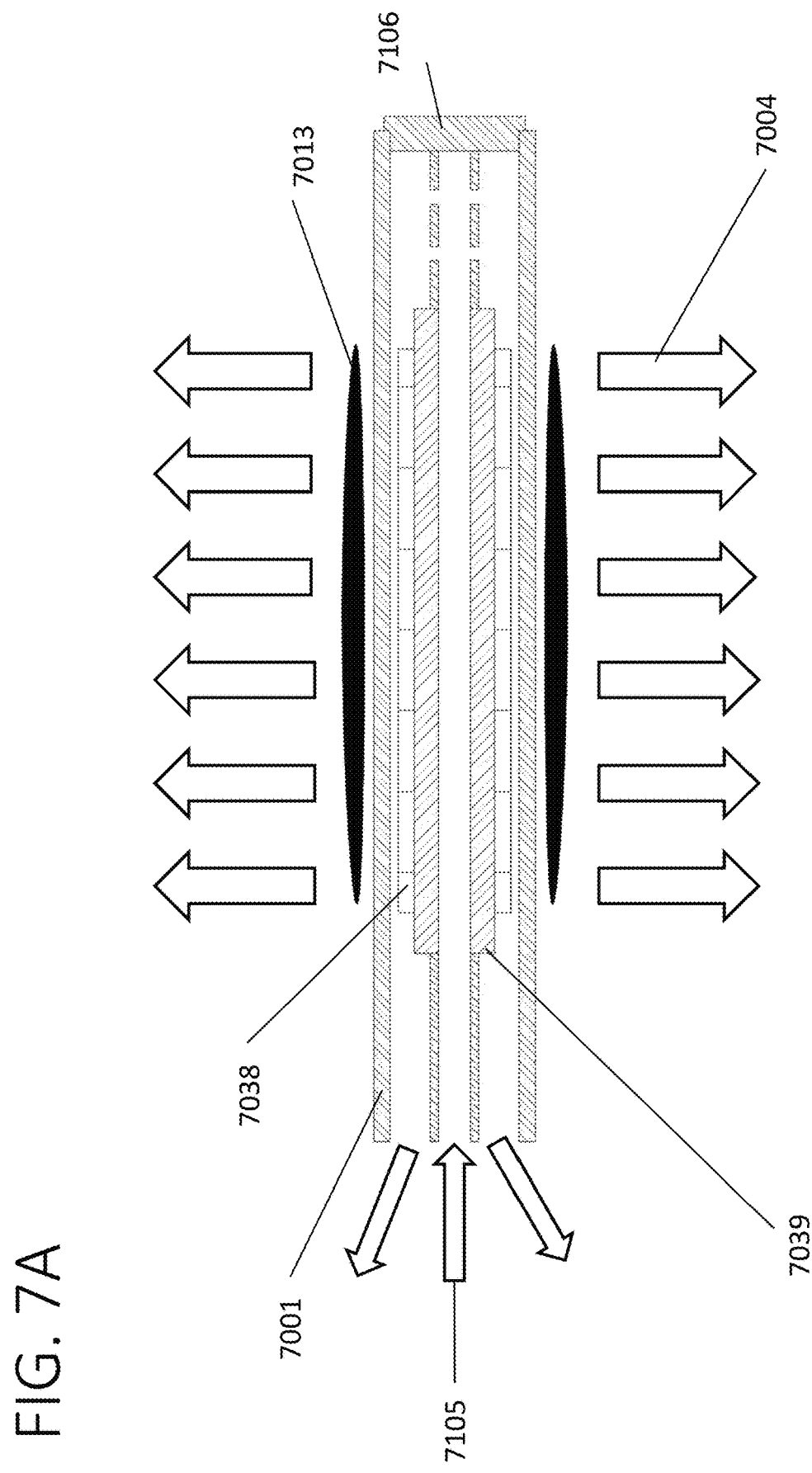
FIG. 7A depicts an axial internal view of a sputtering electrode emitting ions and neutrals to highlight internal coolant flow, magnetic assemblies and plasma generation on the exterior.

FIG. 7A illustratively depicts an axial internal side cross-sectional view of an end-capped cylindrical magnetron emitting ions and neutrals highlighting internal coolant flow, magnetic assemblies and plasma generation on the exterior. Sputtering target electrode 7001 is mounted onto an end-capped assembly 7106 with an internal cooling channel 7105 flowing coolant over magnetic assemblies 7038 and a sputtering target material 7001. There may be a target holder between the material 7001 and the coolant water and magnetic assemblies 7038. The magnetic assemblies are, for example, mounted to a structure that facilitates a rotation 7039 of the structures providing dense plasma regions 7013 around the sputtering target electrode 7001.

Figure 7C:
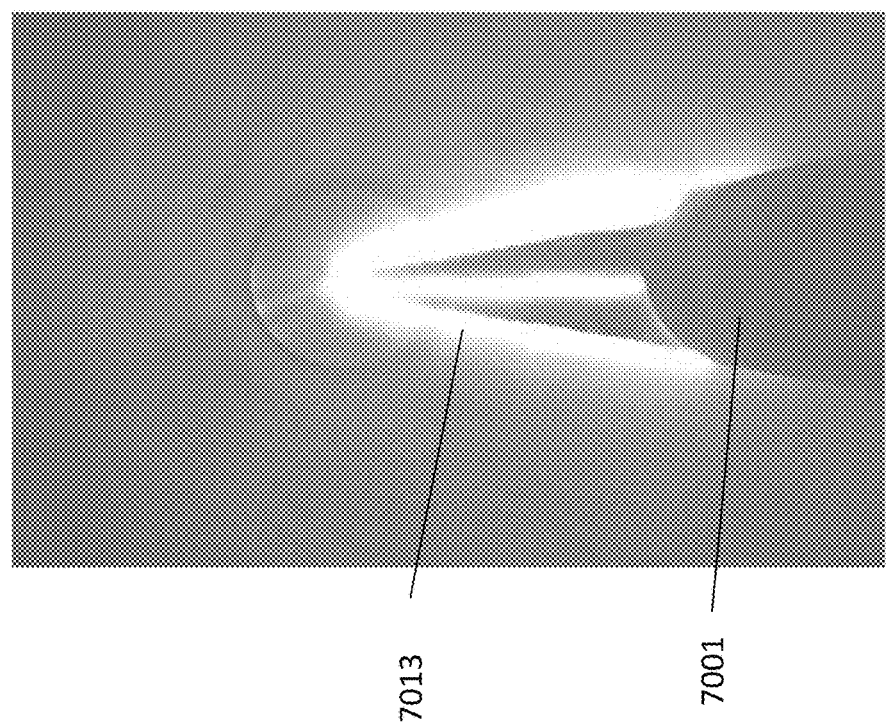
FIG. 7C is a photograph of a 1.5-meter long sputtering electrode illustrative example with a magnetic field arranged to create a single serpentine dense plasma zone around the sputtering electrode.
Figure 7B:
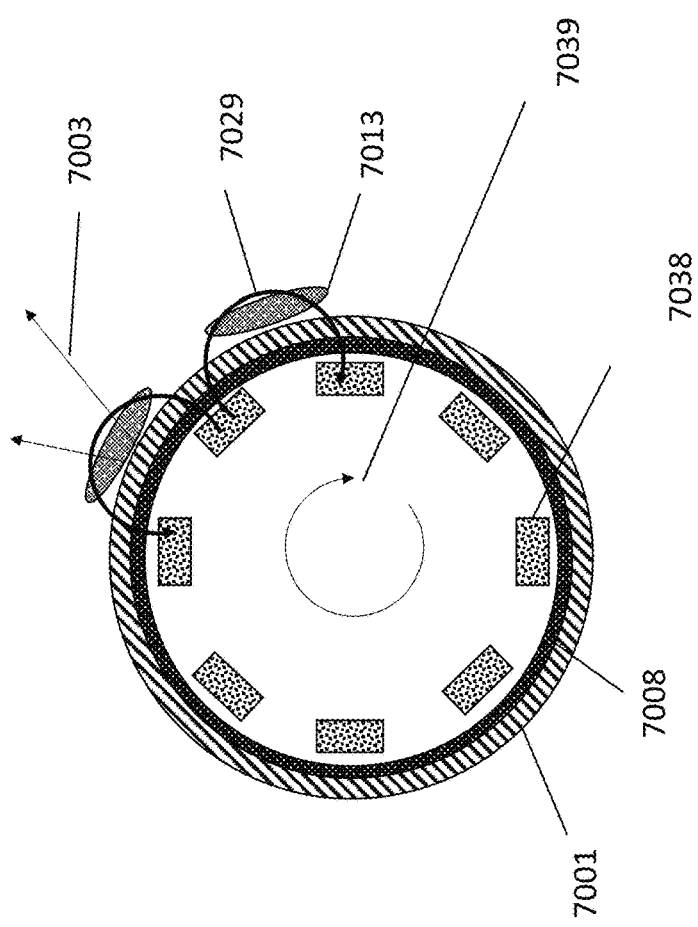
FIG. 7B depicts a cross sectional view of a sputtering electrode to highlight the relative rotation of the target material and magnetic assemblies.

FIG. 7B depicts, in an orthogonal cross sectional view of the structure depicted in side cross-sectional side view in FIG. 7A, a sputtering electrode highlighting the relative rotation of the sputtering target material and magnetic assemblies. The rotation 7039 allows magnetic fields 7029 from magnetic assemblies 7038 to move relative to the target material 7001. In the illustrative example, the magnetic assemblies 7038 are mounted to a target holder 7008. A dense plasma zone 7013 generates energetic ions and neutral particles 7003 that are directed outward from the sputtering target material 7001 towards the surfaces of the RFQ accelerator cavity substrate (not shown) to be coated, etched and modified.

FIG. 7C is a photograph of a 1.5-meter long sputtering electrode embodiment with a magnetic field arranged to create a single serpentine dense plasma zone around a sputtering electrode. Electrons orbit the continuous serpentine racetrack via Hall Effect ExB forces (aka "the magnetron effect") from the application of voltage on the sputtering target electrode 7001, resulting in generation of an intense plasma zone 7013. Because it is a single racetrack, the plasma density is able to better load balance over the cylindrical magnetron surface for better uniformity over the length. In this specific example, a 1.5 m-long plasma region is formed with good uniformity over the length suitable for azimuthal rotation.

Figure 7E:
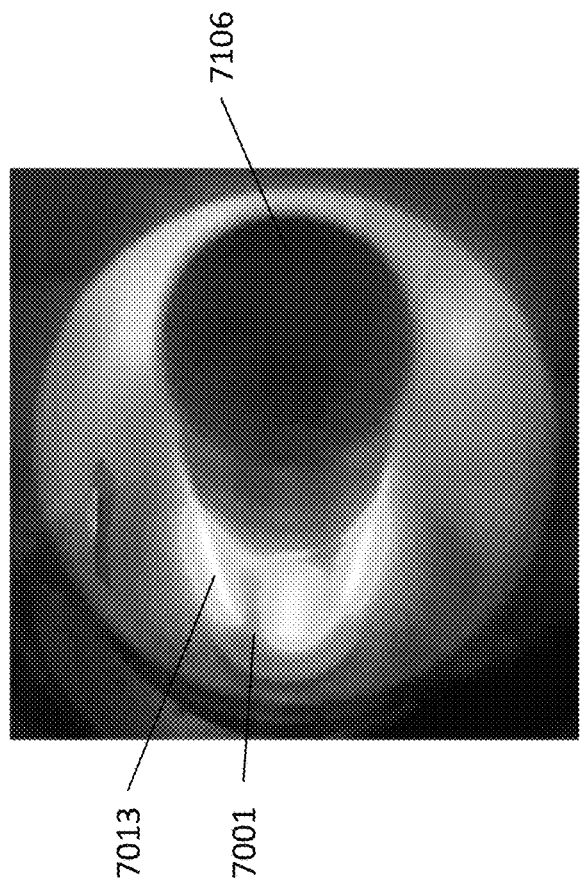
FIG. 7E is a photograph of an embodiment of the IMPULSE®+Positive Kick™ for implantation, intermixing, adhesion, stress control, morphology control, diffusion barriers and capping layers.
Figure 7D:
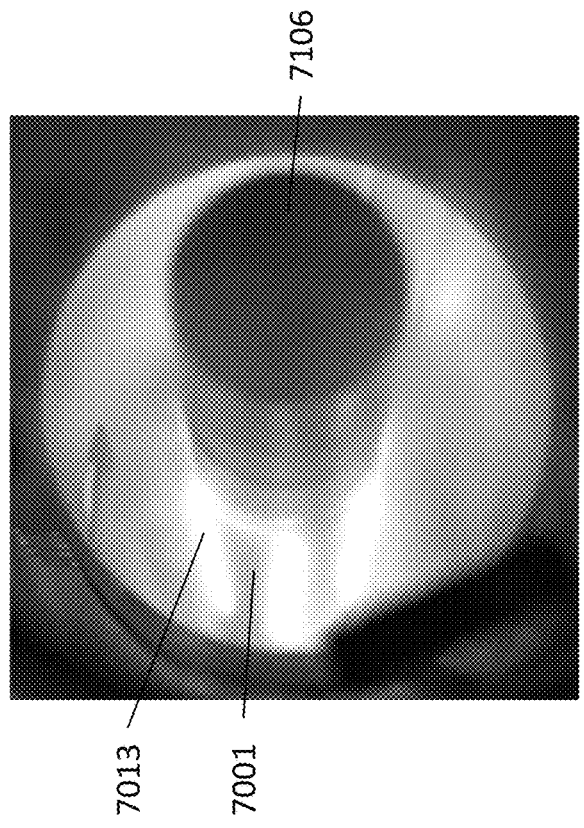
FIG. 7D is a photograph of an illustrative example of the IMPULSE®+Super Kick™ for cleaning, etching and surface modification.

FIG. 7D is a photograph of an end-capped cylindrical magnetron 7106 operating with a single serpentine racetrack dense plasma region 7013 on the sputtering target electrode 7001. In FIG. 7D, the end-capped cylindrical magnetron 7106 employs the IMPULSE®+Super Kick™ technique for generating an electromagnetic field for performing cleaning, etching and surface modification—as evidenced (when viewed live in operation) by a blue-pink-purple color on the copper sputtering target electrode 7001. In this plasma mode, the end-capped cylindrical magnetron 7106 generates high energy Ar+ ions and directs the ions radially outward to clean the surface of objects (e.g. an RFQ accelerator cavity) to be processed.

Advantageously, during a surface processing and treating operation, within less than a second, IMPULSE® operational parameters can be changed to switch operation of the assembly from performing a cleaning/etching operation to deposition/implantation operations. FIG. 7E is a photograph of the same system shown in FIG. 7D employing the IMPULSE®+Positive Kick™ technique for generating an electromagnetic field for performing implantation, intermixing, adhesion, stress control, morphology control, diffusion barriers and capping layers—as evidenced (when viewed live in operation) by a bright green copper plasma color from the sputtering target electrode 7001.

FIG. 7F is a photograph of a 6.3-mm diameter end-capped cylindrical magnetron 7106 with a different illustrative example with magnetic field assemblies 7038 arranged to create multiple dense plasma zones 7013 around the sputtering target electrode 7001 that can be axially translated. This configuration is adapted to treat interior surfaces of structures having very small diameters and coating the interior of small tubes and difficult-to-reach locations. However, the structure may also be used to treat surfaces of larger items as well.

Figure 8A:
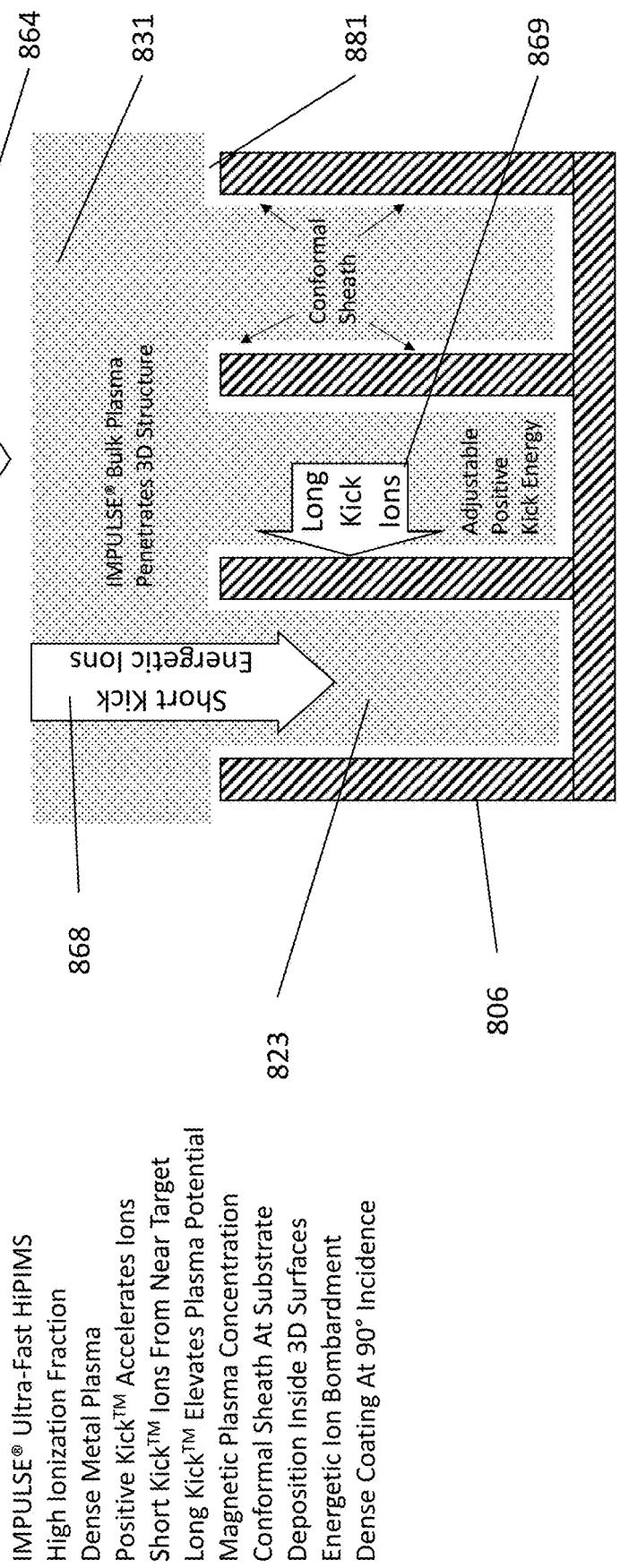
FIG. 8A depicts an illustration of the IMPULSE®+Positive Kick™ for conformal coating of substrates.

Using cylindrical magnetron configurations discussed herein above, as well as others including inverted cylindrical, planar and rotary, the IMPULSE® ultra-fast high-power impulse magnetron sputtering (HiPIMS) technique can be used to generate a dense metal plasma and an ultra-fast voltage reversal for carrying out Positive Kick™ and Super Kick™ techniques to accelerate ions and plasma to the substrate for modification. FIG. 8A depicts an illustration of an example of using the IMPULSE®+Positive Kick™ for conformal coating of substrates. During HiPIMS pulses the electrical current can be 10-1000× higher than conventional DC sputtering. Combined with ultra-fast IMPULSE® pulsing technology, peak power densities can be achieved <<100 usec leading to very high plasma densities. The Positive Kick™ voltage reversal and positive bias pushes ions and plasma away from the dense magnetic field regions on the magnetron to increase the local plasma density near the substrate during the pulse. This high-density bulk plasma 831 will have a short Debye length allowing it to penetrate 3D structure 823 of the substrate 806. Applying the Positive Kick initially accelerates ions from the magnetic confinement zones with directed energy 868 following Grad B and eventually float bulk plasma potential up such that a conformal sheath 881 will appear around the substrate 806 and accelerate additional ions 869 to the substrate. If the features are larger than several Debye lengths, then conformal deposition will result. An additional result of the Positive Kick is an increase in ion capture efficiency 864 which is important from an economics perspective.

Figure 8B:
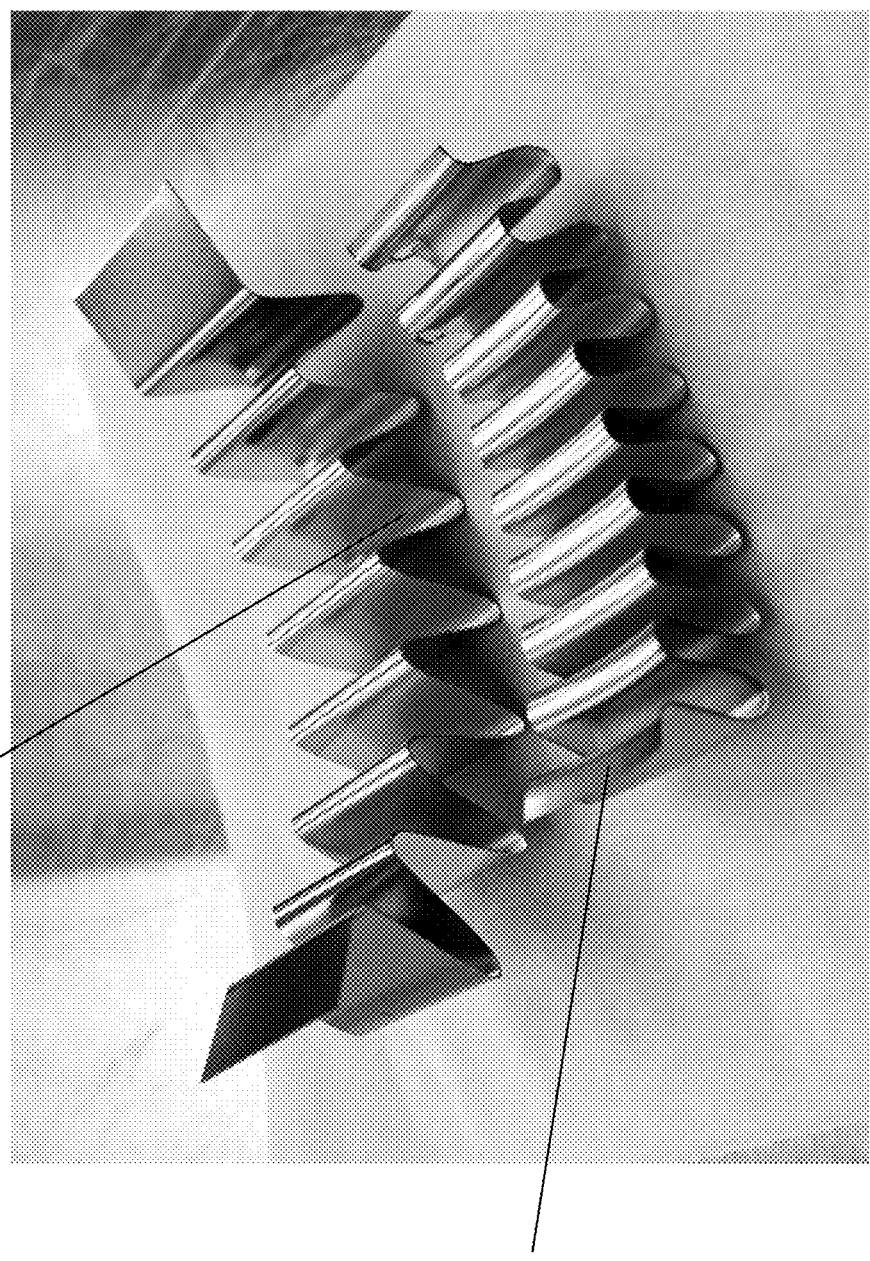
FIG. 8B is a photograph using the in-line cylindrical magnetron technology with IMPULSE®, Positive Kick™ and Super Kick™ for conformal thin-film copper coatings to replace conventional electroplating and wet electrochemistry for stainless steel cryogenic accelerator bellows.

FIG. 8B is a photograph depicting surface coatings achieved using the end-capped cylindrical magnetron technology with IMPULSE®, Positive Kick™ and Super Kick™ for conformal thin-film copper coatings to replace conventional electroplating and wet electrochemistry for stainless steel cryogenic accelerator bellows. In the foreground, the substrate to be coated 8006 is made from hydroformed stainless steel suitable for cryogenic applications. The as-received material is inserted into the cylindrical magneton system and IMPULSE® applied with Positive Kick™ for adhesion and surface adatom mobility and Super Kick™ for etching/cleaning. The continuous thin/thick film 8013 is conformal deep into the bellows channels. The adhesion and film quality are enough to survive a 400C air bake and immediate immersion into LN2 without spallation, delamination or material failure. The material is cycled through >1000 full-range expand-compress strokes without failure of the film.

Conformal coatings are achieved on accelerator surfaces, including RF cavities, RF seals, bellows, and actual vane tips, I-H structures, dielectric loading structures, tuning elements and electrodes. Low secondary electron emission, smooth and high-field emission limit materials can be deposited and well adhered in high stress locations, whereas high-conductivity bulk material can be coated in areas where low resistance is needed. For the case of the 4-vane RFQ accelerator cavity surfacing, the vane tips are coated with one type of coating for the high field region and the cavity zones are coated with a different type of film structure. For example, ultra-smooth, nano-crystalline or amorphous high-gradient materials on the vane tips and preferred orientation high-conductivity copper in the cavity zones.

FIG. 9A depicts an illustration of sputter target erosion and wear for narrow V trenches. Under HiPIMS conditions, the higher magnetic field location 9044 generates a higher plasma density 9013 leading to more local current and sputtering from location 9045 on cosine 9047 relative to the surface normal. The deeper the V-channel 9043 the less solid angle 9046 for material escape and a higher amount of material recycling occurs, lowering the overall deposition efficiency of the system. For multiple racetracks it is possible to have deeper racetrack grooves on some than others. This accelerates maintenance cycles. FIG. 9B depicts an illustration of sputter target erosion with relative movement between the dense plasma regions and sputter target material for uniform erosion. With rotation or axial adjustment of magnetic field relative to the target, improved uniformity and less groove 9047 can be achieved for greater solid angle emission 9049 and target utilization 9048.

Figure 10:
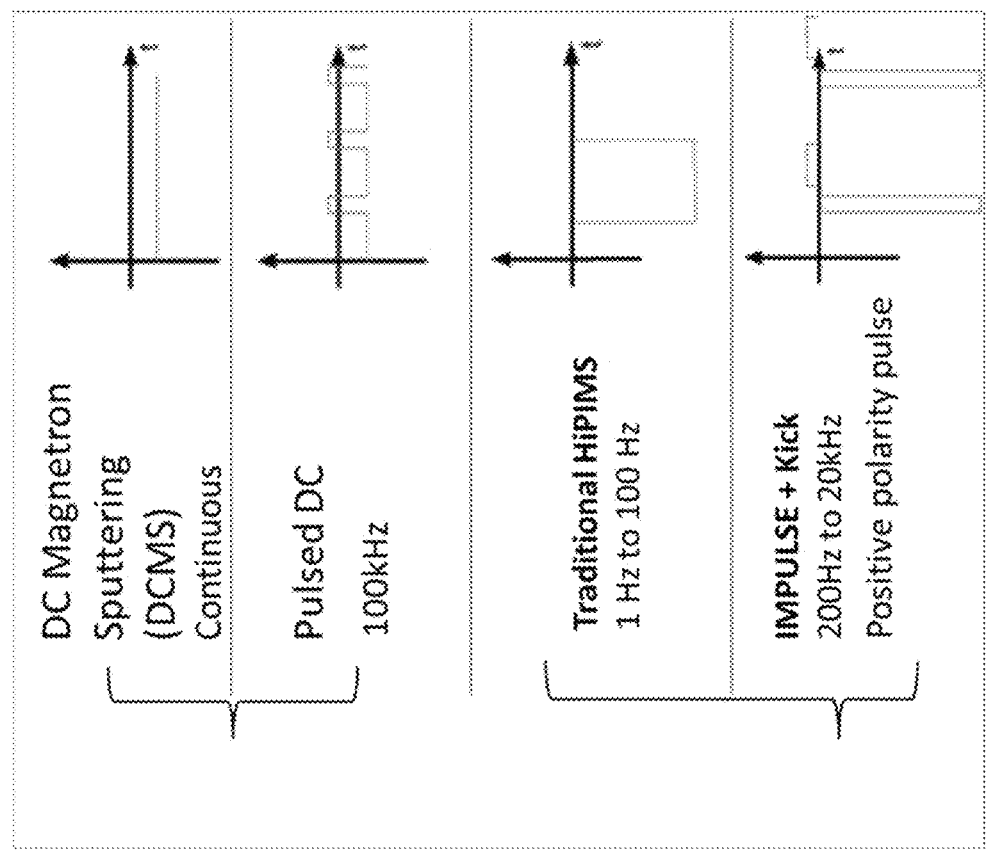
FIG. 10 depicts a comparison between conventional DC sputtering, pulsed DC, traditional HiPIMS and IMPULSE®+Positive Kick™.

FIG. 10 illustratively depicts a comparison of traditional DC magnetron sputtering (low current, low ionization), pulsed DC (lower current, low ionization but better for reactive gases), traditional HiPIMS (high current, high ionization but low deposition rates), and IMPULSE®+Positive Kick™ (high current, higher ionization rates and higher deposition rates). Typically, HiPIMS plasma current densities are ~0.3 A/cm2. Using an ultra-fast impulse followed by a Positive Kick pulse can exceed 3 A/cm2 with good film properties and is used as a factor in designing the inverted magnetron structure for high peak powers for more intense ionization, conformal plasma etching and deposition.

Figure 11:
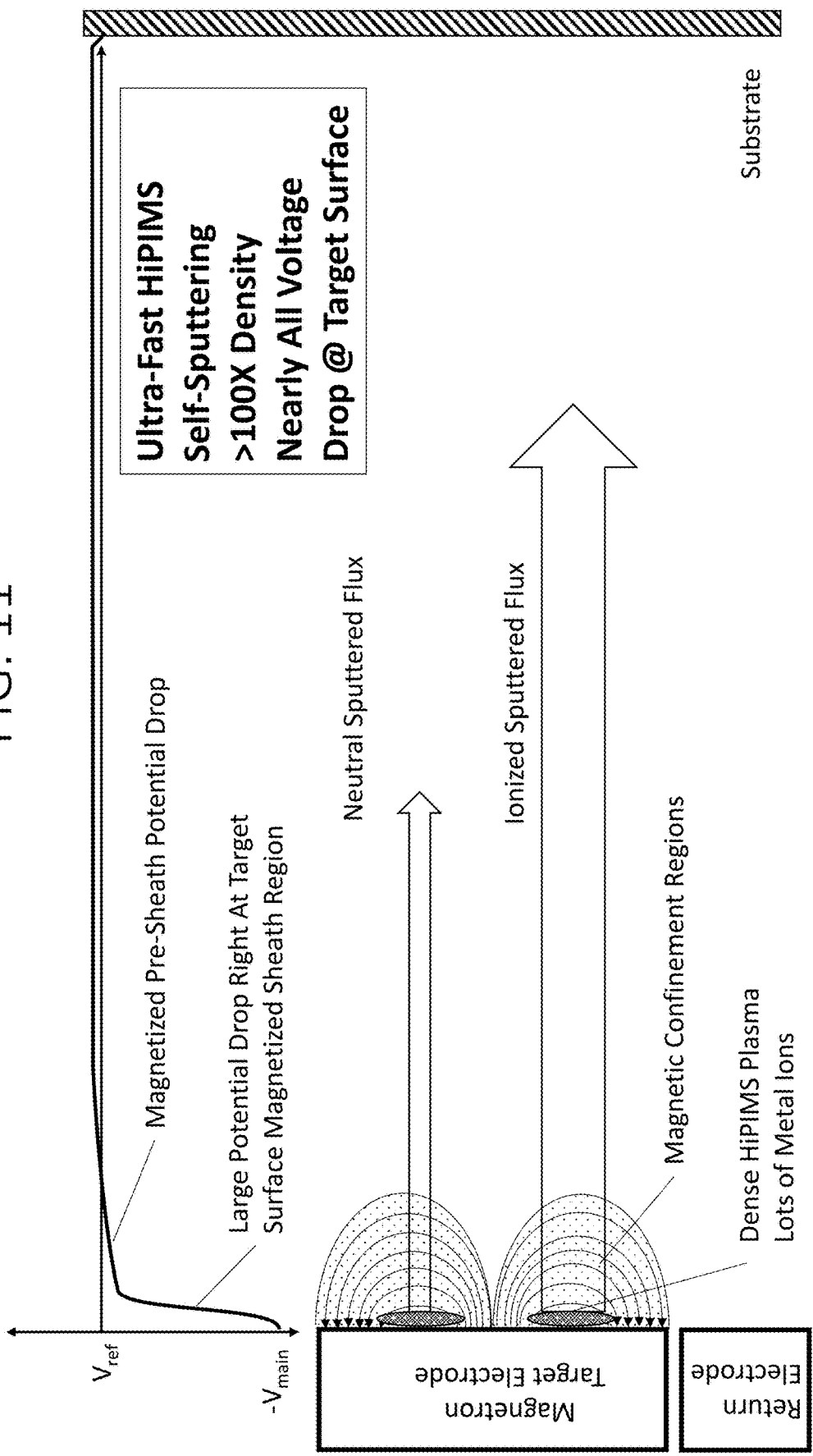
FIG. 11 depicts an illustration of the $1^{st}$ of 3 phases during an IMPULSE pulse operation—the Ultra-Fast HiPIMS phase.

FIG. 11 depicts an illustration of the $1^{st}$ of 3 phases during an IMPULSE pulse operation—the Ultra-Fast HiPIMS phase. FIG. 11 is adapted from US Application Publication US20180358213A1 and illustratively depicts an ultra-fast high-power impulse magnetron sputtering and the potential distribution between the sputter target and the substrate.

Figure 12:
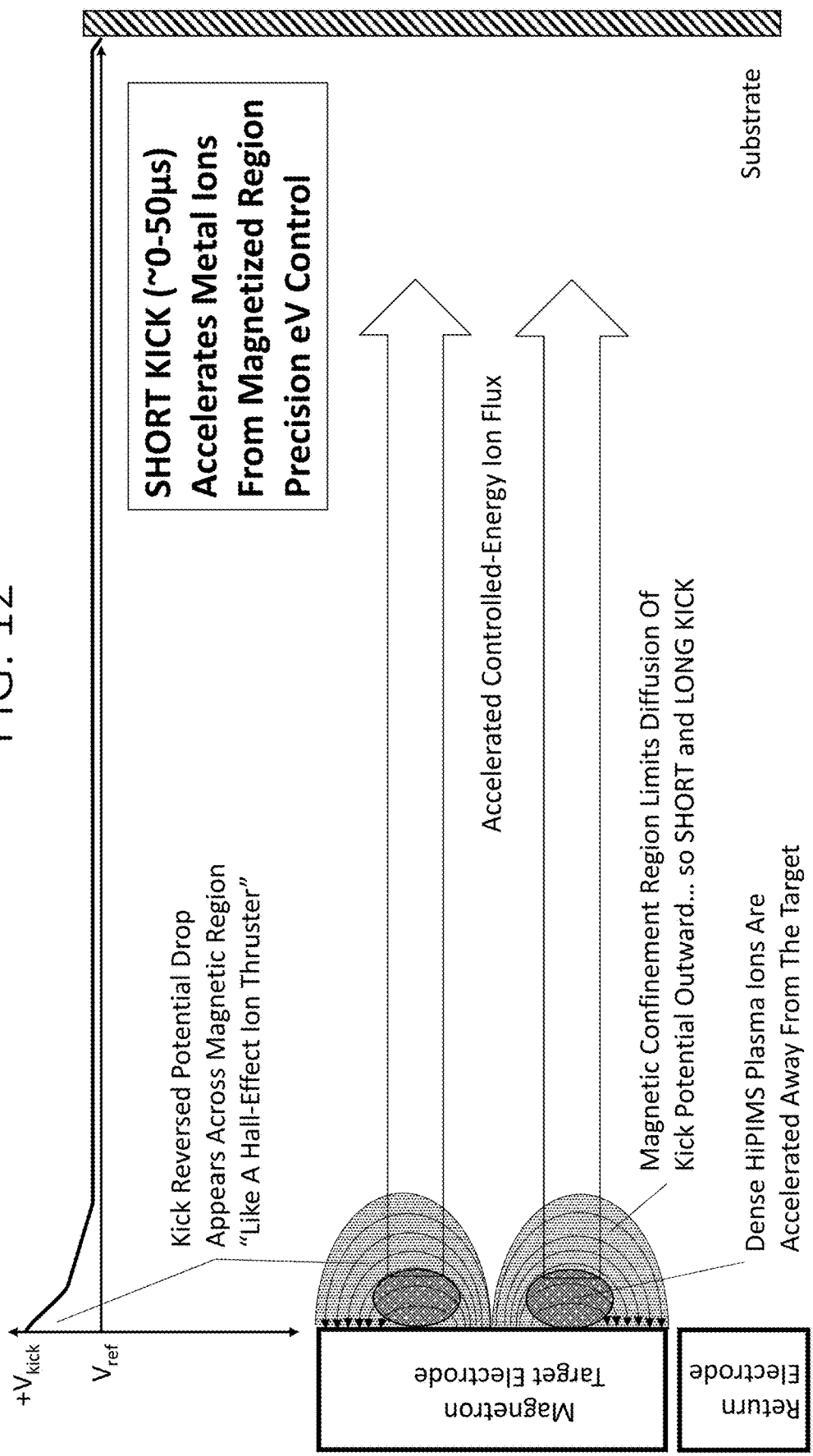
FIG. 12 depicts an illustration of the 2$^{nd}$ of 3 phases during IMPULSE operation—the Short Kick phase.

FIG. 12 depicts an illustration of the $2^{nd}$ of 3 phases during IMPULSE® operation—the Short Kick phase. FIG. 12 is adapted from US20180358213A1 and illustratively depicts an ultra-fast switching and positive voltage reversal on the target electrode to a positive voltage and the evolution of the potential distribution across the magnetic confinement region near the target electrode—the Short Kick accelerating ions from the dense HiPIMS plasma region away from the target electrode typically perpendicular to magnetic field lines.

Figure 13:
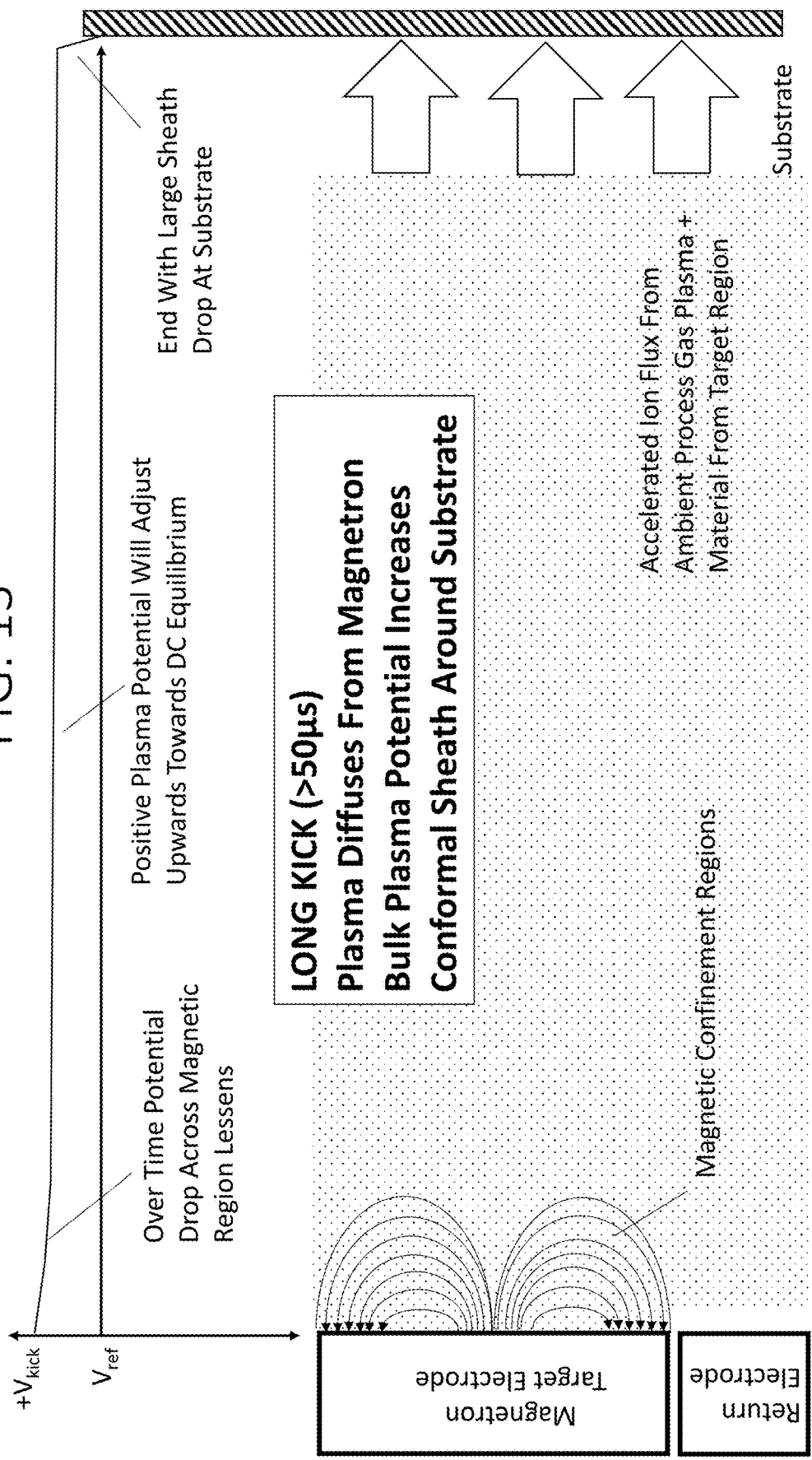
FIG. 13 depicts an illustration of the 3$^{rd}$ of 3 phases during IMPULSE operation—the Long Kick phase.

FIG. 13 depicts an illustration of the 3rd of 3 phases during IMPULSE® operation—the Long Kick phase. FIG. 13 is adapted from US20180358213A1 and illustratively depicts a positive potential evolution into the Long Kick phase where the plasma potential of the bulk is increased and conformal sheaths form on the substrate and other surfaces where the bulk plasma is commuted.

An aspect of the disclosure provided herein is the ability to control, during operation of the apparatus described herein, the flux and energy of ions deposited/impacted onto substrates for the preparation and deposition of thin-films with engineered properties. A high level of customization afforded with the combination of ultra-fast high-current pulsing with rapid positive voltage reversal with the cylindrical magnetron configuration enables superior and novel films, including advanced nanolayer composites and functionally-graded materials with specific attributes, including high-electrical gradient standoff, high-voltage tolerance, high-electrical conductivity, ultra-smooth surfaces, oxidation resistance, thermal fracture toughness, crack arresting features, diffusion barriers and anti-wear, anti-corrosion, ductile vs. stiffness, lubricious properties, etc. Specifically, the deposition of superconductor-insulator-superconductor layers with low bulk temperature highly sought after by superconducting wire, magnetic tape, RF cavity and accelerator engineers.

Figure 14:
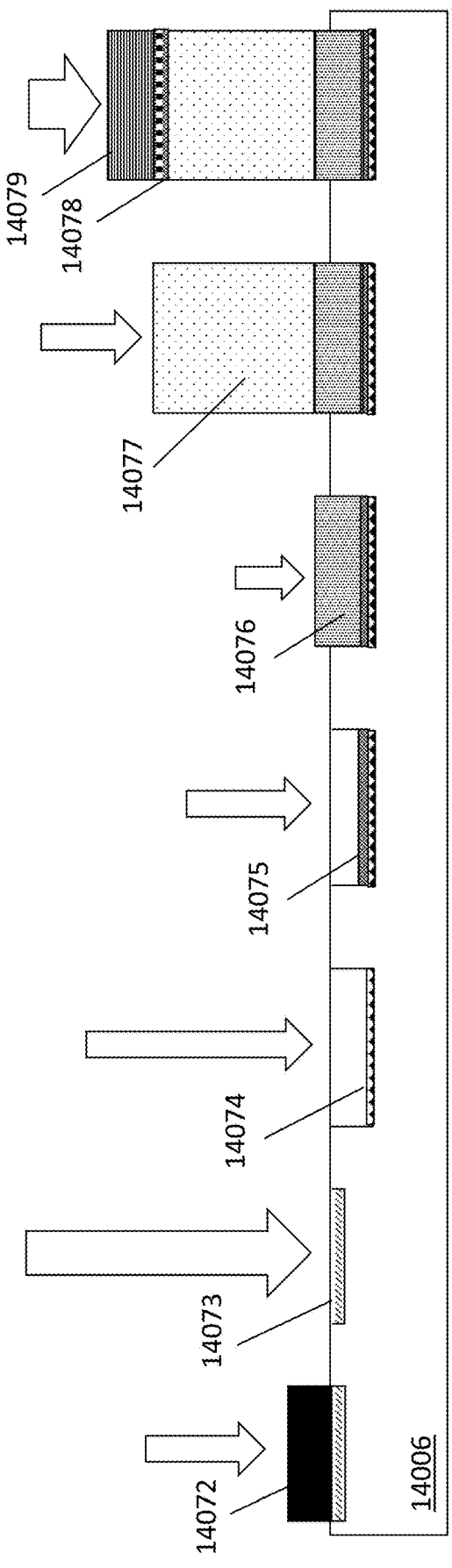
FIG. 14 depicts an illustration of a continuous process using the IMPULSE®+Positive Kick™+Super Kick™ without breaking vacuum, interruptions or staging.

FIG. 14 illustratively depicts a central advantage in terms of combining cleaning 14072, etching 14073, ion implantation 14074, adhesion control 14075, stress management 14076, bulk material deposition 14077, diffusion barriers or insulating layers 14078, and reactive/capping layer 14079 depositions. With precision ion energy control, the ultra-fast IMPULSE® with positive voltage reversal can remove surface contaminants, etch near-surface damage, develop a mixing interface for a good adhesion layer, to support stress-controlled layer(s)s that enables bulk films to be grown with suitable interface and capping layer(s). FIG. 14 depicts an illustration of a continuous process 14071 using the IMPULSE®+Positive Kick™+Super Kick™ without breaking vacuum, interruptions or staging.

Figure 15:
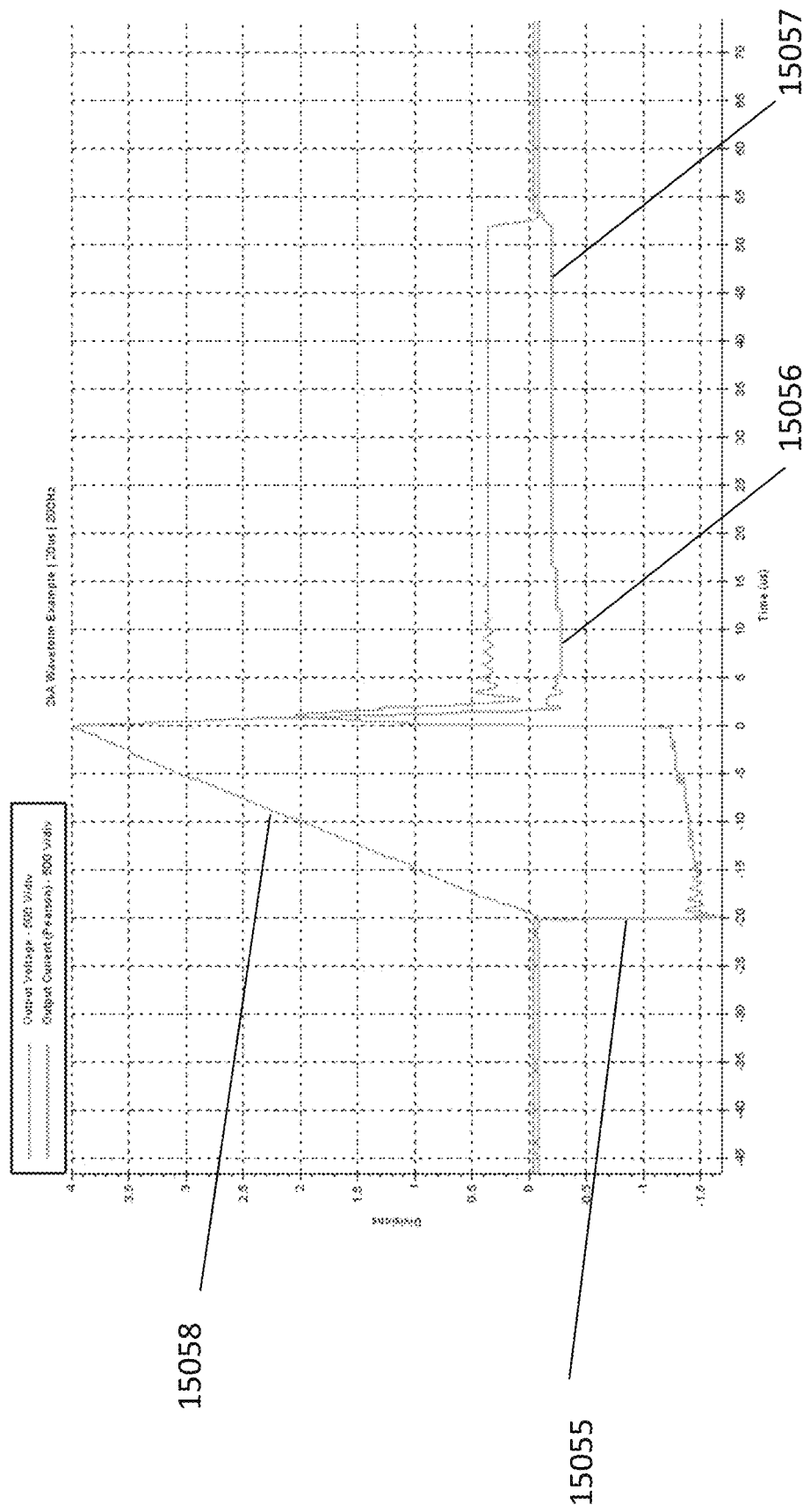
FIG. 15 is an oscilloscope waveform of a Cu sputtering plasma achieving 2 kA peak current in 20 microseconds during the Ultra-Fast HiPIMS phase with subsequent +200V positive pulse showing Short and Long Kick phases.

FIG. 15 is an oscilloscope waveform of a Cu sputtering plasma achieving 2 kA peak current in 20 microseconds during the Ultra-Fast HiPIMS phase with subsequent +200V positive pulse showing Short and Long Kick phases. The voltage waveform 15055 and a current waveform 15058 for a −750V, 2 kA peak current HiPIMS pulse achieving a plasma current density of 5 A/cm2 on the cylindrical magnetron with a copper sputtering target with a positive kick pulse of +200V, 125 A peak current highlighting a short kick 15056 and a long kick 15057. The IMPULSE® technology described herein drives plasma generation at high dI/dt to achieve rapid ionization for subsequent voltage reversal and Positive Kick™ to accelerate ions and plasma into substrates for superior cleaning, etching, preferred-orientation deposition and deposition with stress and morphology control. The technology also allows for synchronization with pulsed DC bias supplies for time windowed acceleration into the substrate for additional control as taught in US20180358213A1.

Depending on local factors such as pre-ionization, target material, magnetic field, pressure, geometric curvature, sputtering gas, surface chemistry, adsorbed gases, etc, the main negative pulses on the voltage waveform 15055 are typically in the range of −400V to −1200V. Using the ultra-fast switching topology typical high-current pulse widths are less than 100 usec, with a typical range of 20-50 usec. The Positive Kick™ amplitude on the voltage waveform 15055 are typically in the range of +0-600V. For users who do not want the short kick ion population group to be accelerated away from the sputter target, shown in the current waveform for the short kick 15056, the onset delay in the positive kick would be set to after this time period typically set at 20-40 usec. The ionization rate and plasma density near the sputtering target is highly coupled with the effective current density. Effective current densities are in the range of 0.1-10 A/cm2.

Figure 16:
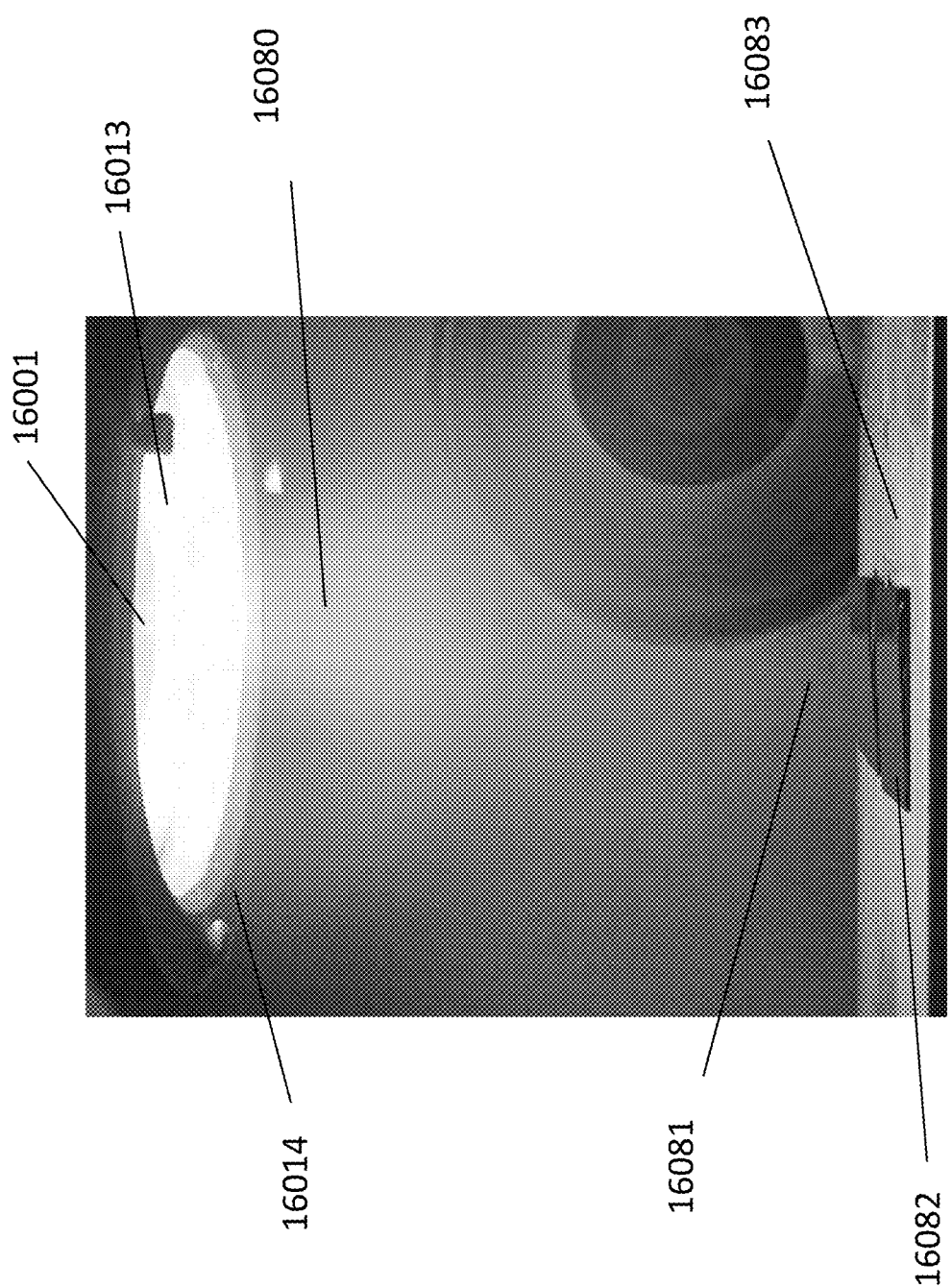
FIG. 16 is a photograph of an embodiment highlighting deposition and etching using the Positive Kick™ and Super Kick™.

FIG. 16 is a photograph of a conventional planar magnetron operating with ultra-fast short main pulse for deposition and subsequent RF-like modulation of the Positive Kick™ pulse to generate and sustain a secondary plasma with positive potential relative to the substrate for etching. Each pulse cycle would be a combination of deposition and etching—in the case with a copper sputtering target to achieve preferred orientation copper deposition such as Cu(211) vs. Cu(111) vs. Cu(100). The etching parameters are adjusted for preferred orientation and epitaxial growth conditions. A sputter target 16001 is processing both a negative main pulse and an RF-modulated positive pulse. The dense plasma region 16013 over the racetrack is brilliant white-green from the Cu I and Cu II optical emission lines. A central plasma region 16080 excited by the RF-modulation of the positive voltage is colored pink from Ar I and Ar II excitation. The central plasma region 16080 extends all the way down to an insulating substrates 16082 exhibiting combination for deposition and etching a surface 16083. A conformal plasma sheath 16081 extends down to the insulated substrates 16082. Using the combination for deposition and etching preferred orientation films can be deposited.

Figure 17B:
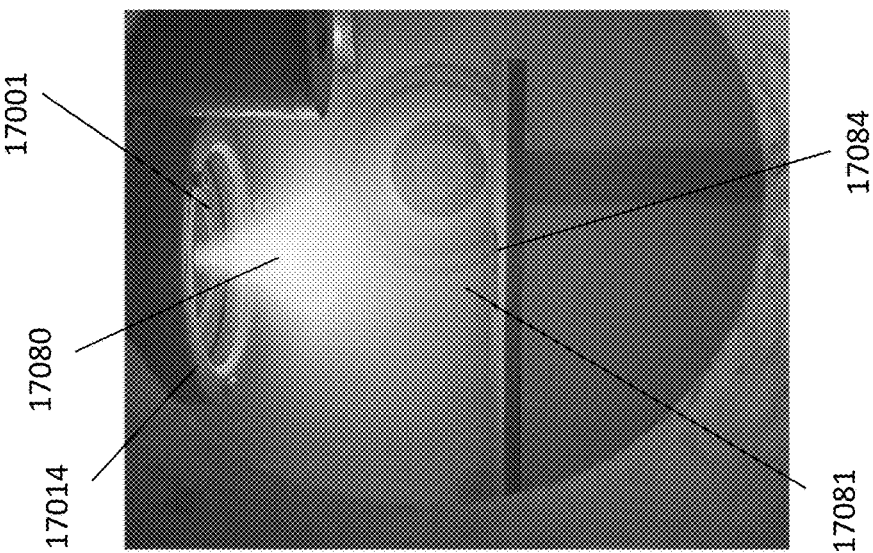
FIG. 17B is a photograph of the Super Kick™ in etching mode for plasma generation.
Figure 17A:
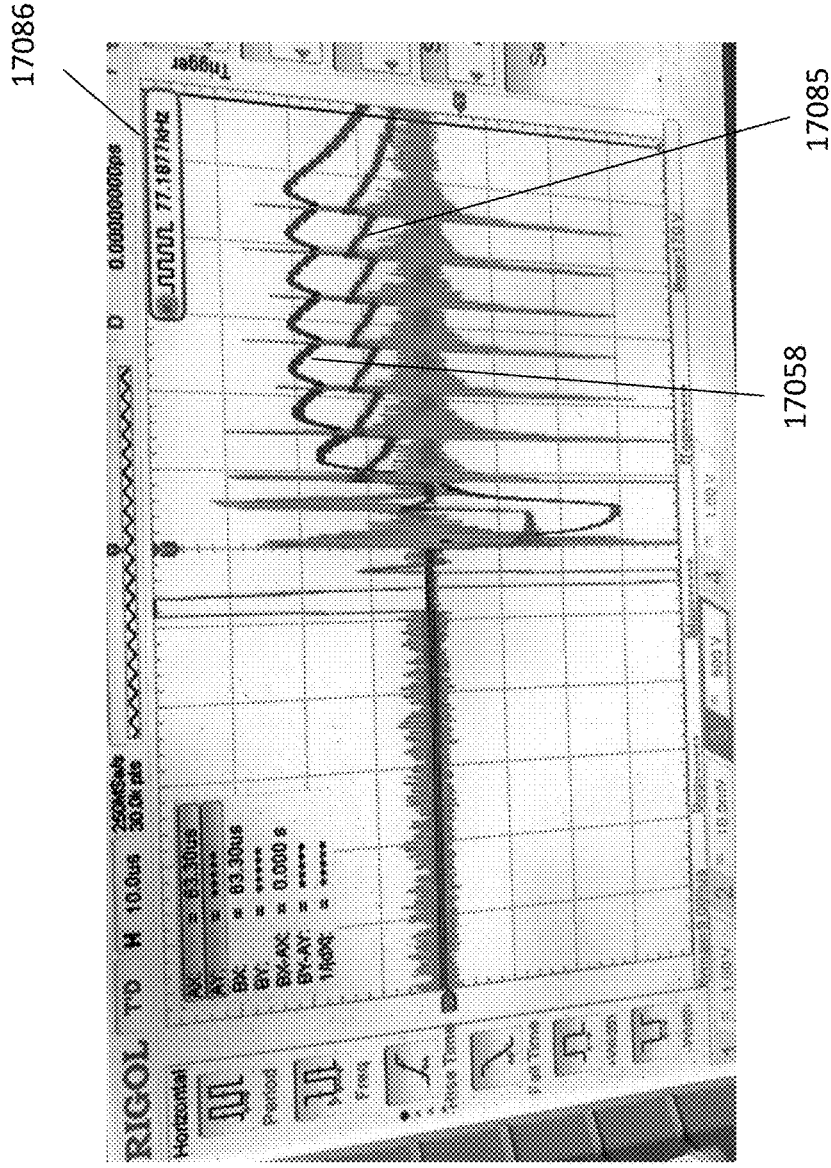
FIG. 17A is an oscilloscope trace illustrating the ~10-100 kHz RF-like modulation of the positive pulse to generate plasma with a positive RF bias.

FIG. 17A is an oscilloscope trace illustrating the ~10-100 kHz RF-like modulation (such as frequency and/or amplitude) of the positive pulse to generate plasma with a positive RF bias. FIGS. 17A and 17B are photographs highlighting the Super Kick™ mode for extended plasma generation away from the magnetic field and etching on substrates with a sample oscilloscope waveform 17086 (FIG. 17A) showing 77 kHz operation, current waveforms 17058 for the RF-like oscillation and voltage waveforms of an RF-like voltage application 17085. The photograph in FIG. 17B shows a bare target electrode 17001 without the bright visible emission from the racetrack region. The absence of any dense plasma region shows there is no sputtering of the target occurring. A bright central plasma region 17080 follows the magnetic nozzle/cusp expansion into the target electrode and is a commuted to a target electrode 17001 at elevated positive potential. The resulting etching plasma extends down to a substrate 17084 with a visible plasma sheath 17081 conforming on the samples. The Super Kick™ mode can be indefinitely sustained under a range of operational conditions for direct etching. The Super Kick™ can also be used in conjunction with a negative DC bias on the substrate for additional flexibility in materials processing.

Figure 18:
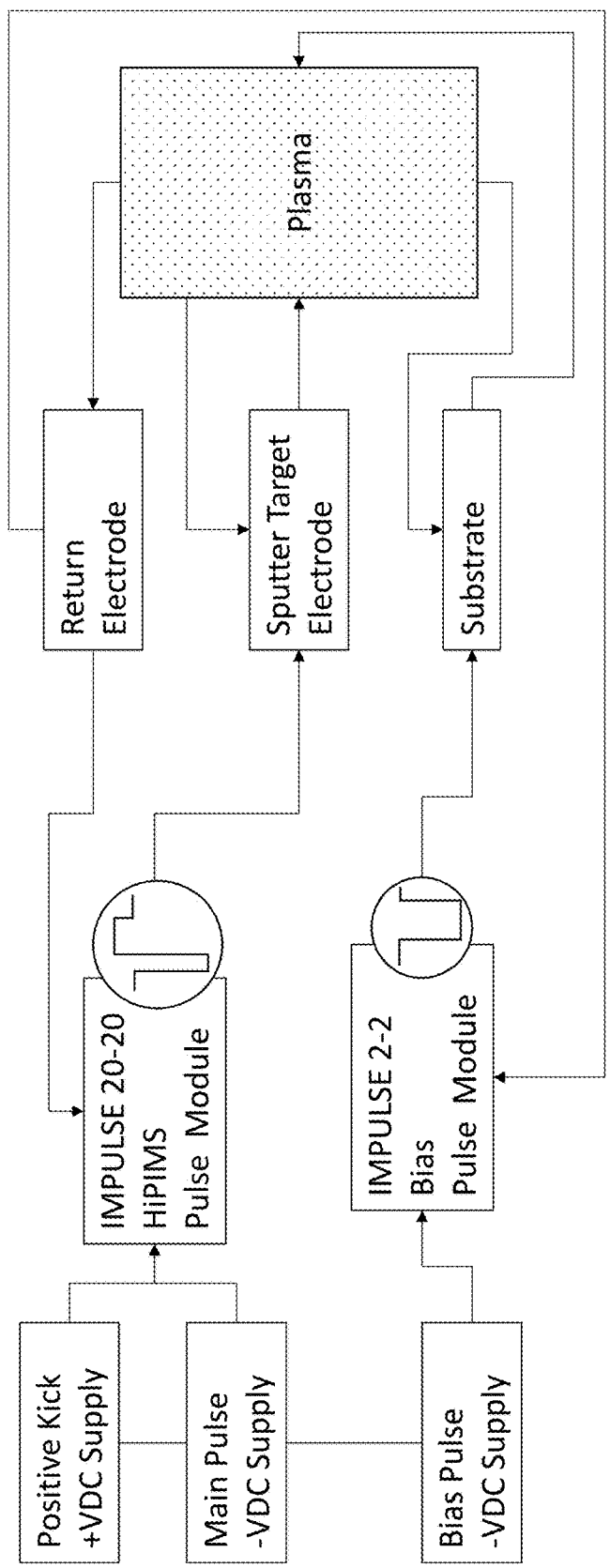
FIG. 18 depicts a schematic representation of the thin-film deposition, etch and surface modification system with IMPULSE® pulse modules and power supplies.

FIG. 18 depicts a schematic representation of the thin-film deposition, etch and surface modification system with IMPULSE® pulse modules and power supplies. FIG. 18 is a schematic a block diagram showing an illustrative example of an electrical component/circuitry arrangement between a sputter target electrode, a return electrode, a substrate, a plasma in a vacuum environment and one or more IMPULSE® HiPIMS pulse module(s) (its main and kick supplies) and any IMPULSE® bias pulse module supplies. The schematic block diagram in FIG. 18 outlines a generic setup of IMPULSE® systems for deposition and etching. High voltage electrical pulses are provided from the external pulsed power modules directly to the sputter target through appropriate insulation and low-impedance connections. By rotating the magnetic assemblies, this allows for low-impedance electrical connections to the sputter target holder for efficient power transfer and coupling. The IMPULSE® modules are designed for parallel synchronous and asynchronous operation. Therefore, multiple units can pulse in parallel to delivery needed power, risetime and plasma density for a sputtering target electrode configuration.

Figure 19:
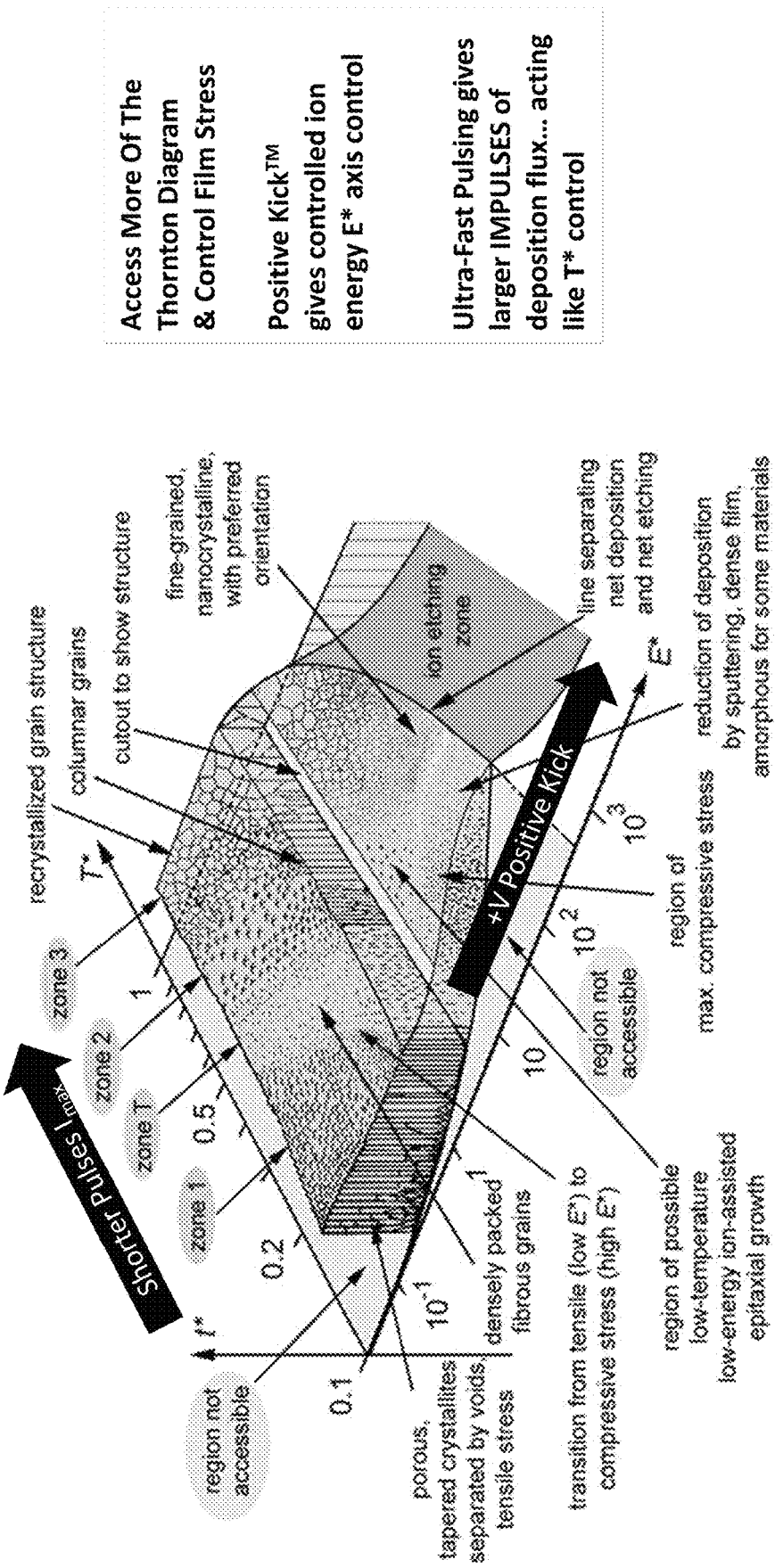
FIG. 19 is an illustration of the structure zone diagram with two independent axes for effective temperature T* and effective sputter particle energy E* that are addressable with the IMPULSE® and Positive Kick™.

FIG. 19 illustratively depicts an example structure zone diagram with two independent axes for effective temperature (T*) and effective sputter particle energy (E*) that are addressable with the IMPULSE® and Positive Kick™. FIG. 19 expands on the control of thin-film microstructure and morphology via illustration of the Andre Anders' modified Thornton Structure Zone Diagram for generalized energetic condensation. Adjustment of the HiPIMS pulse amplitude, pulse width, timing, peak current density, repetition rate and pressure for a given substrate-to-sputter target distance, magnetic field geometry and field distribution, allows control over the main pulse particle flux (T*) which is approximate as a thermal spike. More intense short pulses with higher particle loading over shorter periods has a high temperature effect allowing the deposited material to equilibrate and adjust towards fibrous transitional grains (zone T), columnar grains (zone 2) and recrystallized grain structure (zone 3). Adjustment of the positive kick pulse amplitude, short/long kick pulse, onset delay and any super kick effect for RF-like oscillations for a given magnetic field, cusp magnetic null geometry, pressure and available plasma resulting from the main IMPULSE® HiPIMS pulse will allow adjustment of the effective energy (E*) and adjustment of the thin-film microstructure and morphology. Essentially controlling the IMPULSE® and the positive kick allows movement all over the Anders/Thornton SZD, even achieving fine-grained nanocrystalline films with preferred orientation and region of low-temperature low-energy ion-assisted epitaxial growth and dense, amorphous glassy films. The process engineer can move around the SZD to achieve tensile/compressive stress control, columnar growth vs. nanocrystalline with preferred orientation, etc.

Figure 20B:
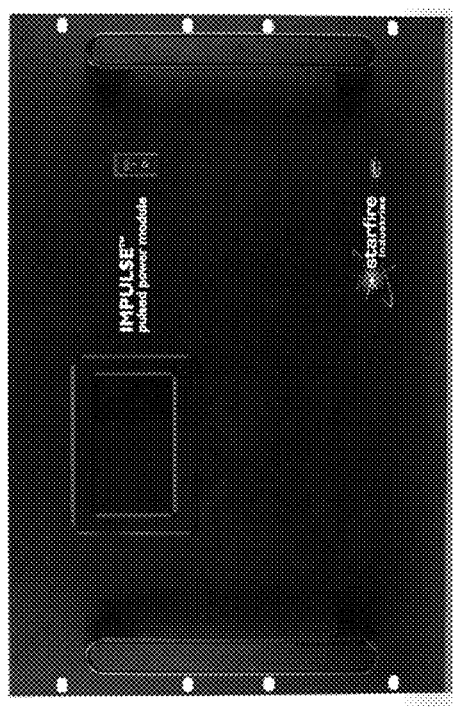
FIG. 20B is a photograph of the IMPULSE® 20-20 system.
Figure 20A:
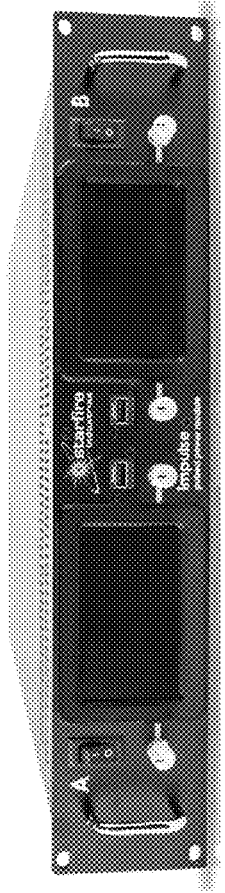
FIG. 20A is a photograph of the IMPULSE® 2-2 system.

FIG. 20A and FIG. 20B are photographs of an IMPULSE® 2-2 system and an IMPULSE® 20-20 system used as a power supply in the systems described herein in implementations of the present disclosure.

FIG. 21A is an example of a bellows structure having a surface treated/formed using a prior art approach for electroplating stainless-steel cryogenic bellows for RF accelerators. In the image provided in FIG. 21A, the variable quality of the copper plating may be observed with an inability to deposit plate material on the sidewalls of the vacuum bellows section due to masking and nickel strike layer difficulties. Prior art method may be replaced, with beneficial results of better surface treating/plating by use of the deposition/sputtering operations of the present disclosure.

FIG. 21B illustratively depicts a prior art arrangement for a superconducting RF accelerator section comprising multiple spools, bellows and RF cavities needing specific material properties. The present disclosure addresses multiple sections with wide application.

FIG. 21C illustratively depicts performance properties of a prior art showing RF power loss and thermal dissipation due to poor electrical conductivity with electroplated copper. The thickness of the film determines both magnitude of RF losses and ability of the structure to conduct that deposited thermal energy outward. This is important for not only accelerator cavities but also bellows sections, transfer tubes and other beam structures.

Trapped RF modes are a source of heating that exist in accelerator structures such as bellows. For superconducting accelerator cryomodules that are kept at liquid He temperatures, any thermal energy deposited here will be removed solely via conduction along the bellows surface to its edges. To minimize heating, as close to pure (e.g. high RRR) copper films having a thickness of >10 µm is highly desirable for these applications. Starfire's IMPULSE®+Positive Kick™ technology addresses this by enabling stress control in the deposited films. This allows the process engineer to deposit films having little to no internal stress, which is critical for thick, large-area films.

The present disclosure allows very thick, stress-controlled, fully-dense, high-conductivity, well adhered coatings to address this challenge, as shown in FIG. 8B. Low-temperature deposition using the Positive Kick and IMPUSLE allows a higher effective T* and E* to get the right orientation without high bulk temperature that results in interdiffusion of the layers. Added knob of kick voltage/duration is meaningful. Changes T* on the Thornton zone diagram without requiring direct heating of the substrate. Low actual substrate temp prevents diffusion in nanolayered materials (e.g. SIS structures). Adjustable surface mobility good for low defects are critical for SC films.

Figure 22B:
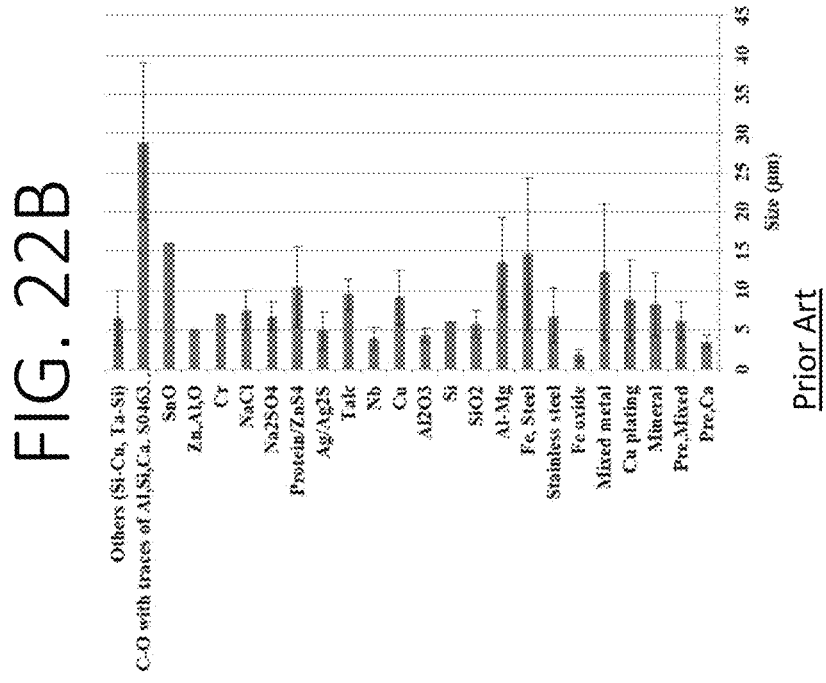
FIG. 22B is the prior art showing inclusions in electroplated copper by size and material impurity.
Figure 22A:
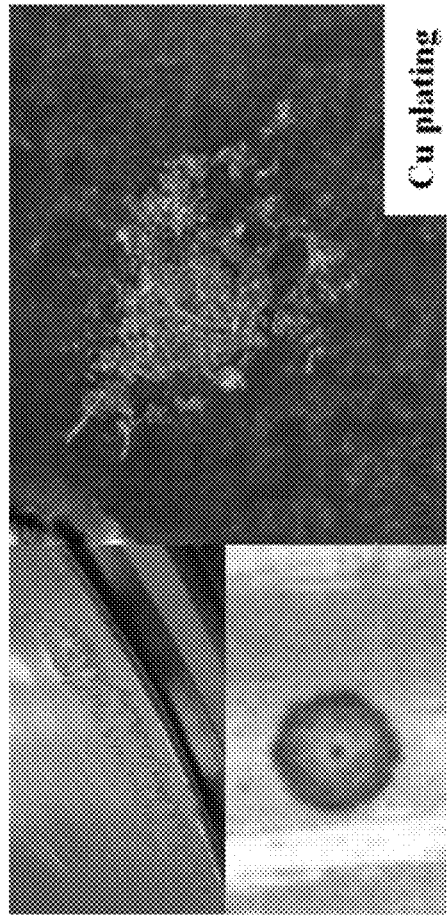
FIG. 22A is the prior art showing surface defects, corrosion, trapped material, inclusions and surface asperities in conventional copper electroplating leading to poor accelerator performance.

FIG. 22A is a photograph collection for a surface treated according to the prior art showing surface defects, corrosion, trapped material, inclusions and surface asperities in conventional copper electroplating leading to poor accelerator performance. The IMPULSE®+Positive Kick™ and Super Kick™ modes controls net deposition, etching, or doing both for smoothing/roughness-fill. Releveling a surface is beneficial to high-gradient (i.e. spark-resistant or spark-tolerant) accelerator films. The initial spark resistance is in smoothness, but that the overall tolerance comes more from a lack of inclusions that are provided by depositing a controlled film in an atom-by-atom process vs. bulk casting and machining. After a first arc, the local surface is no longer smooth. Therefore, the film impurities/defects/inclusions determine performance of a treated surface.

FIG. 22B is an illustrative summary of performance of surfaces treated according to the prior art. The summary shows the presence of inclusions in electroplated copper by size and material impurity. The surface treatment and formation operations and structures described herein according to the present disclosure enable controlled deposition of materials on an atom-by-atom basis, greatly limiting inclusion size and composition to suppress local field enhancements and multipactoring and sparking.

The proposed illustrative examples using conformal ionized physical vapor deposition replaces wet chemical electroplating (e.g. Cu) for stainless-steel bellows and specialty vacuum components used on accelerator structures. Wet chemical electroplating is being progressively phased out due to its damaging environmental impact, hazardous chemical handling, high cost, and lack of experienced tradespeople in the field. In the EU there are proposals and timelines for the complete phase out of all electroplating in the coming years, making investment in alternative technologies important. There are known issues with surface finish/roughness (including macroscopically visible striations in the plating), inclusions, particulates from both the copper plating itself, as well as those potentially introduced during the electroplating or subsequent surface smoothing steps (e.g. Mo-wool polishing or bead blasting).

Figure 23C:
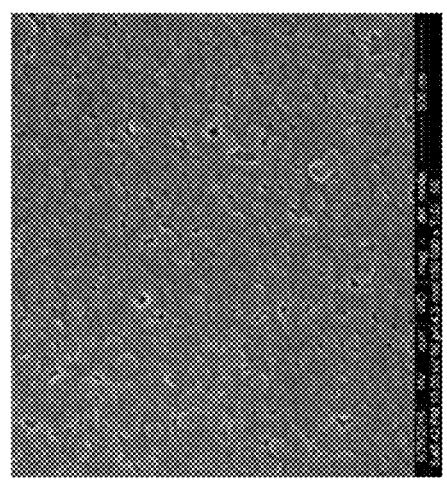
FIG. 23C is a scanning electron micrograph of a diamond-like carbon layer deposited with conventional DC magnetron sputtering highlighting its porosity and voids.
Figure 23B:
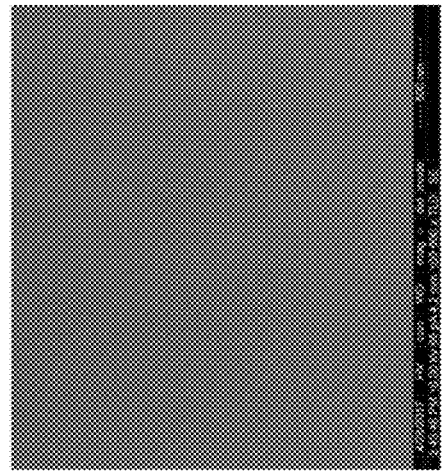
FIG. 23B is a scanning electron micrograph of a diamond-like carbon layer deposited with the IMPULSE®+Positive Kick™ technique.
Figure 23A:
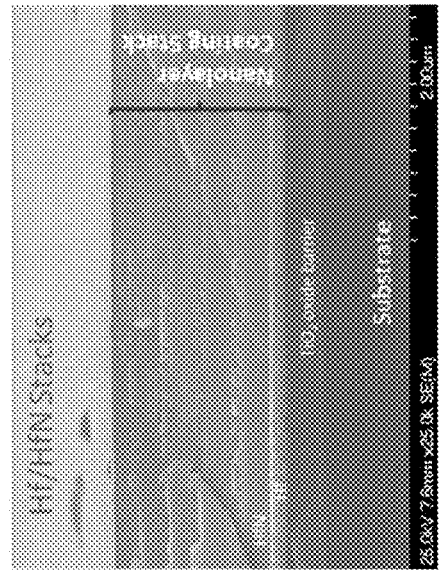
FIG. 23A is a photograph of a representative multilayer metal-insulator-metal stack deposited on a substrate with a barrier interface using the IMPULSE®+Positive Kick™ demonstrating surface smoothness and ability to control layer properties.

FIG. 23A is a photograph of a representative multilayer metal-insulator-metal stack deposited on a substrate with a barrier interface using the IMPULSE®+Positive Kick™ demonstrating surface smoothness and ability to control layer properties. FIG. 23B is a scanning electron micrograph of a diamond-like carbon layer deposited with the IMPULSE®+Positive Kick™ technique. FIG. 23C is a scanning electron micrograph of a diamond-like carbon layer deposited with conventional DC magnetron sputtering highlighting its porosity and voids. The microstructure and morphology of the thin-film coatings can be controlled using the IMPULSE®+Positive Kick™ as described in U.S. application Ser. No. 16/801,002, filed Feb. 25, 2020, and entitled "METHOD AND APPARATUS FOR METAL AND CERAMIC NANOLAYERING FOR ACCIDENT TOLERANT NUCLEAR FUEL, PARTICLE ACCELERATORS & AEROSPACE LEADING EDGES." Production of nanocrystalline or preferred orientation films near the surface can minimize surface asperities, whisker growth and slip-plane protraction growth kinetics that are partially responsible for electric-field concentration, multiplication and the formation of sparks/arcs.

On important aspect for the application of the Positive Kick™ for conformal depositions is the Long Kick and ability to bring dense plasma and local sheath potential drop around the substrate to be coated, as shown in FIG. 8A. If the target plasma area is small compared to the vacuum chamber and the chamber is located proximal to the sputter target, then a large fraction of the Positive Kick™ energy flow will be to the chamber vs. the substrate. FIG. 24A depicts a theoretical snapshot of a plasma potential spatial profile for the representative Long Kick case where a vacuum chamber dominates in surface area over both the substrate and the smaller sputtering target, and the distance between the target and substrate is many mean-free paths—very little potential drop reaches the substrate for local conformality.

FIG. 24B depicts a corresponding snapshot of the plasma potential spatial profile for the representative Long Kick case where the substrate is much larger in surface area than the sputtering target and vacuum chamber components are negligible, and the distance between the target and substrate is many mean free paths—a small potential drop reaches substrate for local conformality. A better condition is illustratively depicted in FIG. 24C that shows a plasma potential spatial profile for the representative Long Kick case where the sputtering target is on the same order as the substrate area to be treated/coated with a material from the sputtering target, the vacuum chamber components are negligible, and a distance between the target and substrate is small—nearly all of the potential drop appears on the substrate for excellent conformality of plasma bombardment.

Figure 25B:
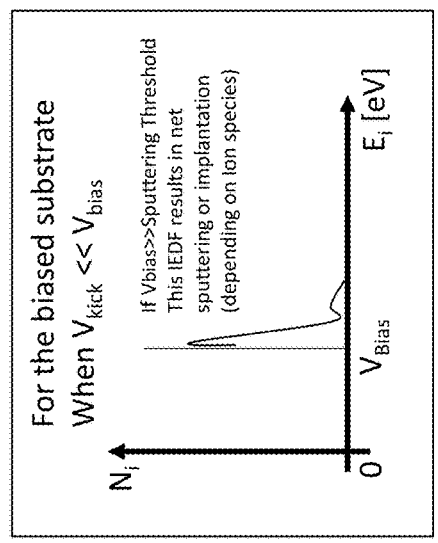
FIG. 25B depicts an illustration of a case where an additional active bias voltage is applied to the substrate for additional ion bombardment energy.
Figure 25A:
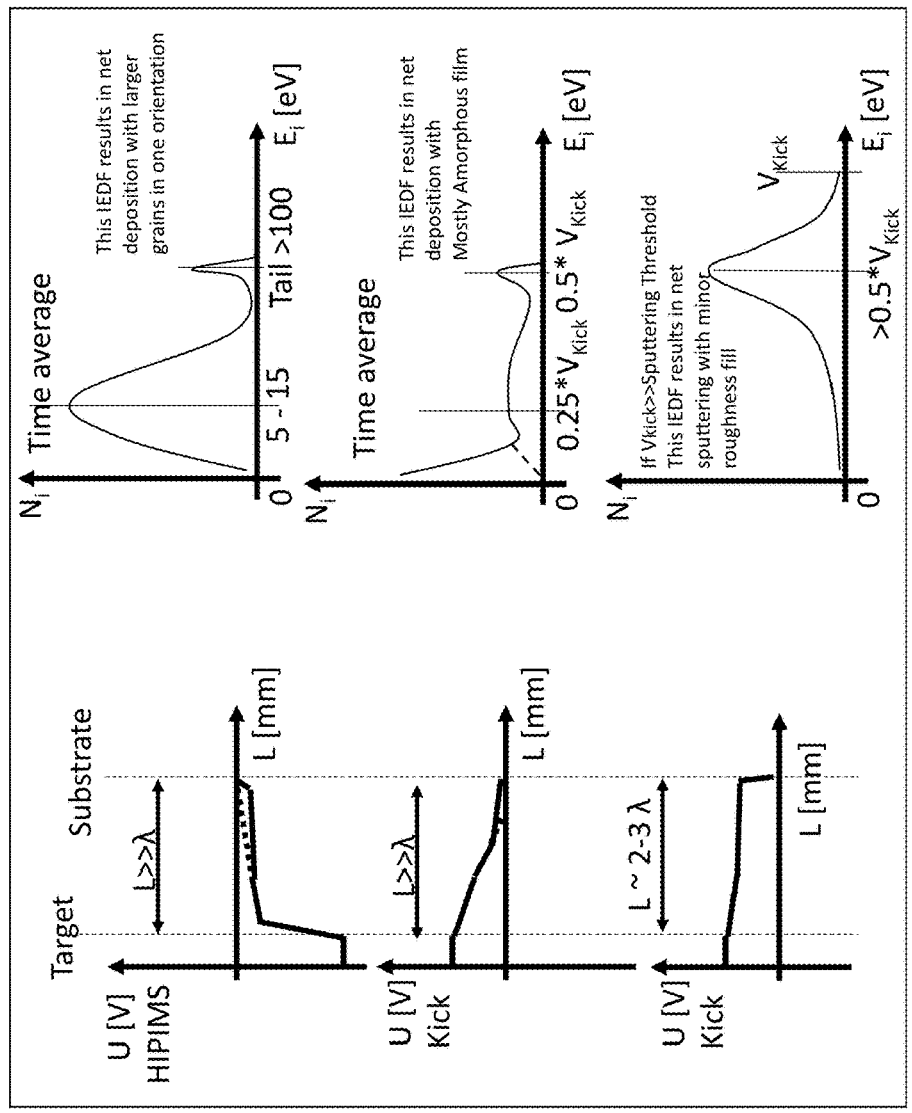
FIG. 25A depicts an illustration of the cases represented in FIG. 24A-C for potential profiles with their corresponding ion energy distribution functions.

FIG. 25A illustratively depicts cases represented in FIG. 24A-C for potential profiles with their corresponding ion energy distribution functions for the Long Kick. Not shown are the ion contributions for the Short Kick and acceleration away from the dense magnetic region. These illustrations highlight the normal, abnormal and obstructed glow discharge regimes encountered during the Long Kick phases. FIG. 25B depicts an illustration of a case where an additional active bias voltage is applied to the substrate for additional ion bombardment energy.

Because of the high-quality thin and thick films that can be conformally deposited on composite material surfaces from the IMPULSE® techniques, it is possible to separate an often difficult and physically challenging process of RFQ vane tip alignment from fabricating the sealed RFQ cavity structure. As shown in the illustrative prior art depicted in FIG. 5C, the conventional approach to assembling the RF LINAC structures is to fabricate whole 3D section cavities, such as the major-minor vane construction, for assembly. Very precise and complicated construction procedures and machinery are often required, such as a 5 or 6 axis CNC milling machine. Vane sections can be bonded to the RF cavity and thereafter conformally coated in accordance with the present disclosure. This staged approach to fabricating RF LINACs permits less expensive fabrication techniques and smaller sized components to be used.

Figure 26:
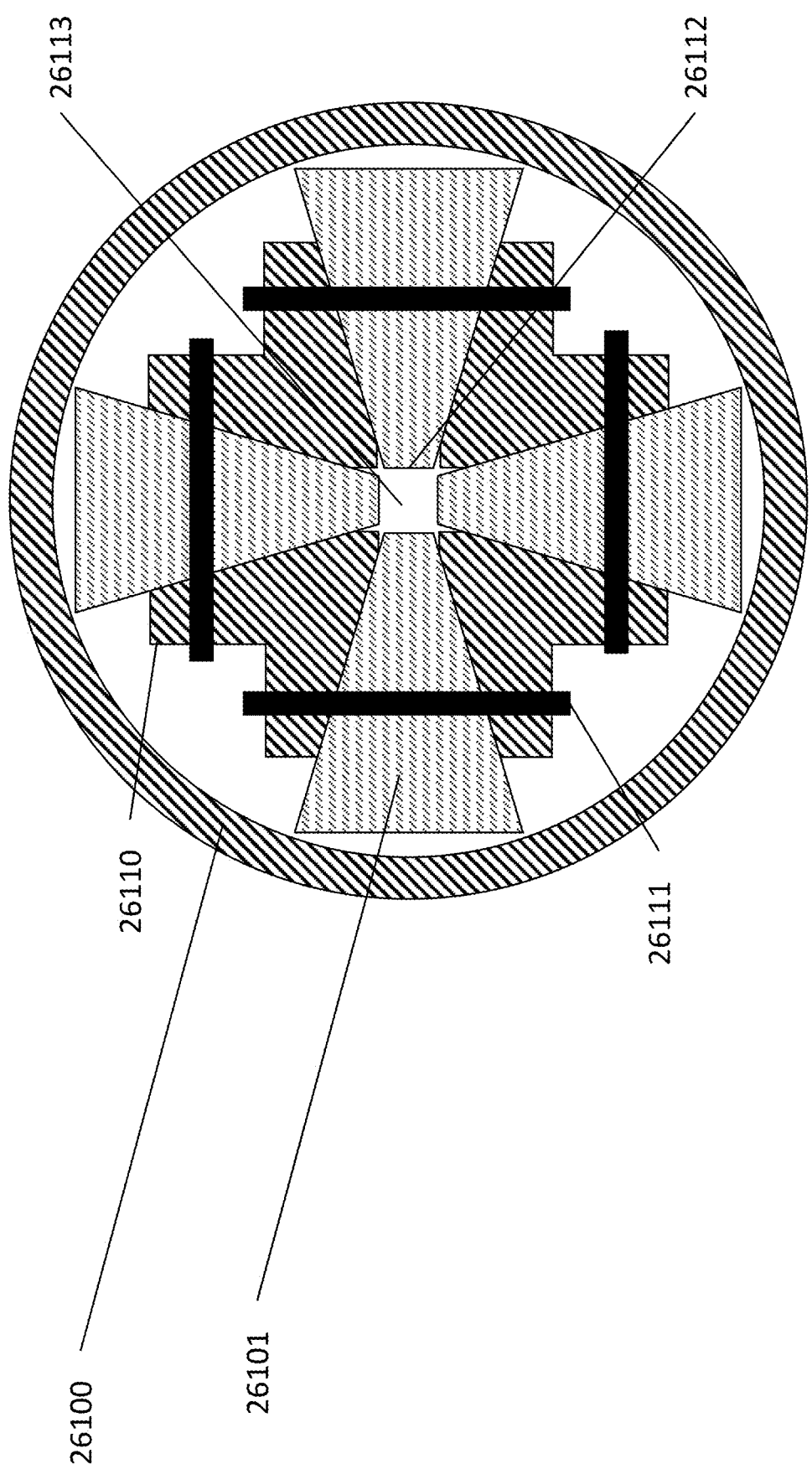
FIG. 26 depicts an illustration for a precision fixturing jig to align and gap RFQ LINAC vanes.

FIG. 26 illustratively depicts an example of a precision fixturing jig that facilitates aligning and gapping RFQ LINAC vanes. The particle beam channel 26113 is defined by a relative placement of the accelerator vane tips such as a vane tip 26112 that are placed around the center point in the cross-section view provided in FIG. 26. Each of the four vanes, including, for example a vane 26101 are aligned and gapped by a precision jig 26110 and affixed with ones of mechanical supports such as a mechanical support 26111. Vertical, horizontal, angular, vane undulation, intra-vane capacitance, vane tip spacing, and other properties can be measured and controlled, by removable fasteners or other mechanical means such as pins, turnbuckles, shims and spacers, with access to the vanes without the rest of the RF cavity structure introducing additional degrees of freedom and sources of error. The precision alignment jig 26110 additionally includes, for example, measurement slots and ports for conducting diagnostics and inserting probes (e.g., optical, vibrational, acoustic, electro-magnetic, capacitive bead, hairpin probes, etc). The precision alignment jig 26110 can be fabricated of materials that differ from the underlying vane 26101 materials. Depending on the bonding method and the processing conditions used to join vanes 26101 with the rest of the RF cavity body 26100, the precision alignment jig 26110 material may be selected for CTE properties, stiffness, etc. to maintain alignment and gap spacing of the vane tips 26112 during the bonding to the RF cavity 26100.

Performance of an RF accelerator greatly depends on electrical properties of the RF accelerator cavity. The electrical properties are influenced by skin-depth effects, surface roughness, grain size and boundaries, microfissures, electron transport and scattering effects off defects and inclusion, local permittivity, permeability and field diffusion, etc. These properties can be modified by the IMPULSE®+ Positive Kick™ and Super Kick™ techniques to improve the intrinsic electrical properties. Extrinsic properties are influenced by changes cavity shape and vane tip position and alignment, affecting frequency, eigenmodes, dipole or higher-order modes, etc. Combined with macroscopic shape, variations is shape, interferences, frequency, temperature, expansion effects, and thermal dissipation characteristics, surface roughness, and the ability to maintain and its electrical properties. FIG. 27A, described next, illustratively depicts an illustration of the interface losses for adjoining RF surfaces and structures.

FIG. 27A depicts a cross-section view of an electrical component to illustratively depict surface current pathlength, interface losses and multipactoring stress for adjoining RF surfaces and structures for conventionally processed materials that result in relatively uneven outer conductive surfaces. Conventional room-temperature RF LINACs use electropolished copper coatings or are machined out of a solid block of copper to obtain required/desired surface material properties. Wet chemistry techniques for electropolishing and leveling vary based on conformal anode material construction, water flow, temperatures, orientation of etching/plating system, processing length, solution buffering and complex polarity kinetics with high-current bath power supplies. Even with these techniques, conventional wet chemistry typically achieves surface roughness values exceeding the skin-depth for higher frequency microwave drivers, e.g. >500 MHz. As a result, the skin-depth current flow 26130 travels very close to the surface. Because the skin-depth current flow 26130 is carried near the surface within a few skin depths, the effective current pathlength is significantly more than the perimeter of the RF cavity. This additional pathlength increases the effective resistance of the RF cavity placing an upper limit on cavity Q. Interfaces between different assemblies and materials become more problematic for localized electric field and potential differences.

In the FIG. 27A example, an undercut (gap) between tan RF cavity sidewall 26100 and a vane 26101 adds additional pathlength (the distance added by the path entering into and exiting the undercut (gap). Moreover, a potential difference will appear across the junction leading to multipactoring electron emission site risk.

Figure 27B:
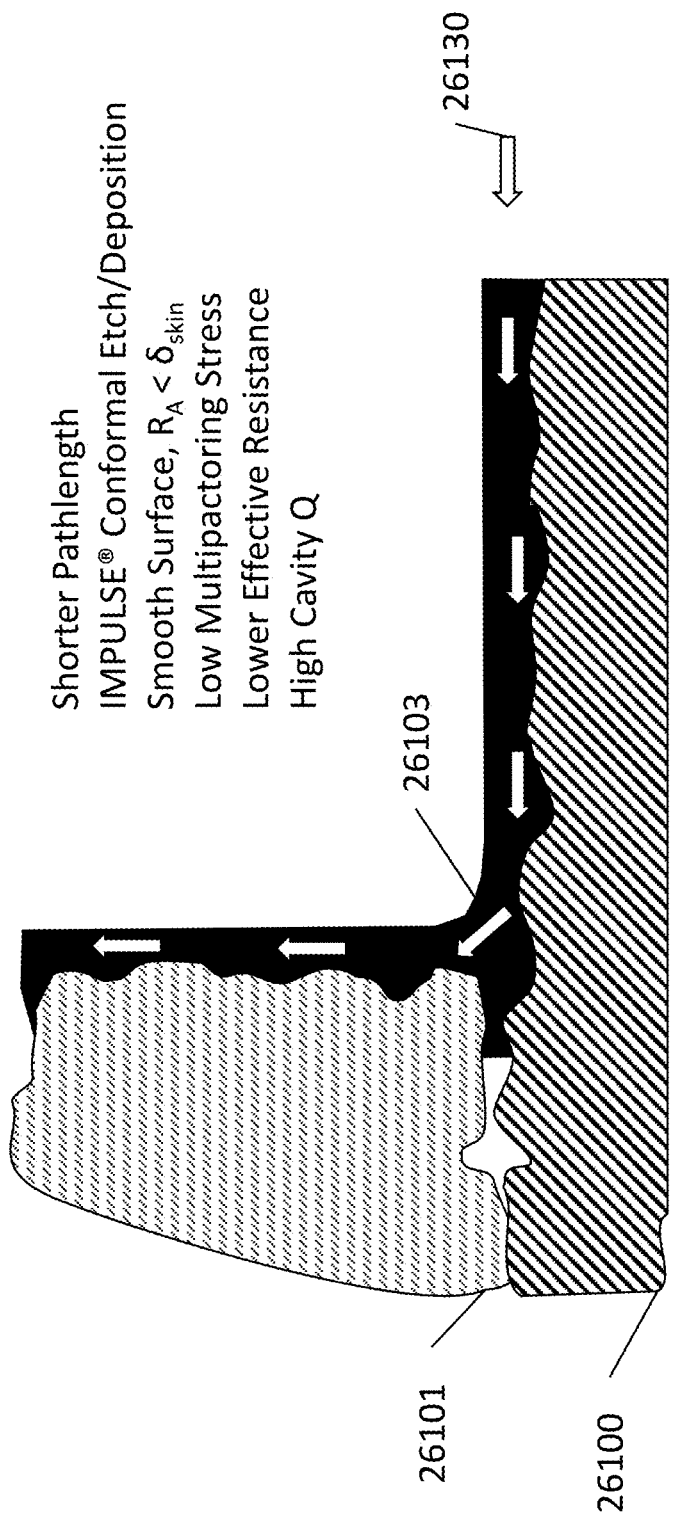
FIG. 27B depicts an illustration of a surface current pathlength, interface losses and multipactoring stress for adjoining RF surfaces and structures processed with the IMPULSE®+Positive Kick™ and Super Kick™ techniques.

FIG. 27B illustratively depicts the surface current pathlength, interface losses and multipactoring stress for adjoining RF surfaces and structures arising from RF accelerator cavity surface treatments using the IMPULSE®+Positive Kick™ and Super Kick™ techniques. The surface cleaning and etching process provide leveling effect for hills and allow for resputter to fill the valleys. The deposition processes allow for implantation/intermixing for boundary adhesion and strength for the resulting continuous conducting surface 26103 that can be deposited, by sputtering/deposition using the sealing surface material deposition procedures described herein, to the desired thickness by control of the film stress, nanostructure and orientation. By adjusting the Positive Kick™ values for optimal adatom mobility, ultrasmooth surfaces can be deposited with the IMPULSE® with average roughness less than the skin depth. The resulting ultra-smooth surface pathlength approaches an ideal geometrical case for lower effective resistance. Furthermore, the microfissures and surface interfaces are coated and covered with the continuous film 26103, thus minimizing multipactoring site risk. The continuous film 26103 is selected from a variety of source/sputter target materials according to the desired conductivity of the resulting cavity surface, including superconducting materials. The resulting continuous film 26103 increases the cavity Q to support higher accelerating gradients and/or reduce power consumption.

FIG. 27C illustratively depicts an axial position along a cavity with regions of poor electrical contact due to macroscopic effects such as bending stress, thermal expansion, material mismatch and poor mechanical RF seals at interfaces. For RF LINACs constructed with sections or segments, mechanical fasteners 26114 are used to attach and compress the interfaces. Often RF compression seals are used to make hard metal-to-metal contact, to thereby minimize electrical impedance. Unfortunately, macroscopic discontinuities 26115 form that lead to uneven current flow in the RF cavity, lower Q performance and variability over operation of the accelerator for operating parameters. Desirably, the interface between the RF cavity 26100 and the vane 26101 are continuously fixtured along the entire length of the accelerator cavity structure. This is typically accomplished using high-temperature brazing. Unfortunately, the braze material conductivity is lower than the conductivity of bulk alloys. Moreover, the thermal cycling of the RF LINAC has a major impact on dimensional tolerances and stability. However, the added engineering cost and development is eliminated using the IMPULSE® technique for the resulting continuous coating.

Figure 28:
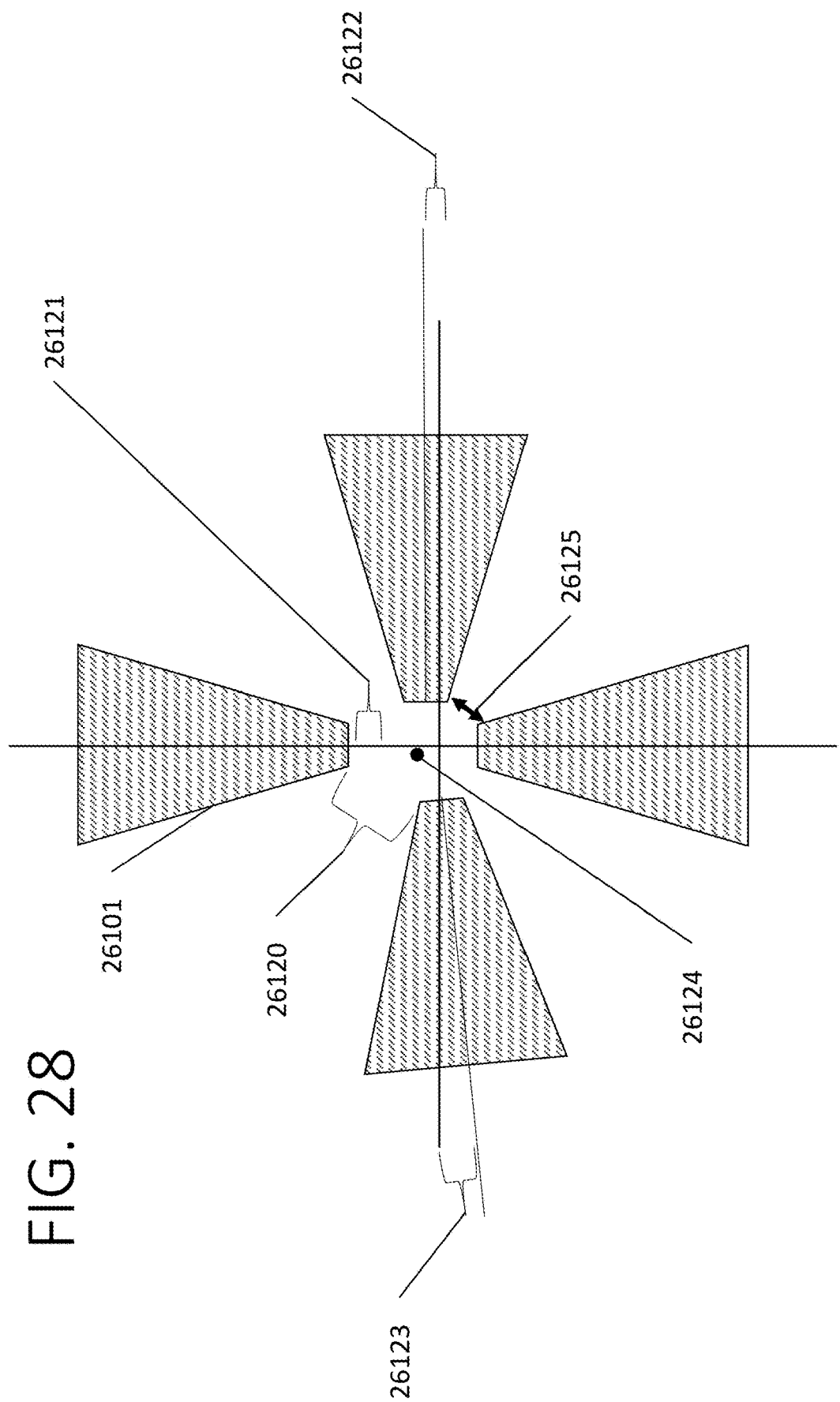
FIG. 28 depicts an illustration of challenges with vane alignment and gapping.

RF LINAC performance is further compromised by cross-sectional misalignment/positioning of vanes and resulting gaping between ends of the vanes, as shown in the illustrative cross-section in FIG. 28. Particle acceleration occurs due to the particle experiencing a quasi-continuous acceleration down the length of a channel formed by a set of vanes at a central location of the RF accelerator cavity. The alternating vane undulations continually change as the particle velocity increases.

FIG. 28 highlights common vane mis-alignments for the critical vane tip region that lead to lost beam transmission and very high electric field in the gap, which leads to vane tip sparking. Vanes 26101 are positioned relative to a beam axis located at the origin of the x-y lines. Basic misalignments include inline shifts along the x-axis 26122, the y-axis 26121 and z axis (not shown). With misalignment introduced (as shown in FIG. 28) the vane tips are no longer equidistant, which affects intra-vane capacitance arising from gaps, such as a gap 26120, in each quadrant. The changed capacitance affects shunt impedance, electromagnetic power balance and lowers the efficiency of power injection into the accelerator. Overcoming the signal degradation by increasing input RF power increases a local electric field 26125 at vane tips, thereby increasing the probability of sparking above a critical field threshold. Misalignment and deformation due to heating can introduce twisting on vanes such as the twisting misalignment on a vane 26123, resulting in changing a surface normal of the vane tips and introducing additional fringing to the local electric field 26125, resulting in an asymmetric focusing field for the quadrupole mode guiding the particles off axis 26124. The net result from these effects are, detuned RF cavity properties, lower cavity Q, increased sparking risk and lost beam transmission. Some of the undesirable effects arising from misalignment of vanes can be compensated with increased RF power, higher vane tip voltages, longer LINAC cavity length for lower overall gradient, etc. However, the precision alignment jig discussed earlier provides the means to mitigate vane misalignment and the IMPULSE® technique allows for continuous coatings for reduced power consumption and/or reduction in LINAC size, weight and power, i.e. the Centurion® RFQ LINAC system.

Figure 29:
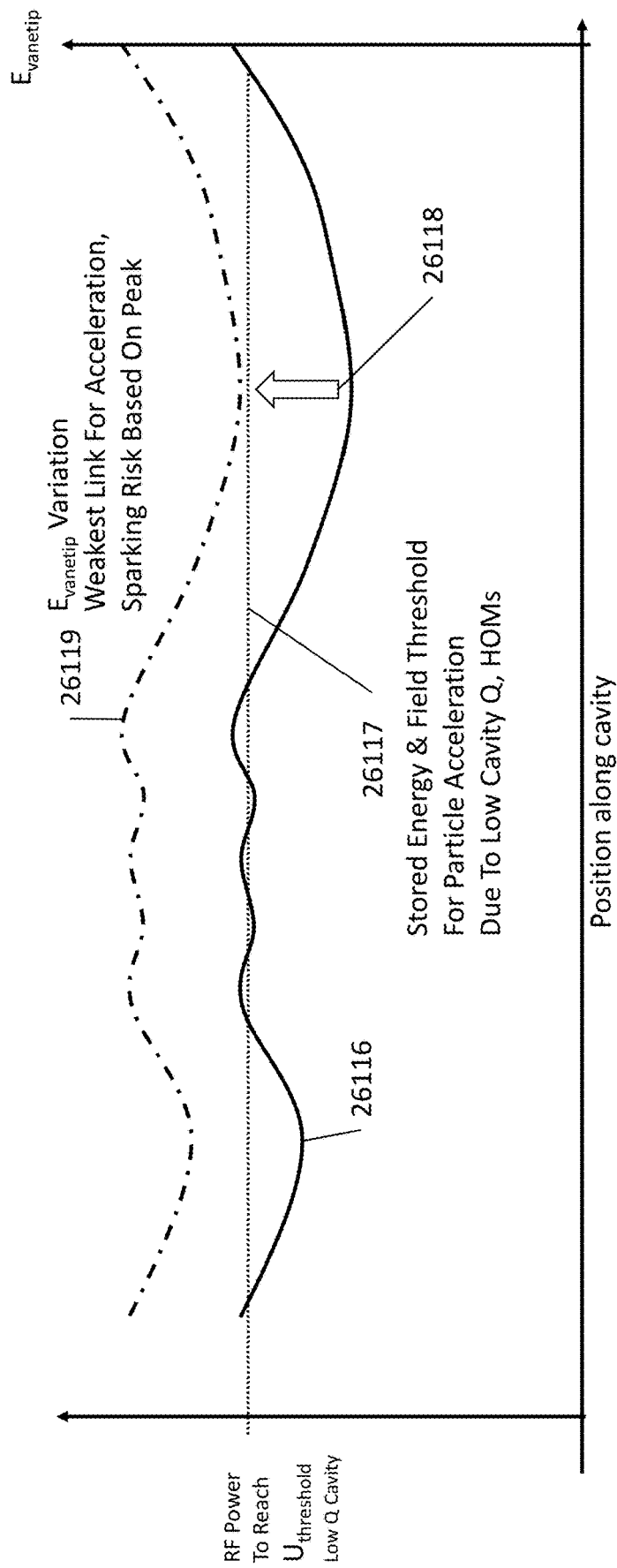
FIG. 29 is a graphical representation of a low-Q cavity requiring more input RF power required to meet cavity stored energy thresholds for particle acceleration and vane tip electric field variation risk.

FIG. 29 graphically represents a low-Q cavity requiring high levels of input RF power to meet cavity stored energy thresholds for particle acceleration and vane tip electric field variation risk. In this representation, the cavity stored energy threshold 26117 is a function of the LINAC parameters, such as frequency, accelerating gradient, accelerator length, vane tip spacing and beam envelope, and the effective conductivity of the cavity, shunt impedance and the resulting Q factor. This equates to a nominal vane-tip electric field threshold 26117 for a perfectly aligned system. Variations in the vane alignment will provide a deviation from the optimal case for each position along the cavity, as well as sub optimal surface conductivity, increased pathlength, higher-order modes and de-tuning of the cavity resonance. The resulting vane-tip electric field profile 26116 is upshifted to an elevated vane-tip electric field profile 26119 to achieve the threshold value required for acceleration down the length of the accelerator. The penalty is the increase in RF power 26118 to achieve a desired magnitude of particle acceleration. This comes at a cost since the peak vane-tip electric field 26119 limits the sparking condition and overall risk.

Figure 30:
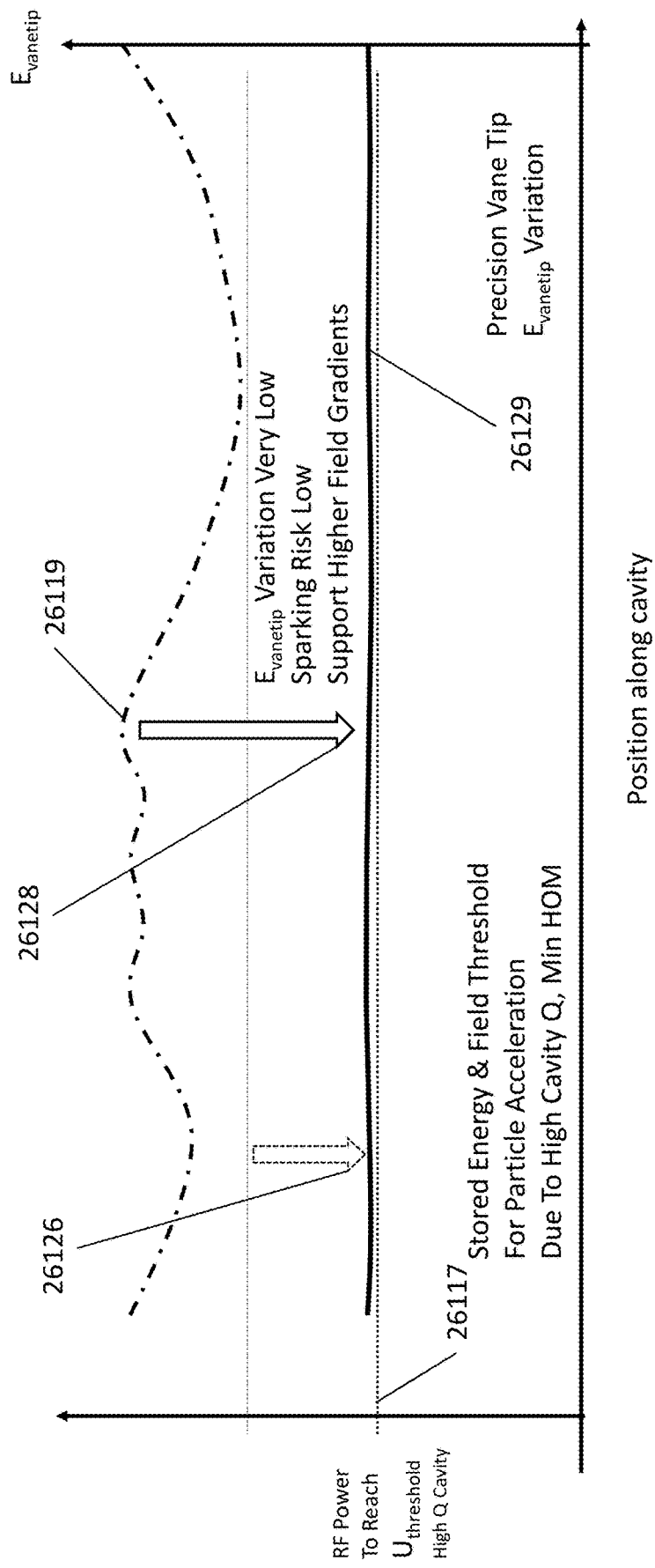
FIG. 30 is a graphical illustration of a high-Q cavity processed with a precision alignment jig and coating processed with IMPULSE® techniques for lower RF power requirements and reduced vane tip variation to support higher axial accelerating gradients for overall compactness and power savings.

FIG. 30 graphically illustrates a high-Q cavity achieved by fabrication using the manufacturing and surface processing techniques described herein, including using a precision alignment jig and forming a coating that is processed according to IMPULSE® techniques. The resulting improved vane alignment precision and surface quality facilitates production of an RFQ accelerator that achieves lower RF power requirements and reduced vane tip variation to support higher axial accelerating gradients for overall compactness and power savings. With the increase in conductivity and reduction in resistive losses, the higher cavity Q maintains the required cavity stored energy at a lower input RF power threshold 26117 compared to the representation in FIG. 29 by an amount 26126. The peak vane-tip electric field 26119 is greatly decreased by an amount 26128 close to the cavity threshold level 26117 with a well-regulated vane tip electric field profile 26129. The reduction in E-field variation on the vane tips as shown in the profile 26129 allows greater safety margin and relaxes the Kilpatrick Limit for RF breakdown allowing higher accelerating gradients, wider frequency of operation and beam configurations, such as achieving >4 MV/m accelerating gradients for reduced power, size, weight and cost.

In general, the realm of achievable accelerating gradients is limited by arcing/sparking within the cavity itself. This is typically the dominating factor that determines the maximum electric field strengths that are sustainable within the cavity. As an example, the Kilpatrick criterion for breakdown-free operation, which is given by $$f = (1.64 \text{ MHz})\left(\frac{E}{1 \text{ MV/m}}\right)^2 \exp\left(-8.5\left(\frac{1 \text{ MV/m}}{E}\right)\right),$$

states that the maximum electric field (again, for breakdown-free operation) in a 600 MHz copper cavity structure is approximately 23 MV/m. This is effectively a soft limit placed on the maximum electric field at the vane tips of the RFQ structure, with so called 'bravery factors' (a multiple of the Kilpatrick criterion) of 1-2 being typical. As the electric field is raised beyond this value, arcing may become increasingly frequent. Since it is the electric field that is responsible for acceleration, this effectively places a limit on the achievable accelerating gradient that sets an upper bound on the vane-tip electric field in FIG. 30.

However, since arcing/sparking occurs almost exclusively at the vane tips in an RFQ structure, where the currents are virtually zero, the ability to either 1) coat the vane tips in an arc/spark-resistant material as a finishing step, such as Be or TiN, or 2) have the arc/spark-resistant material already present (whether as a film coating or as the bulk vane material itself) and then selectively apply the high-conductivity coating everywhere but the vane-tips will allow for an overall structure that is both high-Q and arc/spark-resistant. Simply put, the ability to utilize different materials for the cavity walls (where the currents are high) and the vane tips (where electric fields are high and arcing is a problem) allows the arcing limitations to be effectively decoupled from the material limitations of the high conductivity (Cu) cavity coating. The IMPULSE® techniques improve the smoothness of the vane tip surface to minimize local electric field concentrations. However, the material purity of the coating, work function and field-enhancement/secondary electron emission properties, coating morphology and nanostructure to minimize/inhibit whisker growth and surface atom mobility, and elimination of inclusions and local field concentrators, such as particles and impurities found in traditional wet chemistry, are also important variables controlled by the IMPULSE® and the deposition techniques in this disclosure.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Exemplary embodiments are described herein known to the inventors for carrying out the invention. Variations of these embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A system for depositing high-quality films for providing a nanolayered coating on a three-dimensional surface of an RF accelerator cavity and associated superconducting cavities, the system comprising:
   a magnetic array comprising multiple sets of magnets arranged to have Hall-Effect regions that run lengthwise along a sputter target; and
   an elongated sputtering electrode material tube surrounding the magnetic array comprising multiple sets of magnets arranged to have Hall-Effect regions that run lengthwise along the sputter target,
   wherein, during operation, the system is configured to carry out a method for nanolaying a surface of a three-dimensional surface by generating and controlling ion flux for direct current high-power impulse magnetron sputtering, the method comprising:
      providing a vacuum apparatus containing a sputtering magnetron target electrode;
      generating a high-power pulsed plasma magnetron discharge with a high-current negative direct current (DC) pulse to the sputtering magnetron target electrode; and
      generating a configurable sustained positive voltage kick pulse to the magnetron target electrode after terminating the negative DC pulse,
      wherein during the generating, program processor configured logic circuitry issues a control signal to control at least one kick pulse property of the sustained positive voltage kick pulse taken from the group consisting of: onset delay, duration, amplitude and frequency including modulation thereof.

2. The system of claim 1 wherein the generating a configurable sustained positive voltage kick pulse is carried out using a capacitive stored power source and a positive pulse power transistor, and wherein the control signal is issued, during the generating, to the positive pulse power transistor.

3. The system of claim 1, further configured to provide a coating on a radio frequency (RF) accelerator having an RF accelerator cavity comprising a cylindrical surface disrupted by multiple vanes, each one of the multiple vanes having respective bases adjoining the inner cylindrical surface.

4. The system of claim 3, further comprising an alignment jig, the alignment jig being configured to position ones of the multiple vanes relative to at least another one of the multiple vanes during fabrication of the RF accelerator to facilitate aligning each of the multiple vanes within the RF accelerator cavity during fabrication of the RF accelerator.

5. The system of claim 1 wherein, during operation, the sputter target rotates relative to magnets of the magnetic array to facilitate a sputter target material utilization of greater than 50%.

6. The system of claim 1 wherein, during operation, the surface to be coated is processed by cleaning, etching, intermixing, adhesion, stress control, bulk film growth, diffusion layers and/or capping layers in a continuous process.

7. The system of claim 3, wherein after performing a sputter coating operation on the RF accelerator cavity, the RF accelerator exhibits properties of: sputter material-sealed surfaces and interfaces of the RF accelerator cavity, improved conductivity, reduced effective current pathlength,
wherein the properties, in combination, result in a relatively improved Q value in relation to the RF accelerator without the sputter coating operation.

8. The system of claim 3, wherein the sputter coating operation is performed on a multiple component assembly of the RF accelerator including assembled components comprising: the multiple vanes, a cylindrical cavity body, and vacuum envelope.

9. The system of claim 8, wherein the sputter coating operation is performed after a vane attachment process where ones of the multiple vanes are mechanically attached to a surface of the RF accelerator cavity,
wherein the sputter coating operation provides a coating of the sputter target material over joints and interfaces at attachment points between the multiple vanes and the surface of the RF accelerator cavity to render a continuous, high conductivity surface providing a lower resistance and a higher Q in relation to an RF accelerator cavity that does not undergo the sputter coating operation where the coating of the sputter target material over joints and interfaces is provided.

10. The system of claim 9 wherein the mechanical attaching of the vanes is performed at a low-temperature, thereby facilitating keeping within dimensional tolerances and reducing degree of distortion of ones of the multiple vanes arising from cool down.

11. The system of claim 7 wherein the deposited film structure is comprised of grain structure with preferred orientation along the RF accelerator cavity current flow path.

12. The system of claim 7 wherein the smooth deposited film has a surface roughness less than the electromagnetic skin-depth of the RF cavity resulting in reduced surface resistivity and higher cavity Q.

13. The system of claim 1 further configured with an alignment jig that is used to hold a vane, of multiple vanes of an RF accelerator, at a fixed position on an inner surface of the RF accelerator cavity during operation of the system to carry out the method for nanolayering a surface of a three-dimensional surface.

14. The system of claim 13 wherein the alignment jig is configured to maintain intra-vane dimensional tolerances, vane gap spacing, vane alignment and beam positioning during fixturing and bonding within the RF accelerator cavity, including utilizing measurement locations, sensors and diagnostic ports for the precision alignment and characterization of the vane spacing and electromagnetic properties.

15. The system of claim 1 wherein the method for nanolayering, when completed, results in physical fixed attachment of the vane to the inner surface of the RF accelerator cavity.

16. The system of claim 1 wherein one or more of surfaces covered by the sputter target material during operation of the system comprises a material having material properties that differ from material properties of the sputter target material.

17. The system of claim 1 wherein the system is configured to provide the sputter target material on a surface of a vane tip of a vane positioned within the RF accelerator cavity, thereby resulting in a treated surface of the RF accelerator cavity having at least one property of the group of properties consisting of: higher field emission limits, lower secondary electron emission, reduced surface atom mobility, high unscreened plasma potential, low electron density, low surface roughness, and high work function.

18. The system of claim 1 wherein the system is configured to provide the sputter target material on a surface within the RF accelerator cavity resulting in an RF accelerator having a direct coupled RF from high-Q structures resulting in one or more enhanced performance characteristics taken from the group consisting of: lowered power required for acceleration, and a higher permitted field gradient within the RF accelerator cavity.

19. A method for carrying out, by a system, a nanolaying of a surface of a three-dimensional surface of an RF accelerator cavity and associated superconducting cavities by generating and controlling ion flux for direct current high-power impulse magnetron sputtering,
wherein the system comprises:
a magnetic array comprising multiple sets of magnets arranged to have Hall-Effect regions that run lengthwise along a sputter target; and
an elongated sputtering electrode material tube surrounding the magnetic array comprising multiple sets of magnets arranged to have Hall-Effect regions that that run lengthwise along the sputter target, and
wherein the method comprises:
providing a vacuum apparatus containing a sputtering magnetron target electrode;
generating a high-power pulsed plasma magnetron discharge with a high-current negative direct current (DC) pulse to the sputtering magnetron target electrode; and
generating a configurable sustained positive voltage kick pulse to the magnetron target electrode after terminating the negative DC pulse,
wherein during the generating, program processor configured logic circuitry issues a control signal to control at least one kick pulse property of the sustained positive voltage kick pulse taken from the group consisting of: onset delay, duration, amplitude and frequency including modulation thereof.

20. The method of claim 19 wherein the generating a configurable sustained positive voltage kick pulse is carried out using a capacitive stored power source and a positive pulse power transistor, and wherein the control signal is issued, during the generating, to the positive pulse power transistor.

* * * * *